United States Patent
Chen et al.

(10) Patent No.: US 11,329,081 B2
(45) Date of Patent: *May 10, 2022

(54) PHOTO-DETECTING APPARATUS

(71) Applicant: Artilux, Inc., Menlo Park, CA (US)

(72) Inventors: Chien-Yu Chen, Zhubei (TW); Yun-Chung Na, Zhubei (TW); Szu-Lin Cheng, Zhubei (TW); Ming-Jay Yang, Zhubei (TW); Han-Din Liu, Sunnyvale, CA (US); Che-Fu Liang, Zhubei (TW)

(73) Assignee: Artilux, Inc., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/060,389

(22) Filed: Oct. 1, 2020

(65) Prior Publication Data

US 2021/0020672 A1  Jan. 21, 2021

Related U.S. Application Data

(63) Continuation of application No. 16/378,525, filed on Apr. 8, 2019, now Pat. No. 10,886,311.

(60) Provisional application No. 62/654,456, filed on Apr. 8, 2018, provisional application No. 62/654,457, filed on Apr. 8, 2018, provisional application No. 62/682,254, filed on Jun. 8, 2018, provisional application No. 62/686,697, filed on Jun. 19, 2018, provisional application No. 62/695,060, filed on Jul. 8, 2018, provisional application No. 62/717,908, filed on Aug. 13, 2018, provisional application No.
(Continued)

(51) Int. Cl.
*H01L 31/0232* (2014.01)
*H01L 21/00* (2006.01)
*H01L 27/146* (2006.01)
*H01L 27/144* (2006.01)

(52) U.S. Cl.
CPC .... *H01L 27/14612* (2013.01); *H01L 27/1443* (2013.01); *H01L 27/14614* (2013.01)

(58) Field of Classification Search
CPC ................ H01L 27/14615; H01L 31/02164
USPC ................ 438/57, 69; 257/98, 436, 458
See application file for complete search history.

(56) References Cited

U.S. PATENT DOCUMENTS

| 3,621,466 A | 11/1971 | Toshio |
| 4,341,918 A | 7/1982 | Evans, Jr. et al. |

(Continued)

FOREIGN PATENT DOCUMENTS

| CN | 101310387 | 11/2008 |
| CN | 105322001 | 2/2016 |

(Continued)

OTHER PUBLICATIONS

Bamji et al., "A 0.13 μm CMOS System-on-Chip for a 512×424 Time-of-Flight Image Sensor With Multi-Frequency Photo-Demodulation up to 130 MHz and 2 GS/s ADC," IEEE J. Solid-State Circuits, Jan. 2015, 50(1):303-319.

(Continued)

*Primary Examiner* — Calvin Lee
(74) *Attorney, Agent, or Firm* — Fish & Richardson P.C.

(57) ABSTRACT

A photo-detecting apparatus includes an absorption layer configured to absorb photons and to generate photo-carriers from the absorbed photons, wherein the absorption layer includes germanium. A carrier guiding unit is electrically coupled to the absorption layer, wherein the carrier guiding unit includes a first switch including a first gate terminal.

18 Claims, 44 Drawing Sheets

Related U.S. Application Data

62/776,995, filed on Dec. 7, 2018, provisional application No. 62/755,581, filed on Nov. 5, 2018.

(56) References Cited

U.S. PATENT DOCUMENTS

| | | | |
|---|---|---|---|
| 4,604,527 A | 8/1986 | Chenevas-Panla et al. | |
| 4,607,168 A | 8/1986 | Oritsuki et al. | |
| 4,767,936 A | 8/1988 | Muakami et al. | |
| 4,782,376 A | 11/1988 | Catalano | |
| 4,926,231 A | 5/1990 | Hwang et al. | |
| 5,453,611 A | 9/1995 | Oozu | |
| 5,673,284 A | 9/1997 | Congdon et al. | |
| 5,965,875 A | 10/1999 | Merrill | |
| 6,384,462 B1 | 5/2002 | Pauchard et al. | |
| 6,483,130 B1 | 11/2002 | Yang et al. | |
| 6,509,203 B2 | 1/2003 | Spartiotis et al. | |
| 6,894,267 B2 | 5/2005 | Kakinuma | |
| 6,958,194 B1 | 10/2005 | Hopper | |
| 7,090,133 B2 | 8/2006 | Zhu | |
| 7,411,265 B2 | 8/2008 | Sekiguchi | |
| 7,456,874 B1 | 11/2008 | Ono | |
| 7,557,368 B2 | 7/2009 | Hegarty et al. | |
| 7,629,661 B2 | 12/2009 | Rafferty et al. | |
| 7,750,958 B1 | 7/2010 | Dierickx | |
| 7,826,058 B1 | 11/2010 | Ulrich et al. | |
| 7,884,310 B2 | 2/2011 | Buettgen | |
| 7,888,763 B2 * | 2/2011 | Qian | H01L 27/14632 257/460 |
| 7,961,301 B2 | 6/2011 | Earhart et al. | |
| 7,972,885 B1 | 7/2011 | Dutta et al. | |
| 8,129,813 B2 | 3/2012 | Herz | |
| 8,183,510 B2 | 5/2012 | Venezia et al. | |
| 8,405,823 B2 | 3/2013 | Pfaff | |
| 8,824,779 B1 | 9/2014 | Smyth | |
| 8,860,083 B1 | 10/2014 | Trezza | |
| 8,975,668 B2 | 3/2015 | Costello et al. | |
| 9,236,520 B2 | 1/2016 | Okhonin | |
| 9,239,626 B1 | 1/2016 | Wu et al. | |
| 9,472,588 B1 * | 10/2016 | Li | H01L 27/14694 |
| 9,635,351 B2 | 4/2017 | Dielacher et al. | |
| 9,748,429 B1 | 8/2017 | Davids et al. | |
| 9,786,715 B2 | 10/2017 | Na et al. | |
| 9,893,112 B2 | 2/2018 | Na et al. | |
| 10,254,389 B2 | 4/2019 | Na et al. | |
| 10,256,264 B2 | 4/2019 | Na et al. | |
| 10,269,855 B2 | 4/2019 | Sallin et al. | |
| 10,269,862 B2 | 4/2019 | Na et al. | |
| 10,310,060 B2 | 6/2019 | Na et al. | |
| 10,353,056 B2 | 7/2019 | Na et al. | |
| 10,418,407 B2 | 9/2019 | Na et al. | |
| 10,564,718 B2 | 2/2020 | Na et al. | |
| 10,613,202 B2 | 4/2020 | Roy et al. | |
| 10,690,495 B2 | 6/2020 | Takagi et al. | |
| 10,739,443 B2 | 8/2020 | Na et al. | |
| 10,741,598 B2 | 8/2020 | Na et al. | |
| 10,777,692 B2 | 9/2020 | Cheng et al. | |
| 10,795,003 B2 | 10/2020 | Na et al. | |
| 10,886,309 B2 | 1/2021 | Na et al. | |
| 10,886,311 B2 * | 1/2021 | Chen | H01L 27/14612 257/436 |
| 10,886,312 B2 | 1/2021 | Na et al. | |
| 11,105,928 B2 | 8/2021 | Cheng et al. | |
| 11,131,757 B2 | 9/2021 | Na et al. | |
| 2003/0042500 A1 | 3/2003 | Rhodes et al. | |
| 2003/0189159 A1 | 10/2003 | Lnoue | |
| 2004/0121507 A1 | 6/2004 | Bude et al. | |
| 2005/0051730 A1 | 3/2005 | Kuijk et al. | |
| 2005/0077588 A1 | 4/2005 | Kasuga | |
| 2005/0167709 A1 | 8/2005 | Augusto | |
| 2005/0186759 A1 | 8/2005 | So | |
| 2005/0233495 A1 | 10/2005 | Yang et al. | |
| 2006/0110844 A1 | 5/2006 | Lee et al. | |
| 2006/0289957 A1 | 12/2006 | Morse et al. | |
| 2007/0114626 A1 | 5/2007 | Kang et al. | |
| 2007/0164767 A1 | 7/2007 | Herz | |
| 2007/0187796 A1 | 8/2007 | Rafferty et al. | |
| 2007/0218578 A1 | 9/2007 | Lee et al. | |
| 2007/0218580 A1 | 9/2007 | Hsu et al. | |
| 2008/0121866 A1 | 5/2008 | Yuan et al. | |
| 2008/0157254 A1 | 7/2008 | Kang | |
| 2008/0181452 A1 | 7/2008 | Kwon et al. | |
| 2008/0303058 A1 | 12/2008 | Mori et al. | |
| 2009/0242935 A1 | 1/2009 | Fitzgerald | |
| 2009/0050891 A1 | 2/2009 | Katob | |
| 2009/0152604 A1 | 6/2009 | Zhu et al. | |
| 2009/0166684 A1 | 7/2009 | Yahav et al. | |
| 2009/0200589 A1 | 8/2009 | Qian et al. | |
| 2009/0237770 A1 | 9/2009 | Kim et al. | |
| 2010/0078680 A1 | 4/2010 | Cheng et al. | |
| 2010/0102409 A1 | 4/2010 | Hansson | |
| 2010/0184246 A1 | 7/2010 | Sakai | |
| 2010/0291730 A1 | 11/2010 | Uya et al. | |
| 2011/0031578 A1 | 2/2011 | Miura et al. | |
| 2011/0102553 A1 | 5/2011 | Corcoran et al. | |
| 2011/0109880 A1 | 5/2011 | Nummela | |
| 2011/0128430 A1 | 6/2011 | Fossum | |
| 2011/0155893 A1 | 6/2011 | Endo et al. | |
| 2011/0181591 A1 | 7/2011 | Benitez | |
| 2011/0188780 A1 | 8/2011 | Wang et al. | |
| 2011/0255071 A1 | 10/2011 | Van Der Tempel et al. | |
| 2011/0304696 A1 | 12/2011 | Centen et al. | |
| 2012/0080726 A1 | 4/2012 | Sakano | |
| 2012/0133922 A1 | 5/2012 | Pfaff | |
| 2012/0241769 A1 | 9/2012 | Katoh | |
| 2012/0248514 A1 | 10/2012 | Korekado et al. | |
| 2012/0287085 A1 | 11/2012 | Yuki et al. | |
| 2012/0307232 A1 | 12/2012 | Mase | |
| 2013/0026548 A1 | 1/2013 | McCarten | |
| 2013/0062506 A1 | 3/2013 | Hu | |
| 2013/0062522 A1 | 3/2013 | Jiang et al. | |
| 2013/0062663 A1 | 3/2013 | Yuan et al. | |
| 2013/0075607 A1 | 3/2013 | Bikumandla et al. | |
| 2013/0119234 A1 | 5/2013 | Lee et al. | |
| 2013/0128070 A1 | 5/2013 | Ishikawa | |
| 2013/0154918 A1 | 6/2013 | Vaught et al. | |
| 2013/0214161 A1 | 8/2013 | Cazaux et al. | |
| 2013/0248865 A1 | 9/2013 | Toriyama et al. | |
| 2013/0278631 A1 | 10/2013 | Border et al. | |
| 2013/0280879 A1 | 10/2013 | Stether et al. | |
| 2013/0283213 A1 | 10/2013 | Guendelman et al. | |
| 2013/0321271 A1 | 12/2013 | Bychkov | |
| 2014/0002700 A1 | 1/2014 | Oishi | |
| 2014/0043227 A1 | 2/2014 | Skogo et al. | |
| 2014/0054444 A1 | 2/2014 | Sasaki | |
| 2014/0054736 A1 | 2/2014 | Meade et al. | |
| 2014/0111664 A1 | 4/2014 | Kumano | |
| 2014/0117428 A1 | 5/2014 | Lee et al. | |
| 2014/0159129 A1 | 6/2014 | Wang | |
| 2014/0183549 A1 | 7/2014 | Park et al. | |
| 2014/0184496 A1 | 7/2014 | Gribetz et al. | |
| 2014/0206443 A1 | 7/2014 | Sharp et al. | |
| 2014/0252437 A1 | 9/2014 | Ho et al. | |
| 2014/0285404 A1 | 9/2014 | Takano et al. | |
| 2014/0285420 A1 | 9/2014 | Kamimura et al. | |
| 2014/0285641 A1 | 9/2014 | Kato et al. | |
| 2014/0312206 A1 | 10/2014 | Okhonin et al. | |
| 2014/0367740 A1 | 12/2014 | Morse et al. | |
| 2014/0368613 A1 | 12/2014 | Krupka | |
| 2015/0001664 A1 | 1/2015 | Van Der Tempel et al. | |
| 2015/0014661 A1 | 1/2015 | Joo et al. | |
| 2015/0022435 A1 | 1/2015 | Luebke | |
| 2015/0041761 A1 | 2/2015 | Cheng et al. | |
| 2015/0043826 A1 | 2/2015 | Ishimitus | |
| 2015/0092983 A1 | 4/2015 | Nguyen et al. | |
| 2015/0162373 A1 | 6/2015 | Kim et al. | |
| 2015/0171146 A1 | 6/2015 | Ooki et al. | |
| 2015/0187923 A1 | 7/2015 | Kawahito | |
| 2015/0193938 A1 | 7/2015 | Freedman et al. | |
| 2015/0281618 A1 | 10/2015 | Saito | |
| 2015/0286340 A1 | 10/2015 | Send et al. | |
| 2015/0331508 A1 | 11/2015 | Nho et al. | |
| 2016/0014352 A1 | 1/2016 | Moriyama et al. | |
| 2016/0027837 A1 | 1/2016 | Webster et al. | |
| 2016/0049476 A1 | 2/2016 | Rachmady et al. | |

(56) References Cited

U.S. PATENT DOCUMENTS

| | | |
|---|---|---|
| 2016/0141329 A1 | 5/2016 | Cheng et al. |
| 2016/0150174 A1 | 5/2016 | Hynecek |
| 2016/0155883 A1 | 6/2016 | Shi et al. |
| 2016/0161599 A1 | 6/2016 | Seliuchenko |
| 2016/0172393 A1 | 6/2016 | Kim et al. |
| 2016/0187976 A1 | 6/2016 | Levesque et al. |
| 2016/0190304 A1 | 6/2016 | Morin et al. |
| 2016/0225922 A1 | 8/2016 | Akkaya et al. |
| 2016/0284750 A1 | 9/2016 | Ionescu et al. |
| 2016/0316159 A1 | 10/2016 | Yoneda |
| 2016/0335475 A1 | 11/2016 | Krenzer et al. |
| 2016/0372502 A1 | 12/2016 | Li et al. |
| 2016/0381789 A1 | 12/2016 | Rogers et al. |
| 2017/0040361 A1 | 2/2017 | Ikeda et al. |
| 2017/0040362 A1 | 2/2017 | Na et al. |
| 2017/0041589 A1 | 2/2017 | Patil et al. |
| 2017/0062508 A1 | 3/2017 | Na et al. |
| 2017/0068319 A1 | 3/2017 | Viswanathan |
| 2017/0074643 A1 | 3/2017 | Chang et al. |
| 2017/0075421 A1 | 3/2017 | Na et al. |
| 2017/0084648 A1 | 3/2017 | Liu et al. |
| 2017/0123233 A1 | 5/2017 | Sabovic |
| 2017/0131389 A1 | 5/2017 | Na et al. |
| 2017/0141153 A1 | 5/2017 | Lee et al. |
| 2017/0142362 A1 | 5/2017 | Liu |
| 2017/0177075 A1 | 6/2017 | Zhang |
| 2017/0196451 A1 | 7/2017 | Tian |
| 2017/0221212 A1 | 8/2017 | Adam et al. |
| 2017/0223339 A1 | 8/2017 | Kondo et al. |
| 2017/0237911 A1 | 8/2017 | Won |
| 2017/0244949 A1 | 8/2017 | Peterson |
| 2017/0317116 A1 | 11/2017 | Celo et al. |
| 2017/0332024 A1 | 11/2017 | Feick |
| 2018/0006081 A1 | 1/2018 | Na et al. |
| 2018/0007255 A1 | 1/2018 | Tang |
| 2018/0012916 A1 | 1/2018 | Na et al. |
| 2018/0012917 A1 | 1/2018 | Na et al. |
| 2018/0012918 A1 | 1/2018 | Na et al. |
| 2018/0061883 A1 | 3/2018 | Na et al. |
| 2018/0137610 A1 | 5/2018 | Aflaki |
| 2018/0151732 A1 | 5/2018 | Mehandru et al. |
| 2018/0175084 A1 | 6/2018 | Na et al. |
| 2018/0175095 A1 | 6/2018 | Sallin et al. |
| 2018/0180546 A1 | 6/2018 | Rothberg et al. |
| 2018/0188356 A1 | 7/2018 | Na et al. |
| 2018/0190698 A1 | 7/2018 | Na et al. |
| 2018/0190702 A1 | 7/2018 | Na et al. |
| 2018/0233521 A1 | 8/2018 | Na et al. |
| 2018/0233528 A1 | 8/2018 | Na et al. |
| 2018/0247968 A1 | 8/2018 | Na et al. |
| 2018/0261645 A1 | 9/2018 | Na et al. |
| 2018/0269239 A1 | 9/2018 | Na et al. |
| 2019/0011984 A1 | 1/2019 | Na et al. |
| 2019/0033432 A1 | 1/2019 | Na et al. |
| 2019/0049564 A1 | 2/2019 | Na et al. |
| 2019/0103435 A1 | 4/2019 | Na et al. |
| 2019/0081095 A1 | 5/2019 | Hanzawa et al. |
| 2019/0267498 A1 | 8/2019 | Cheng et al. |
| 2019/0302243 A1 | 10/2019 | Na et al. |
| 2019/0312158 A1 | 10/2019 | Na et al. |
| 2019/0348463 A1 | 11/2019 | Na et al. |
| 2019/0378872 A1 | 12/2019 | Chen |
| 2020/0052016 A1 | 2/2020 | Na et al. |
| 2020/0192032 A1 | 6/2020 | Na et al. |
| 2020/0249327 A1 | 8/2020 | Na et al. |
| 2020/0319345 A1 | 10/2020 | Cheng et al. |
| 2020/0382736 A1 | 12/2020 | Na et al. |
| 2020/0395393 A1 | 12/2020 | Na et al. |
| 2021/0020672 A1 | 1/2021 | Chen et al. |
| 2021/0126027 A1 | 4/2021 | Na et al. |
| 2021/0302549 A1 | 9/2021 | Na et al. |

FOREIGN PATENT DOCUMENTS

| | | |
|---|---|---|
| CN | 105762220 | 7/2016 |
| CN | 107403814 | 11/2017 |
| EP | 0278408 | 8/2007 |
| EP | 2081004 | 7/2009 |
| EP | 2224319 | 9/2010 |
| EP | 2330637 | 6/2011 |
| JP | H0548139 | 2/1993 |
| JP | H05211321 | 8/1993 |
| JP | 2000-133791 | 5/2000 |
| JP | 2003-225207 | 8/2003 |
| JP | 2004-103964 | 4/2004 |
| JP | 2004-309701 | 11/2004 |
| JP | 2005-123674 | 5/2005 |
| JP | 2009-025225 | 2/2009 |
| JP | 2009-047658 | 3/2009 |
| JP | 2011-66097 | 3/2011 |
| JP | 2011-128024 | 6/2011 |
| JP | 2012-146920 | 8/2012 |
| JP | 2014-107562 | 6/2014 |
| JP | 2015-194838 | 11/2015 |
| JP | 2016-533648 | 10/2016 |
| WO | WO 2005/036647 | 4/2005 |
| WO | WO 2013/104718 | 7/2013 |
| WO | WO 2014/085789 | 6/2014 |
| WO | WO 2014/197226 | 12/2014 |
| WO | WO 2015/104307 | 7/2015 |
| WO | WO 2016/038416 | 3/2016 |
| WO | WO 2016/077791 | 5/2016 |
| WO | WO 2016/187566 | 11/2016 |
| WO | WO 2016/208215 | 12/2016 |
| WO | WO 2017/015580 | 1/2017 |
| WO | WO 2017/018477 | 2/2017 |
| WO | WO 2017/024121 | 2/2017 |
| WO | WO 2017/035447 | 3/2017 |
| WO | WO 2019165220 | 8/2019 |
| WO | WO 2019199691 | 10/2019 |

OTHER PUBLICATIONS

Bianco et al., "A Comparative Analysis between Active and Passive Techniques for Underwater 3D Reconstruction of Close-Range Objects," Sensors, Aug. 20, 2013, 13(8): 11007-11031.

Chen et al., "Self-Aligned Microbonded Germanium Metal-Semiconductor-Metal Photodetectors Butt-Coupled to Si Waveguides," IEEE J. Sel. Top. Quant. Electron. Nov. 2014, 20(6):3800605, 5 pages.

Dalia Betta et al., "Design and Characterization of Current-Assisted Photonic Demodulators in 0.18-μm CMOS Technology," IEEE Trans. Electron. Dev., Jun. 2011, 58(6): 1702-1709.

Fang et al., "An Integration PIN/MISS OEIC for High Current Photoreceiver Applications," IEEE Transactions on Electron Devices, Jan. 1997, 44(1):34-38.

Feng et al., "Vertical p-i-n germanium photodetector with high external responsivity integrated with large core Si waveguides," Optics Express, Jan. 4, 2010, 18(1):96-101.

Foix et al., "Lock-in Time-of-Flight (ToF) Cameras: A Survey," IEEE Sensors J., Sep. 2011, 11(9):1917-1926.

Fussum et al., "A Review of the Pinned Photodiode for CCD and CMOS Image Sensors," IEEE J. Electron Devices Soc. May 1, 2014, 2(3):33-43.

Geng, "Structured-light 3D surface imaging: a tutorial," Advances in Optics and Photonics, Jun. 30, 2011, 3(2):128-160.

Gulden et al., "Novel optical distance sensor based on MSM technology." IEEE Sensors Journal. Oct. 2004, 4(5):612-8.

Hutchinson et al., "High-Resolution Aliasing-Free Optical Beam Steering," Optica, vol. 3, No. 8, dated Aug. 5, 2016, 4 pages.

Joo et al., "High-sensitivity 10 Gbps Ge-on-Si photoreceiver operating at λ~1.55 μm," Optics Express, Aug. 2, 2010, 18(16):16474-16479.

Kang et al., "Monolithic Ge/Si Avalanche Photodiodes," IEEE Xplore, 2009, 3 pages.

Kato et al., "320×240 Back-Illuminated 10-μm CAPD Pixels for High-Speed Modulation Time-of-Flight CMOS Image Sensor," IEEE J. Solid-State Circuits Apr. 2018, 53(4):1071-1078.

(56) References Cited

OTHER PUBLICATIONS

Kawahito et al., "A CMOS Time-of-Flight Range Image Sensor With Gates-on-Field-Oxide Structure," IEEE Sensors J. Dec. 2007, 7(12):1578-1586.
Kim et al., "A Three-Dimensional Time-of-Flight CMOS Image Sensor With Pinned-Photodiode Pixel Structure," IEEE Electron. Dev. Lett., Nov. 2010, 31(11):1272-1274.
Koester et al., "Ge-on-SOI-Detector/Si-CMOS-Amplifier Receivers for High-Performance Optical-Communication Applications," J. Lightw. Technol., Jan. 2001, 25(1):46-57.
Lange et al., "Solid-State Time-of-Flight Range Camera," IEEE J. Quant. Electron. Mar. 2001, 37(3):390-397.
Li et al., "High-Bandwidth and High-Responsivity Top-Illuminated Germanium Photodiodes for Optical Interconnection," IEEE Trans. Electron Dev., Mar. 2013, 60(3):1183-1187.
Lischke et al., "High bandwidth, high responsivity waveguide-coupled germanium p-i-n photodiode," Optics Express, Oct. 19, 2015, 23(21):27213-27220.
Liu et al., "Backside-incidence critically coupled Ge on SOI photodetector," Proc. SPIE 10100, Optical Components and Materials, Feb. 16, 2017, XIV, 101001X, 6 pages.
Michel et al., "High-performance Ge-on-Si photodetectors," Nature Photon. Jul. 30, 2010, 4:527-534.
Morse et al., "Performance of Ge-on-Si p-i-n Photodetectors for Standard Receiver Modules," IEEE Photon. Technol. Lett., Dec. 1, 2006, 18(23):2442-2444.
PCT International Preliminary Report on Patentability in International Appln. No. PCT/US2018/020262, dated Sept. 3, 2019, 11 pages.
PCT International Search Report and Written Opinion in International Appln. No. PCT/US2019/26382, dated Jul. 11, 2019, 12 pages.
PCT International Search Report and Written Opinion in International Appln. PCT/US2019/019167, dated May 14, 2019, 15 pages.
Perenzoni et al., "Compact SPAD-Based Pixel Architectures for Time-Resolved Image Sensors," Sensors, May 23, 2016, 16(5):745, 12 pages.
Place et al., "Rad tolerant CMOS image sensor based on hole collection 4T pixel pinned photodiode." IEEE Transactions on Nuclear Science. Dec. 6, 2012, 59(6):2888-93.
Rafferty et a., "Monolithic germanium SWIR imaging array," 2008 IEEE Conference on Technologies for Homeland Security, Waltham, MA, May 12, 2008, p. 577-582.
Ringbeck et al., "Multidimensional measurement by using 3-D PMD sensors," Adv. Radio Sci., Jan. 1, 2007, 5:135-146.
Tseng et al., "High-performance silicon-on-insulator grating coupler with completely vertical emission," Sep. 21, 2015, 23(19):24433-9.
Tseng et al., "A self-assembled microbonded germanium/silicon heterojunction photodiode for 25 GB/s high-speed optical interconnects," Sci. Rep. Nov. 15, 2013, 3:3225, 6 pages.
Van Der Tempel et al., "Lock-in Pixel Using a Current-Assisted Photonic Demodulator Implemented in 0.6 μm Standard Complementary Metal-Oxide-Semiconductor," Jpn. J. Appl. Phys., Apr. 24, 2017 46(4B):2377-2380.
Van Nieuwenhove et al., "Photonic Demodulator With Sensitivity Control," IEEE Sensors J. Mar. 2007, 7(3):317-318.
Wu et al., "A critically coupled Germanium photodetector under vertical illumination," Opt. Express, Dec. 31, 2012, 20(28):29338-29346.
Yin et al., "31GHz Ge n-i-p waveguide photodetectors on Silicon-on-Insulator substrate," Optics Express Oct. 17, 2007, 15(21):13965-13971.
Yokogawa et al., "IR sensitivity enhancement of CMOS Image Sensor with diffractive light trapping pixels," Sci. Rep. Jun. 19, 2017, 7(1):3832, 9 pages.
Bandaru et al., "Fabrication and characterization of low temperature (<450° C.) grown p-Ge/n-Si photodetectors for silicon based photonics," Materials Science and Engineering B, 2004, 113:79-84.
Li et al., "High-responsivity vertical illumination Si/Ge uni-traveling carrier photodiodes based on silicon-on-insulator substrate," Science Reports, Jun. 9, 2016, 6(27743):1-9.
Piels et al., "40 GHz Si/Ge Uni-Traveling Carrier Waveguide Photodiode," Journal of Lightwave Technology, Oct. 15, 2014, 32(20):3502-2508.
Alsam et al: "What the Eye Did Not See—A Fusion Approach to Image Coding", Advances in Visual Computing, dated Jan. 1, 2012, pp. 199-208 (with partial English translation).
International Preliminary Report on Patentability in International Appln. No. PCT/US2019/026382, dated Oct. 22, 2020, 6 pages.
Ramirez et al., "Recent progress on the quantum-dot avalanche photodiode," 22nd Annual Meeting of the IEEE Lasers and Electro-optics Society, Oct. 4, 2009, 2 pages.
Zanuttigh et al: "ToF Depth Camera Components", Time-of-Flight and Structured Light Depth Camers: Technology and Applications, dated May 24, 2016, pp. 31-33.
Office Action in Japanese Appln. No. 2020-555197, dated Mar. 22, 2022, 8 pages (with English translation).

\* cited by examiner

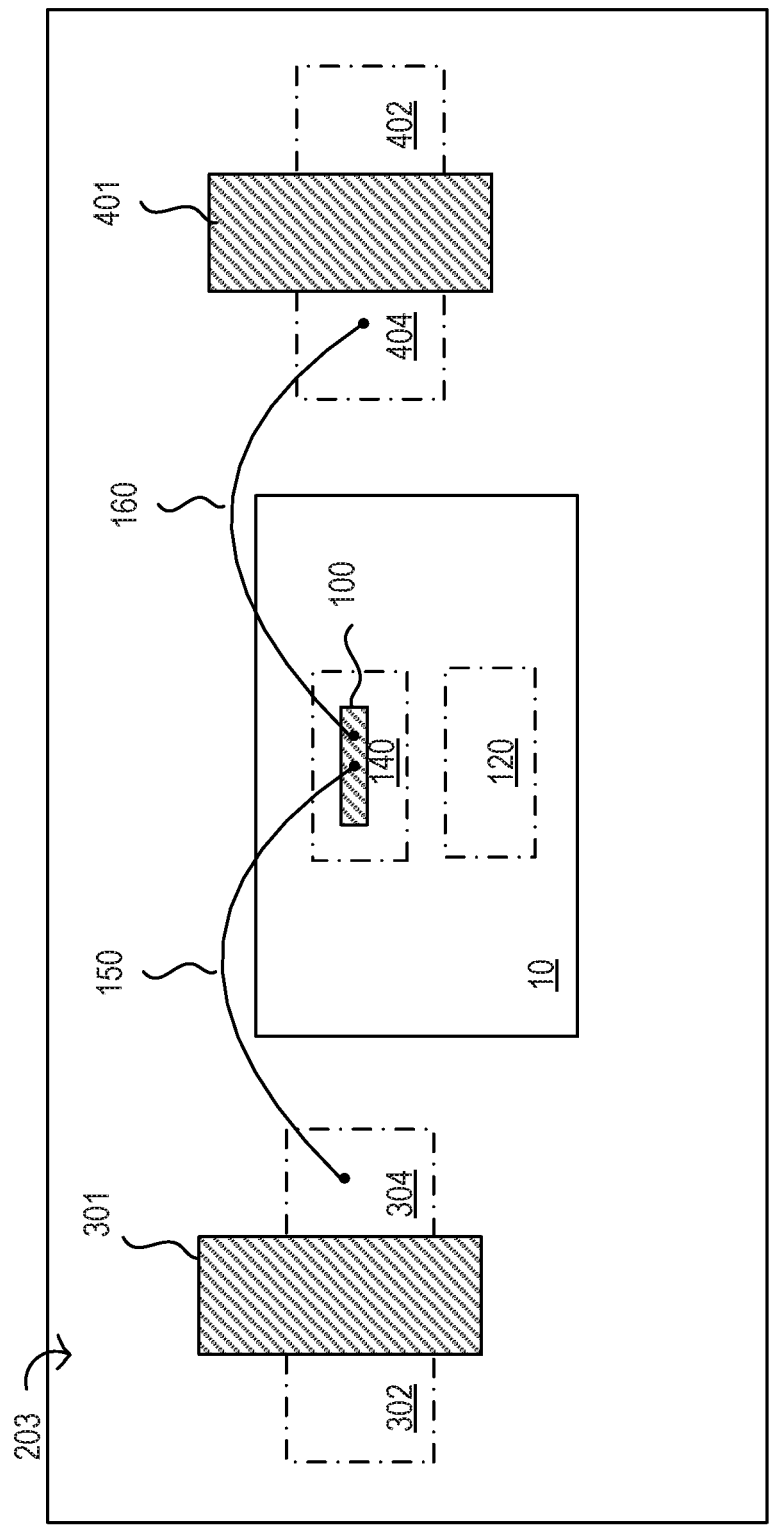

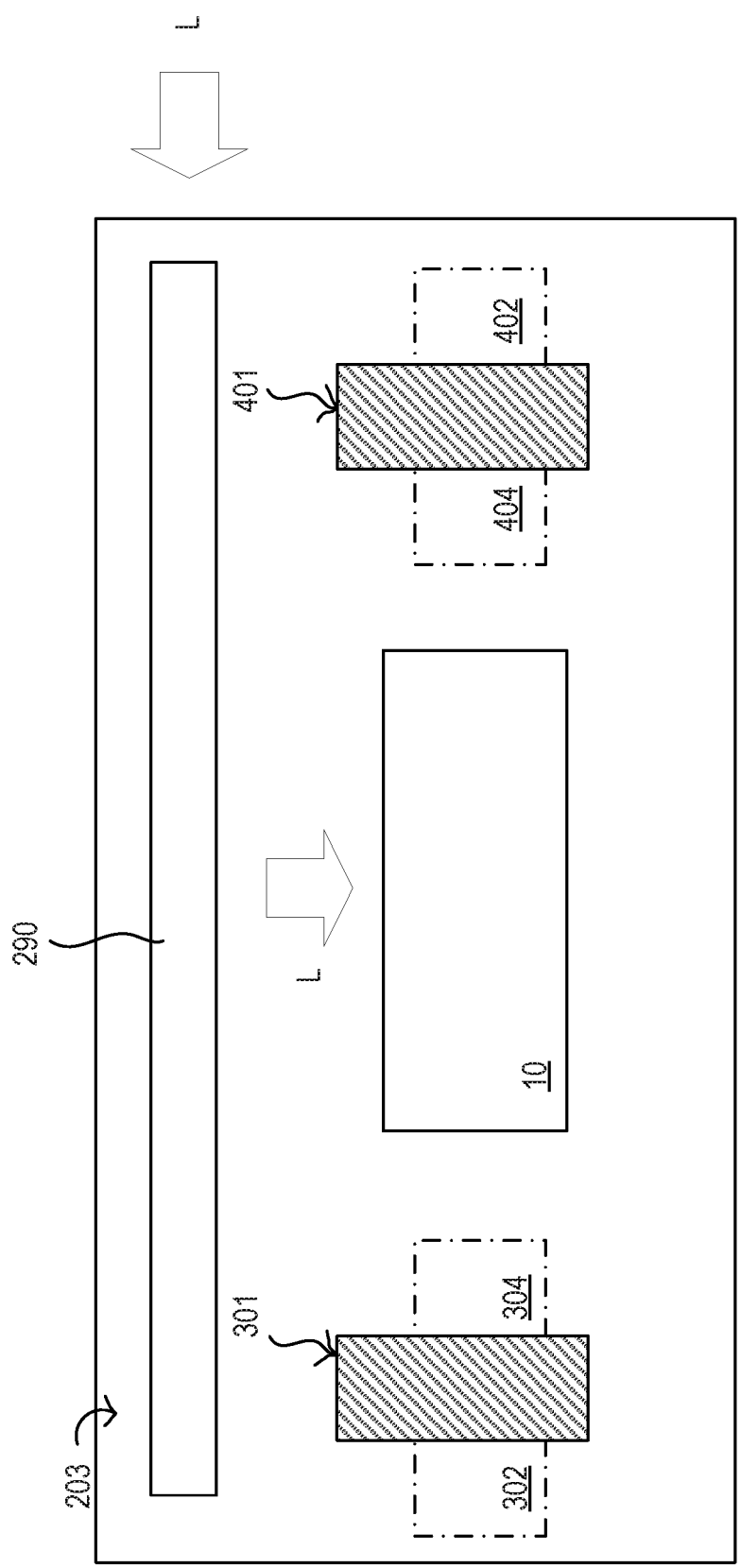

PHOTO-DETECTING APPARATUS

CROSS-REFERENCE TO RELATED APPLICATIONS

This patent application is a continuation of U.S. patent application Ser. No. 16/378,525, filed Apr. 8, 2019, now U.S. Pat. No. 10,886,311, issued Jan. 5, 2021, which claims the benefit of U.S. Provisional Patent Application No. 62/654,456, filed Apr. 8, 2018, U.S. Provisional Patent Application No. 62/654,457, filed Apr. 8, 2018, U.S. Provisional Patent Application No. 62/682,254, filed Jun. 8, 2018, U.S. Provisional Patent Application No. 62/686,697, filed Jun. 19, 2018, U.S. Provisional Patent Application No. 62/695,060, filed Jul. 8, 2018, U.S. Provisional Patent Application No. 62/717,908, filed Aug. 13, 2018, U.S. Provisional Patent Application No. 62/755,581, filed Nov. 5, 2018, and U.S. Provisional Patent Application No. 62/776,995, filed Dec. 7, 2018, the disclosures of which are incorporated by reference herein.

BACKGROUND

Photodetectors may be used to detect optical signals and convert the optical signals to electrical signals that may be further processed by another circuit. Photodetectors may be used in consumer electronics products, image sensors, data communications, time-of-flight (TOF) ranging or imaging sensors, medical devices, and many other suitable applications.

SUMMARY

According to an embodiment of the present disclosure, a photo-detecting apparatus is provided. The photo-detecting apparatus, includes an absorption layer configured to absorb photons and to generate photo-carriers from the absorbed photons, wherein the absorption layer includes germanium. A carrier guiding unit is electrically coupled to the absorption layer, wherein the carrier guiding unit includes a first switch including a first gate terminal.

According to an embodiment of the present disclosure, a method for manufacturing a photo-detecting apparatus is provided. The method includes: forming an absorption layer; forming a sub-insulating layer on the absorption layer; forming a conductive trench penetrating through the sub-insulating layer on the absorption layer to connect the absorption layer; providing a substrate integrated with a carrier guiding unit, a first readout circuit, a second readout circuit, a first control signal, and a second control signal, wherein the first control signal, and the second control signal, the first readout circuit and the second readout circuit are electrically coupled to the carrier guiding unit; forming a sub-insulating layer on the substrate and covering the first gate terminal and the second gate terminal; forming a conductive trench penetrating through the sub-insulating layer on the substrate; bonding the sub-insulating layer on the substrate and the sub-insulating layer on the absorption layer to form a bonding structure, wherein the carrier guiding unit is electrically coupled to the absorption layer after the bonding step.

According to an embodiment of the present disclosure, a photo-detecting apparatus is provided. The photo-detecting apparatus, includes: an absorption layer configured to absorb photons and to generate photo-carriers from the absorbed photons; and a carrier guiding unit electrically coupled to the absorption layer, wherein the carrier guiding unit includes a first switch, a second switch, and a common region between the first switch and the second switch and having a conductivity type, wherein the first switch includes a first carrier-output region having a conductivity type, the second switch includes a second carrier-output region having a conductivity type the same as the conductivity type of the first carrier-output region, and the conductivity type of the common region is different from the conductivity type of the first carrier-output region.

According to an embodiment of the present disclosure, a photo-detecting apparatus is provided. The photo-detecting apparatus, includes: an absorption layer configured to absorb photons and to generate photo-carriers from the absorbed photons; a substrate; a bonding structure between the substrate and the absorption layer; a carrier guiding unit, a first readout circuit, a second readout circuit, a first control signal, and a second control signal integrated with the substrate, wherein the first control signal, and the second control signal, the first readout circuit and the second readout circuit are electrically coupled to the carrier guiding unit.

According to an embodiment of the present disclosure, a photo-detecting apparatus is provided. The photo-detecting apparatus, includes: a substrate, a first absorption layer over the substrate and configured to absorb photons having a first peak wavelength and to generate photo-carriers from the absorbed photons; a first bonding structure between the substrate and the first absorption layer; a second absorption layer over the first absorption layer and configured to absorb photons and to generate photo-carriers from the absorbed photons, wherein the second absorption layer is configured to absorb photons having a second peak wavelength different from the first peak wavelength; a second bonding structure between the substrate and the second absorption layer; a first carrier guiding unit and a second carrier guiding unit integrated with the substrate, wherein the first carrier guiding unit is electrically coupled to the first absorption layer, and the second carrier guiding unit is electrically coupled to the second absorption layer.

BRIEF DESCRIPTION OF THE DRAWINGS

The foregoing aspects and many of the attendant advantages of this application will become more readily appreciated as the same becomes better understood by reference to the following detailed description, when taken in conjunction with the accompanying drawings, wherein:

FIG. 2B illustrates a top view of a part of the photo-detecting apparatus, according to some embodiments.

FIG. 6A illustrates a top view of a photo-detecting apparatus according to some embodiments.

DETAILED DESCRIPTION

Figure 1A:
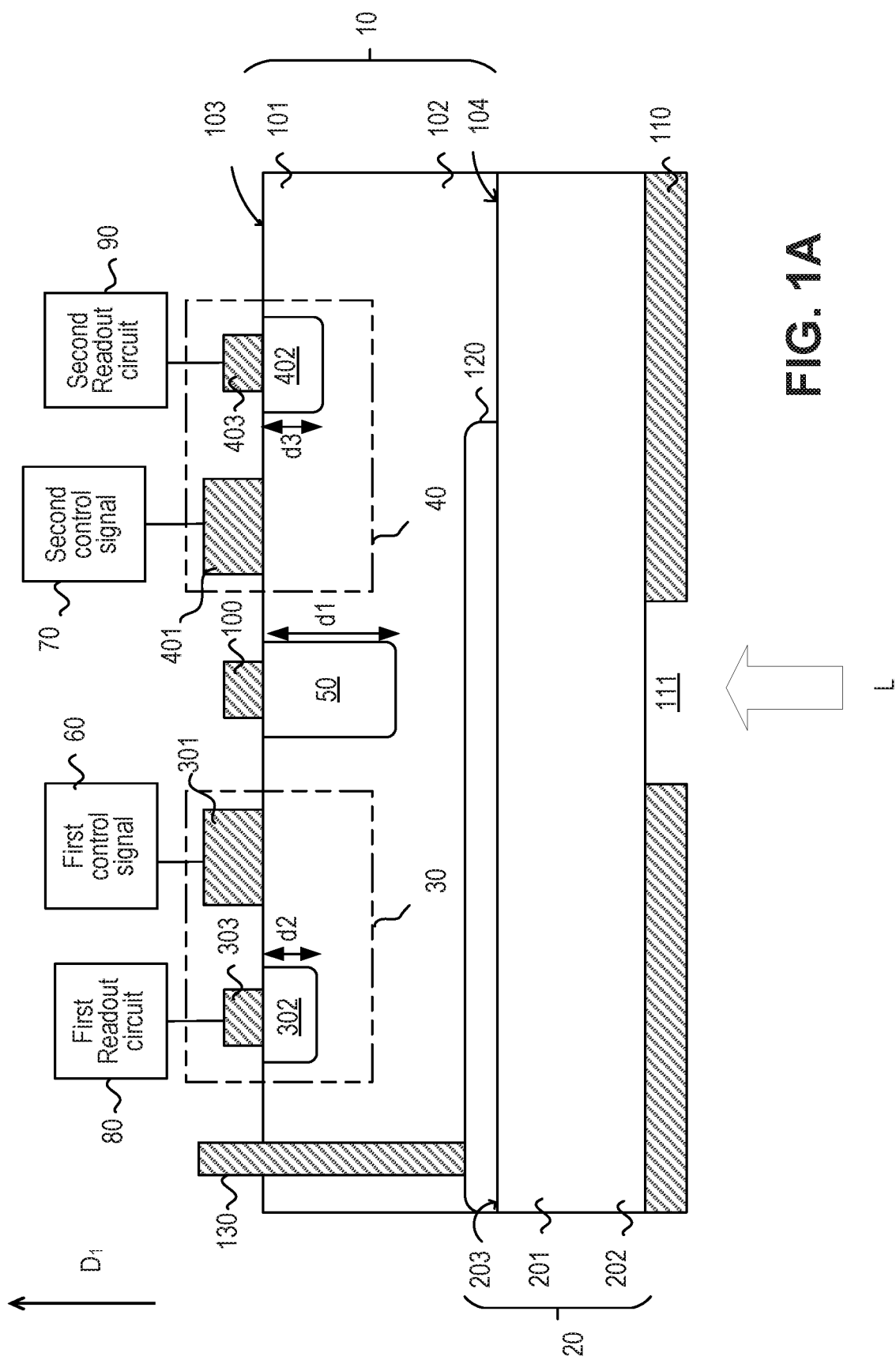
FIG. 1A illustrates a cross-sectional view of a photo-detecting apparatus, according to some embodiments.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

In the present disclosure, a photo-detecting apparatus converts an optical signal to an electrical signal. The term "germanium-silicon (GeSi)" refers to a $Ge_xSi_{1-x}$, wherein $0<x<1$. The term "intrinsic" refers to a semiconductor material without intentionally adding dopants.

FIG. 1A illustrates a cross-sectional view of a photo-detecting apparatus, according to some embodiments. The photo-detecting apparatus includes an absorption layer 10 and a substrate 20 supporting the absorption layer 10. In some embodiments, the absorption layer 10 is supported by the substrate 20. In some embodiments, the material of the substrate 20 is different from the material of the absorption layer 10. In some embodiments, the absorption layer 10 includes a top side 101 and a bottom side 102 opposite to the top side 101. In some embodiments, the top side 101 of the absorption layer 10 includes a top surface 103. The bottom side 102 includes a bottom surface 104.

The absorption layer 10 is configured to absorb photons and to generate photo-carriers from the absorbed photons. In some embodiments, the absorption layer 10 is configured to absorb photons having a peak wavelength in an invisible wavelength range not less than 800 nm, such as 850 nm, 940 nm, 1050 nm, 1064 nm, 1310 nm, 1350 nm, or 1550 nm. In some embodiments, the invisible wavelength range is not more than 2000 nm. In some embodiments, the absorption layer 10 receives an optical signal and converts the optical signal into electrical signals. In some embodiments, the absorption layer 10 is intrinsic, doped with a p-type dopant, or doped with an n-type dopant. In some embodiments, p-type dopant includes a group-III element. In some embodiments, p-type dopant is boron. In some embodiments, n-type dopant includes a group-V element. In some embodiments, n-type dopant is phosphorous. In some embodiments, the absorption layer 10 includes polycrystalline material. In some embodiments, the absorption layer 10 includes GeSi, Si or Ge. In some embodiments, the absorption layer 10 includes amorphous GeSi. In some embodiments, the absorption layer 10 includes germanium. In some embodiments, the absorption layer 10 is composed of germanium. In some embodiments, the absorption layer 10 composed of intrinsic germanium is of p-type due to material defects formed during formation of the absorption layer 10, wherein the defect density is from $1 \times 10^{14}$ cm$^{-3}$ to $1 \times 10^{16}$ cm$^{-3}$.

In some embodiments, the absorption layer 10 includes a thickness depending on the wavelength of photons to be detected and the material of the absorption layer 10. In some embodiments, when the absorption layer 10 includes germanium and is designed to absorb photons having a wavelength not less than 800 nm, the absorption layer 10 has a thickness not less than 0.1 um. In some embodiments, the absorption layer 10 includes germanium and is designed to absorb photons having a wavelength between 800 nm and 2000 nm, the absorption layer 10 has a thickness between 0.1 um and 2.5 um. In some embodiments, the absorption layer 10 has a thickness between 1 um and 2.5 um for higher quantum efficiency. In some embodiments, the absorption layer 10 may be grown using a blanket epitaxy, a selective epitaxy, or other applicable techniques.

In some embodiments, the substrate 20 includes a first side 201 and a second side 202 opposite to the first side 201, wherein the first side 201 is between the absorption layer 10 and the second side 202. The first side 201 includes a first surface 203. The substrate 20 includes any suitable material that the absorption layer 10 can be fabricated on. In some embodiments, the substrate 20 includes silicon. In some embodiments, the substrate 20 is composed of a single material. In some embodiments, the substrate 20 is composed of silicon. In some embodiments, the substrate 20 includes multiple materials, for example, the substrate 20 includes an insulating material and a semiconductor material. In some embodiment, the substrate 20 includes $SiO_2$ and Si. In some embodiments, the substrate 20 includes a stack of multiple layers.

In some embodiments, the absorption layer 10 is embedded in the substrate 20 and the top surface 103 of the absorption layer 10 is flush with the first surface 203 of the substrate 20. In some embodiments, the absorption layer 10 is partially embedded in the substrate 20.

The photo-detecting apparatus further includes a carrier guiding unit (not labeled) electrically coupled to the absorption layer 10. The carrier guiding unit is configured to guide the photo-carriers generated by the absorption layer 10 to two different directions during the operation of the photo-detecting apparatus. In some embodiments, during the operation of the photo-detecting apparatus, an incident light L enters into the absorption layer 10, the carrier guiding unit is configured to guide the photo-carriers generated by the absorption layer 10 to two opposite sides along the direction of the incident light. In some embodiments, the carrier guiding unit (not labeled) includes a first switch 30 and a second switch 40 both electrically coupled to the absorption layer 10. The second switch 40 is physically separated from the first switch 30. In some embodiment, the first switch 30 includes a first gate terminal 301, and the second switch 40 includes a second gate terminal 401. In some embodiment, the first gate terminal 301 and the second gate terminal 401 are both over the top side 101 of the absorption layer 10. In some embodiments, the first gate terminal 301 includes a first contact layer (not shown) over the top surface 103 of the absorption layer 10. In some embodiments, the second gate terminal 401 includes a second contact layer (not shown) over the top surface 103 of the absorption layer 10. In some embodiments, a Schottky contact is formed between the first contact layer (not shown) and the absorption layer 10. In some embodiments, a Schottky contact is formed between the second contact layer (not shown) and the absorption layer 10. In some embodiments, an Ohmic contact is formed between the first contact layer (not shown) and the absorption layer 10. In some embodiments, an Ohmic contact is formed between the second contact layer (not shown) and the absorption layer 10. In some embodiments, to form an Ohmic contact between the first contact layer (not shown) and the absorption layer 10, a first doped region (not shown) is formed in the absorption layer 10 and at a position right under the first contact layer (not shown), and the first doped region (not shown) includes a dopant having a peak concentration. In some embodiments, to form an Ohmic contact between the second contact layer (not shown) and the absorption layer 10, a second doped region (not shown) is formed in the absorption layer 10 and at a position right under the second contact layer (not shown), and the second doped region (not shown) includes a dopant having a peak concentration. The peak concentration of the dopant of the first doped region depends on the material of the first contact layer (not shown) and the material of the absorption layer, for example, between $1 \times 10^{19}$ cm$^{-3}$ to $5 \times 10^{20}$ cm$^{-3}$. The peak concentration of the dopant of the second doped region depends on the material of the second contact layer (not shown) and the material of the absorption layer, for example, between $1 \times 10^{19}$ cm$^{-3}$ to $5 \times 10^{20}$ cm$^{-3}$.

In some embodiments, the first gate terminal 301 includes a first insulating layer (not shown) and a first contact layer (not shown) on the first insulating layer (not shown). In some embodiments, the second gate terminal 401 includes a second insulating layer (not shown) and a second contact layer (not shown) on the second insulating layer (not shown). In some embodiments, the first insulating layer (not shown) is located between the first contact layer (not shown) and the absorption layer 10. In some embodiments, the second insulating layer (not shown) is located between the second contact layer (not shown) and the absorption layer 10. In some embodiments, the first contact layer (not shown) and the second contact layer (not shown) include metals or alloys. For example, the first contact layer (not shown) and the second contact layer (not shown) include Al, Cu, W, Ti, Ta—TaN—Cu stack, Ti—TiN—W stack, and various silicides and germanides. Silicide includes, but is not limited to nickel silicide. Germanide includes, but is not limited to nickel germanide. The first insulating layer (not shown) and the second insulating layer (not shown) prevent direct current conduction from the first contact layer (not shown) to the absorption layer 10 and from the second contact layer (not shown) to the absorption layer 10 respectively, but allows an electric field to be established within the absorption layer 10 in response to an application of a voltage to the first contact layer (not shown) and the second contact layer (not shown) respectively. The established electric field attracts or repels charge carriers within the absorption layer 10. In some embodiment, the first insulating layer (not shown) and the second insulating layer (not shown) include, but is not limited to $SiO_2$. In some embodiments, the first insulating layer (not shown) and the second insulating layer (not shown) include a high-k material including, but is not limited to, $Si_3N_4$, SiON, $SiN_x$, $SiO_x$, $GeO_x$, $Al_2O_3$, $Y_2O_3$, $TiO_2$, $Y_2O_3$, $HfO_2$ or $ZrO_2$.

In some embodiments, the first switch 30 further includes a first carrier-output region 302 and the second switch 40 further includes a second carrier-output region 402. The carrier guiding unit (not labeled) further includes a common region 50 between the first gate terminal 301 and the second gate terminal 401. In some embodiments, the first carrier-output region 302 is configured to collect a major portion of the photo-carriers generated by the absorption layer 10. In some embodiments, the second carrier-output region 402 is configured to collect a major portion of photo-carriers generated by the absorption layer 10. In some embodiments, the first gate terminal 301 is between the first carrier-output region 302 and the common region 50. The second gate terminal 401 is between the second carrier-output region 402 and the common region 50. In some embodiment, the common region 50, the first carrier-output region 302 and the second carrier-output region 402 are at the top side 101 of the absorption layer 10. In some embodiments, the first carrier-output region 302 is of a conductivity type, and the second carrier-output region 402 is of a conductivity type the same as the conductivity type of the first carrier-output region 302. In some embodiments, the conductivity type of the first carrier-output region 302 is the same as the conductivity type of the common region 50, and the conductivity type of the second carrier-output region 402 is also the same as the conductivity type of the common region 50. In some embodiments, the absorption layer 10 is of a conductivity type different from the conductivity type of the common region 50, the conductivity type of the second carrier-output region 402, and the conductivity type of the first carrier-output region 302. In some embodiments, the material of the common region 50, the material of the first carrier-output region 302, the material of the second carrier-output region 402 and the material of the absorption layer 10 are the same. For example, the material of the common region 50, the material of the first carrier-output region 302, the material of the second carrier-output region 402 and the material of the absorption layer 10 all include germanium. In some embodiments, the common region 50 includes a dopant, and the dopant includes a peak concentration between $1 \times 10^{18}$ cm$^{-3}$ and $5 \times 10^{20}$ cm$^{-3}$. In some embodiments, the first carrier-output region 302 includes a dopant, and the dopant includes a peak concentration between $1 \times 10^{18}$ cm$^{-3}$ and $5 \times 10^{20}$ cm$^{-3}$. In some embodiments, the second carrier-output region 402 includes a dopant, and the dopant includes a peak concentration between $1 \times 10^{18}$ cm$^{-3}$ and $5 \times 10^{20}$ cm$^{-3}$. In some embodiments, the dopants of the first carrier-output region 302, the second carrier-output region 402 and the common region 50 are different. In some embodiments, the dopants of the first carrier-output region 302, the second carrier-output region 402 and the common region 50 are the same. In some embodiments, when the first carrier-output region 302, the second carrier-output region 402 and the common region 50 are of n-type, the dopants of the first carrier-output region 302, the second carrier-output region 402 and the common region 50 include, but is not limited to, phosphorous, arsenic, antimony or fluorine. In some embodiments, when the first carrier-output region 302, the second carrier-output region 402 and the common region 50 are of p-type, the dopants of the first carrier-output region 302, the second carrier-output region 402 and the common region 50 include, but is not limited to, boron. In some embodiments, the carrier guiding unit (not labeled) is integrated with a single absorption layer 10, and thus the photo-detecting apparatus is with improved demodulation contrast.

In some embodiments, the common region 50 and the absorption layer 10 are referred as a vertical photodiode. In some embodiments, the vertical photodiode is a homojunction diode. In the present disclosure, the term "vertical photodiode" refers to a photodiode in which a direction from the p-terminal to n-terminal is substantially parallel to a direction from the bottom surface 104 to the top surface 103 of the absorption layer 10.

In some embodiments, when the first gate terminal 301 includes the first contact layer Schottky contacting to the absorption layer 10, the first switch 30 and the common region 50 are referred as a first MESFET (metal semiconductor field effect transistor). In some embodiments, when the second gate terminal 401 includes the second contact layer Schottky contacting to the absorption layer 10, the second switch 30 and the common region 50 are referred as a second MESFET. In some embodiments, the photodiode, the first MESFET, the second MESFET share the common region 50. In other words, the common region 50 is one end of the photodiode, one end of the first MESFET, and one end of the second MESFET. In other words, the common region 50 is one end of the photodiode, the source of the first MESFET, and the source of the second MESFET. For example, when the common region 50, the first carrier-output region 302 and the second carrier-output region 402 are of n-type, the common region 50 is the n-terminal of the photodiode, the source of the first MESFET, and the source of the second MESFET. When the common region 50, the first carrier-output region 302 and the second carrier-output region 402 are of p-type, the common region 50 is the p-terminal of the photodiode, the source of the first MESFET, and the source of the second MESFET.

In some embodiments, the first MESFET, the second MESFET, the vertical photodiode are all integrated with a single absorption layer 10, and thus the photo-detecting apparatus has an improved demodulation contrast.

In some embodiments, when the first gate terminal 301 includes the first insulating layer between the first contact layer and the absorption layer 10, the first switch 30 and the common region 50 are referred to as a first MOSFET (metal oxide semiconductor field-effect transistor). In some embodiments, when the second gate terminal 401 includes the second insulating layer between the first contact layer and the absorption layer 10, the second switch 40 and the common region 50 are referred as a second MOSFET. In some embodiments, the first MOSFET and the second MOSFET can be enhancement mode. In some embodiments, the first MOSFET and the second MOSFET can be depletion mode. In some embodiments, the photodiode, the first MOSFET, the second MOSFET share the common region 50. In other words, the common region 50 is one end of the photodiode, one end of the first MOSFET, and one end of the second MOSFET. In other words, the common region 50 is one end of the photodiode, the source of the first MOSFET, and the source of the second MOSFET. For example, when the common region 50, the first carrier-output region 302 and the second carrier-output region 402 are of n-type, the common region 50 is the n-terminal of the photodiode, the source of the first MOSFET, and the source of the second MOSFET. When the common region 50, the first carrier-output region 302 and the second carrier-output region 402 are of p-type, the common region 50 is the p-terminal of the photodiode, the source of the first MOSFET, and the source of the second MOSFET.

In some embodiments, the first MOSFET, the second MOSFET, the vertical photodiode are all integrated with a single absorption layer 10, and thus the photo-detecting apparatus is with improved demodulation contrast.

In some embodiments, the photo-detecting apparatus further includes a first control signal 60 and a second control signal. The first control signal 60 is electrically coupled to the first switch 30. The second control signal 70 is electrically coupled to the second switch 40. In some embodiments, the first control signal 60 is electrically coupled to the first gate terminal 301. The second control signal 70 is electrically coupled to the second gate terminal 401. In some embodiments, each of the first control signal 60 and the second control signal 70 includes an DC voltage signal or an AC voltage signal provided from a power source. In some embodiments, the first control signal 60 includes an DC voltage signal and the second control signal 70 includes an AC voltage signal. The first control signal 60 and the second control signal 70 are used to control the carrier guiding unit (not labeled) for controlling the direction of the carriers moving toward the first switch 30 or toward the second switch 40, wherein the carriers are generated by the absorption layer 10 from the absorbed photons. In some embodiments, the first control signal 60 is fixed at a voltage value V, and the second control signal 70 is alternate between voltage values V±ΔV. The direction of the bias value determines the moving direction of the carriers. In some embodiments, the first control signal 60 is a fixed at a voltage value V (e.g., 0.5v) and the second control signal 70 is a varying voltage signal (e.g., sinusoid signal, clock signal or pulse signal operated at 0V or 1V).

In some embodiments, the photo-detecting apparatus further includes a first readout circuit 80 and a second readout circuit 90. The first readout circuit 80 is electrically coupled to the first carrier-output region 302. The first readout circuit 80 is configured to output a first readout voltage. The second readout circuit 90 is electrically coupled to the second carrier-output region 402. The second readout circuit 90 is configured to output a second readout voltage. In some embodiments, the first readout circuit 80 and the second readout circuit 90 each includes three transistors consisting of a reset gate (not shown), a source-follower (not shown), and a selection gate (not shown). In some embodiments, the first readout circuit 80 and the second readout circuit 90 each includes four or more transistors (not shown), or any suitable electronic components (not shown) for processing carriers. In some embodiments, the photo-detecting apparatus further includes a first external source (not shown) electrically coupled to the common region 50. In some embodiments, the first external source (not shown) include an AC voltage signal provided from a power source.

In some embodiments, the first readout circuit 80 includes a first capacitor (not shown). The first capacitor is configured to store the photo-carriers collected by the first carrier-output region 302. In some embodiments, the first capacitor is electrically coupled to the reset gate of the first readout circuit 80. In some embodiments, the first capacitor is between the source-follower of the first readout circuit 80 and the reset gate of the first readout circuit 80. In some embodiments, the second readout circuit 90 includes a second capacitor (not shown). In some embodiments, the second capacitor is configured to store the photo-carriers collected by the second carrier-output region 402. In some embodiments, the second capacitor is electrically coupled to the reset gate of the second readout circuit. In some embodiments, the second capacitor is between the source-follower of the second readout circuit 90 and the reset gate of the second readout circuit. Examples of the first capacitor and the second capacitor include, but is not limited to, floating-diffusion capacitors, metal-oxide-metal (MOM) capacitors, metal-insulator-metal (MIM) capacitors, and metal-oxide-semiconductor (MOS) capacitors.

In some embodiments, the first switch 30 further includes a first readout terminal 303 connected to the first carrier-output region 302. The second switch 40 further includes a second readout terminal 403 connected to the second carrier-output region 402. The first readout circuit 80 is electrically coupled to the first carrier-output region 302 via the first readout terminal 303. The second readout circuit 90 is electrically coupled to the second carrier-output region 402 via the second readout terminal. In some embodiments, the carrier guiding unit (not labeled) further includes a first terminal 100 between the common region 50 and the first external source. In some embodiments, the first terminal 100, first readout terminal 303 and the second readout terminal 403 include conductive material including, but is not limited to, metal.

In some embodiments, the photo-detecting apparatus further includes a light shield 110 over the second side 202 of the substrate 20 or over the top side 101 of the absorption layer 10, depending on the direction of an incident light L. The light shield 110 includes a window 111 for letting the incident light L enter into the absorption layer 10 and confining an area where to absorb photons in the absorption layer 10. In some embodiments, the light shield 110 is on the second side 202 of the substrate 20 when an incident light L enters the absorption layer 10 from the second side 202 of the substrate 20. In some embodiments, a shape of the window 111 can be ellipse, circle, rectangular, square, rhombus, octagon or any other suitable shape from a top view of the window 111. In some embodiments, the incident light L is reflected from a surface of a three-dimensional target.

In some embodiments, during the operation of the photo-detecting apparatus, the electric field within the absorption layer 10 is changed and thus a portion of the carriers is driven to move toward the second carrier-output region 402 or first carrier-output region 302. During the operation of the photo-detecting apparatus, different voltages are applied to the first gate terminal 301 and the second gate terminal 401 to collect a portion of the photo-carriers from the first carrier-output region 302 or from the second carrier-output region 402.

In some embodiments, when the photo-detecting apparatus is operated, an incident light L is absorbed by the absorption layer 10 and photo-carriers including electrons and holes are then generated. Two different voltages are applied to the first gate terminal 301 and the second gate terminal 401 to form a channel beneath the first insulating layer (not shown) or the second insulating layer (not shown) to switch on the first switch 30 or the second switch 40. Holes or electrons of the photo-carriers are driven to move toward the first carrier-output region 302 or the second carrier-output region 402 through the channel and then are collected. In the present disclosure, in a same photo-detecting apparatus, the type of the carriers collected by the first carrier-output region 302 and the type of the carriers collected by the second carrier-output region 402 are the same. For example, when the photo-detecting apparatus is configured to collects electrons, when the first switch 30 is switched on and the second switch 40 is switched off, the first carrier-output region 302 collects electrons of the photo-carriers, and when the second switch 40 is switched on and the first switch 30 is switched off, the second carrier-output region 402 also collects electrons of the photo-carriers.

In some embodiments, the first switch 30 and the common region 50 are referred as a first MOSFET, the second switch 40 and the common region 50 are referred as a second MOSFET. The substrate 20 includes silicon, the absorption layer 10 includes intrinsic germanium, the common region 50, the first carrier-output region 302 and the second carrier-output region 402 include n-type germanium. For example, the absorption layer 10 includes intrinsic germanium. The common region 50, the first carrier-output region 302 and the second carrier-output region 402 includes germanium doped with phosphorous having a peak concentration between $1\times10^{18}$ cm$^{-3}$ and $5\times10^{20}$ cm$^{-3}$. During the operation of the photo-detecting apparatus, an incident light L enters into the absorption layer 10 from the second side 202 of the substrate 20, and then is absorbed by the absorption layer 10 to generate photo-carriers including electrons and holes. The absorption layer 10 is at a first voltage (e.g. 0V), the first gate terminal 301 receives a second voltage (e.g.

1V), and the second gate terminal 401 receives a third voltage (e.g. 0V) lower than the second voltage. The common region 50 is at a fourth voltage higher than the first voltage. An n-channel is formed beneath the first insulating layer (not shown) to electrically coupled the common region 50 and the first carrier-output region 302, and thus switch on the first switch 30. A portion of the electrons of the photo-carriers are driven to move toward the first carrier-output region 302. Alternately, the first gate terminal 301 receives a fifth voltage (e.g. 0V) and the second gate terminal 401 receives a six voltage (e.g. 1V) higher than the fifth voltage. An n-channel is formed beneath the second insulating layer (not shown) and to electrically coupled the common region 50 and the second carrier-output region 402, and thus switch on the second switch 40. A portion of the Electrons of the photo-carriers are driven to move toward the second carrier-output region 402. In some embodiments, the third voltage is greater than 0V and is lower than the second voltage for improving the demodulation contrast of the photo-detecting apparatus during the operation. Similarly, in some embodiments, the fifth voltage is greater than 0V and is lower than the sixth voltage for improving the demodulation contrast of the photo-detecting apparatus during the operation. In these embodiments, the photo-detecting apparatus is configured to collects electrons.

In some embodiments, the common region 50 is not coupled to any external control and thus is floated. The floated common region reduces leakage current between the common region 50 and the first carrier-output region 302 or reduces the leakage current between the common region 50 and the second carrier-output region 402 during the operation of the photo-detecting apparatus.

In some embodiments, the first switch 30 and the common region 50 are referred as a first MOSFET, the second switch 40 and the common region 50 are referred as a second MOSFET. The substrate 20 includes silicon, the absorption layer 10 includes n-type germanium, the conductivity type of the common region 50, the conductivity type of the first carrier-output region 302 and the conductivity type of the second carrier-output region 402 are p type. For example, the absorption layer 10 includes germanium doped with phosphorous having a peak concentration between $1 \times 10^{14}$ cm$^{-3}$ and $1 \times 10^{16}$ cm$^{-3}$. The common region 50, the first carrier-output region 302 and the second carrier-output region 402 includes germanium doped with boron having a peak concentration between $1 \times 10^{18}$ cm$^{-3}$ and $5 \times 10^{20}$ cm$^{-3}$. In these embodiments, the photo-detecting apparatus is configured to collects holes. During the operation of the photo-detecting apparatus, an incident light L enters into the absorption layer 10 from the second side 202 of the substrate 20, and then is absorbed by the absorption layer 10 to generate photo-carriers including electrons and holes. The absorption layer 10 is at a first voltage V1 (e.g. 3V), the first gate terminal 301 receives a second voltage (e.g. 0V), and the second gate terminal 401 receives a third voltage (e.g. 3V) higher than the second voltage. The common region 50 is at a fourth voltage lower than the first voltage. A p-channel is formed beneath the first insulating layer (not shown) to electrically coupled the common region 50 and the first carrier-output region 302, and thus switch on the first switch 30. A portion of the holes of the photo-carriers are driven to move toward the first carrier-output region 302. Alternately, the first gate terminal 301 receives a fifth voltage (e.g. 3V) and the second gate terminal 401 receives a six voltage (e.g. 0V) lower than the fifth voltage. A p-channel is formed beneath the second insulating layer (not shown) and to electrically coupled the common region 50 and the second carrier-output region 402, and thus switch on the second switch 40. A portion of the holes of the photo-carriers are driven to move toward the second carrier-output region 402. In some embodiments, the third voltage is lower than 3V and is higher than the second voltage for improving the demodulation contrast of the photo-detecting apparatus during the operation. Similarly, in some embodiments, the fifth voltage is lower than 3V and is higher than the sixth voltage for improving the demodulation contrast of the photo-detecting apparatus during the operation.

In some embodiments, the common region 50 is not coupled to any external control and thus is floated. The floated common region reduces leakage current between the common region 50 and the first carrier-output region 302 or reduces the leakage current between the common region 50 and the second carrier-output region 402 during the operation of the photo-detecting apparatus.

In some embodiments, when the photo-detecting apparatus is configured to collects electrons, during the operation of the photo-detecting apparatus, the first capacitor of the first readout circuit 80 and the second capacitor of the second readout circuit 90 are charged to a preset voltage via the reset gate of the first readout circuit 80 and the reset gate of the second readout circuit 90 respectively. Once the charging of the first capacitor and the second capacitor are complete, the first capacitor starts to store the portion of the photo-carriers collected from the first carrier-output region 302 and the second capacitor starts to store the portion of the photo-carriers collected from the second carrier-output region 402.

In some embodiments, when the photo-detecting apparatus is configured to collects holes, during the operation of the photo-detecting apparatus, the first capacitor of the first readout circuit 80 and the second capacitor of the second readout circuit 90 are discharged to a preset voltage via the reset gate of the first readout circuit 80 and the reset gate of the second readout circuit 90 respectively. Once the discharging of the first capacitor and the second capacitor are complete, the first capacitor starts to store the portion of the photo-carriers collected from the first carrier-output region 302 and the second capacitor starts to store the portion of the photo-carriers collected from the second carrier-output region 402.

In some embodiments, the photo-detecting apparatus further includes a first zone 120 in the absorption layer 10. In some embodiments, the first zone 120 is at the bottom side 102 of the absorption layer 10, and thus is opposite to the second carrier-output region 402, the common region 50 and the first carrier-output region 302. In some embodiments, the first zone 120 is overlapped with the common region 50 along a vertical direction $D_1$. In some embodiments, the first zone 120 includes a dopant and is of a conductivity type. In some embodiments, the conductivity type of the first zone 120 is different from the conductivity type of the common region 50. In some embodiments, the dopant of the first zone 120 includes a peak concentration between $1 \times 10^{18}$ cm$^{-3}$ and $5 \times 10^{20}$ cm$^{-3}$. In some embodiment, the common region 50, the absorption layer 10 and the first zone 120 are referred as a vertical photodiode. In some embodiments, the vertical photodiode is a homojunction diode. When two different voltages are applied to the first gate terminal 301 and the second gate terminal 401, with the first zone 120, depletion region between the first zone 120 and the common region 50 is expanded. Therefore, the quantum efficiency of the photo-detecting apparatus is higher and the amount of the carriers directed to the first carrier-output region 302 or second carrier-output region 402 is also higher. In some embodiments, the first zone 120 includes p-type germanium.

In some embodiments, the photo-detecting apparatus further includes a second terminal 130 penetrating through the absorption layer 10. The second terminal 130 is electrically coupled to the first zone 120 to evacuate the photo-carriers with opposite type not collected by the first carrier-output region 302 or the second carrier-output region 402 during the operation of the photo-detecting apparatus to improve the reliability of the photo-detecting apparatus. In some embodiments, the second terminal 130 is in direct contact with the first zone 120. In some embodiments, the second terminal 130 includes metal including, but is not limited to, copper, aluminum, or tungsten. In some embodiments, the photo-detecting apparatus further includes a second external source (not shown) electrically coupled to the first zone 120. In some embodiments, when the photo-detecting apparatus is configured to collects electrons, during the operation of the photo-detecting apparatus, the second external source includes an electrical ground, or provides a preset voltage less than the voltage at the first carrier-output region 302 and the voltage at second carrier-output region 402 to evacuate holes. In some embodiments, the first zone 120 is not coupled to any external control and thus is floated. In some embodiments, when the photo-detecting apparatus is configured to collects holes, during the operation of the photo-detecting apparatus, the second external source provides a preset voltage higher than the voltage at the first carrier-output region 302 and the voltage at second carrier-output region 402 to evacuate electrons.

In some embodiments, the common region 50 includes a first depth $d_1$. The first carrier-output region 302 includes a second depth dz. The second carrier-output region 402 includes a third depth $d_3$. The first depth $d_1$ of the common region 50, the second depth $d_2$ of the first carrier-output region 302 and the third depth $d_3$ of the second carrier-output region 402 are measured from the top surface 103 of the absorption layer 10. In some embodiments, the first depth $d_1$ of the common region 50 is greater than both the second depth $d_2$ of the first carrier-output region 302 and the third depth $d_3$ of the second carrier-output region 402 $d_3$ from a cross-sectional view of a photo-detecting apparatus. When two different voltages are applied to the first gate terminal 301 and the second gate terminal 401, with the common region 50 deeper than the first carrier-output region 302 and the second carrier-output region 402, the depletion region between the common region 50 and the first zone 120 is further expanded. Therefore, the quantum efficiency of the photo-detecting apparatus is further increased and the amount of the carriers directed to the first carrier-output region 302 or second carrier-output region 402 is also further increased.

Figure 1B:
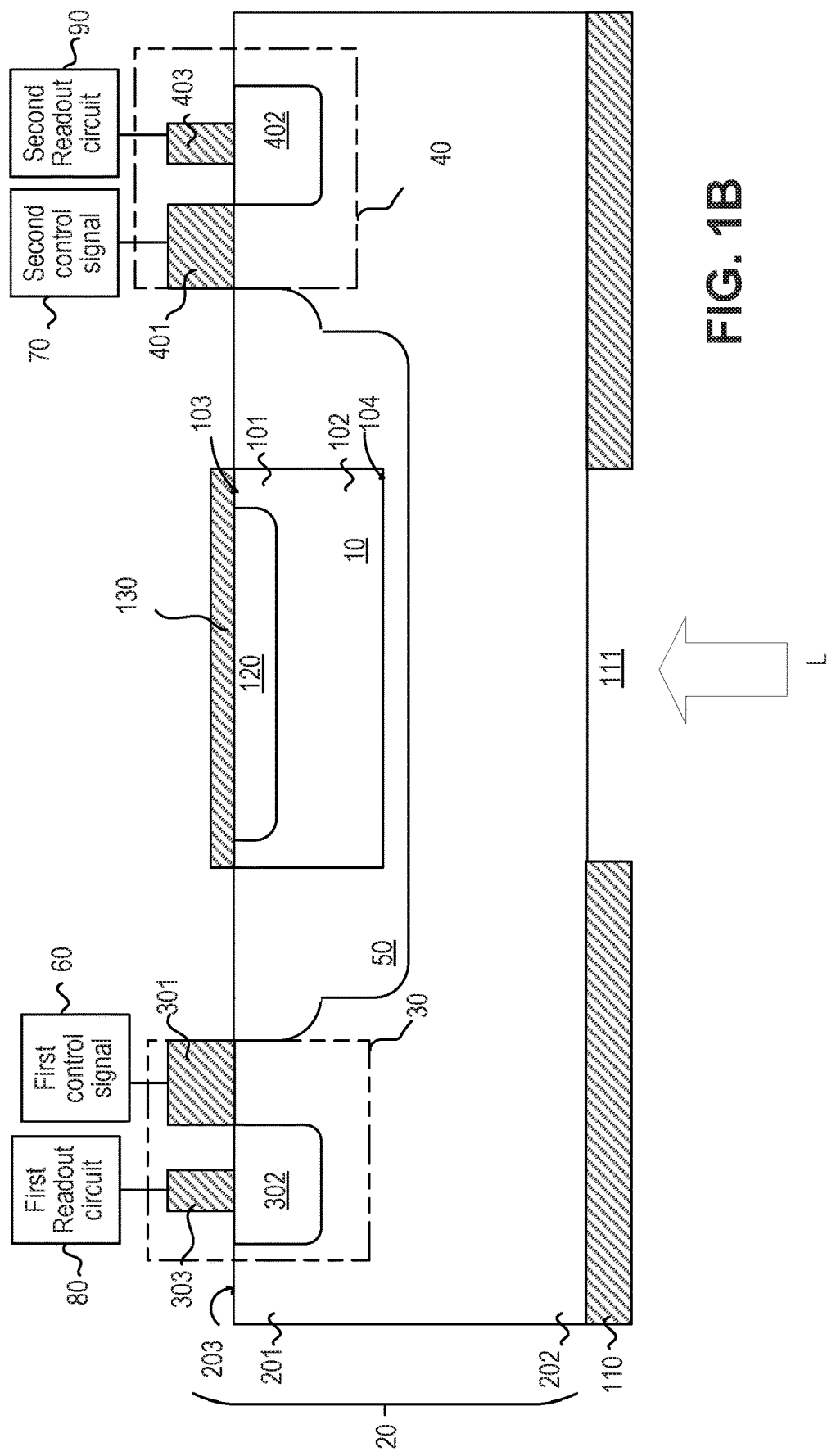
FIG. 1B illustrates a cross-sectional view of a photo-detecting apparatus, according to some embodiments.

FIG. 1B illustrates a cross-sectional view of a photo-detecting apparatus, according to some embodiments. The photo-detecting apparatus in FIG. 1B is similar to the photo-detecting apparatus in FIG. 1A, the difference is described below. In some embodiments, the absorption layer 10 is embedded in the substrate 20. In some embodiments, the top surface 103 of the absorption layer 10 is flush with the first surface 203 of the substrate 20. In some embodiments, the first switch 30, the common region 50 and the second switch 40 are outside of the absorption layer 10. In some embodiments, the carrier guiding unit (not labeled) and the absorption layer 10 are both at the first side 201 of the substrate 20. In some embodiments, the first gate terminal 301 and the second gate terminal 401 are on the first surface 203. The first carrier-output region 302 and the second carrier-output region 402 are at the first side 201 of the substrate 20. In some embodiments, the common region 50 is in the substrate 20 and surrounds the absorption layer 10. The first zone 120 is at the top side 101 of the absorption layer 10. In some embodiments, the material of the first zone 120 is different from the material of the first carrier-output region 302, different from the material of the common region 50 and different from the material of the second carrier-output region 402. In some embodiments, the common region 50, the first zone 120 and the absorption layer 10 are referred as a vertical photodiode. In some embodiments, the first carrier-output region 302 and the second carrier-output region 402 include GeSi. In some embodiments, the vertical photodiode is a heterojunction diode since the common region 50 and the first zone 120 include different materials. In some embodiments, the first switch 30, the common region 50 and the second switch 40 are integrated with the substrate 20. In some embodiments, from a cross-sectional view of a photo-detecting apparatus, the second terminal 130 includes a width not less than a width of the absorption layer 10. In some embodiments, the second terminal 130 is referred as a reflector for reflecting the incident light L back into the absorption layer 10. Therefore, quantum efficiency of the photo-detecting apparatus is higher. In some embodiments, since the material of the absorption layer 10 is different from the material of the substrate 20, by having the first carrier-output region 302 and the second carrier-output region 402 outside of the absorption layer 10 and integrated with the substrate 20, a leakage current between the second carrier-output region 402 and the first carrier-output region 302 is lower.

In some embodiments, the substrate 20 includes silicon. The absorption layer 10 includes intrinsic germanium. The first carrier-output region 302 includes p-type silicon, the second carrier-output region 402 includes p-type silicon, and the common region 50 includes p-type silicon. The first zone 120 includes n-type germanium. For example, the first carrier-output region 302, the second carrier-output region 402 and the common region 50 include silicon doped with boron having a peak concentration between $1\times10^{18}$ cm$^{-3}$ and $5\times10^{20}$ cm$^{-3}$. The first zone 120 includes germanium doped with phosphorous having a peak concentration between $1\times10^{18}$ cm$^{-3}$ and $5\times10^{20}$ cm$^{-3}$. In these embodiments, the photo-detecting apparatus is configured to collects holes. In some embodiments, the first carrier-output region 302 includes n-type silicon, the second carrier-output region 402 includes n-type silicon, and the common region 50 includes n-type silicon. The first zone 120 includes p-type germanium. In these embodiments, the photo-detecting apparatus is configured to collects electrons. For example, the absorption layer 10 includes intrinsic germanium. The first carrier-output region 302, the second carrier-output region 402 and the common region 50 include silicon doped with phosphorous having a peak concentration between $1\times10^{18}$ cm$^{-3}$ and $5\times10^{20}$ cm$^{-3}$. The first zone 120 includes germanium doped with boron having a peak concentration between $1\times10^{18}$ cm$^{-3}$ and $5\times10^{20}$ cm$^{-3}$. In some embodiments, since the common region 50 covers the whole absorption layer 10, the photo-detecting apparatus is with improved quantum efficiency. In some embodiments, since the first switch 30 and the second switch 40 share the common region 50 during the operation of the photo-detecting apparatus, most of the carriers can be forced to move toward one of the second carrier-output region 402 and the first carrier-output region 302, and therefore the photo-detecting apparatus is with improved demodulation contrast.

The operating method of the photo-detecting apparatus in FIG. 1B is similar to the operating method of the photo-detecting apparatus disclosed in FIG. 1A.

Figure 1C:
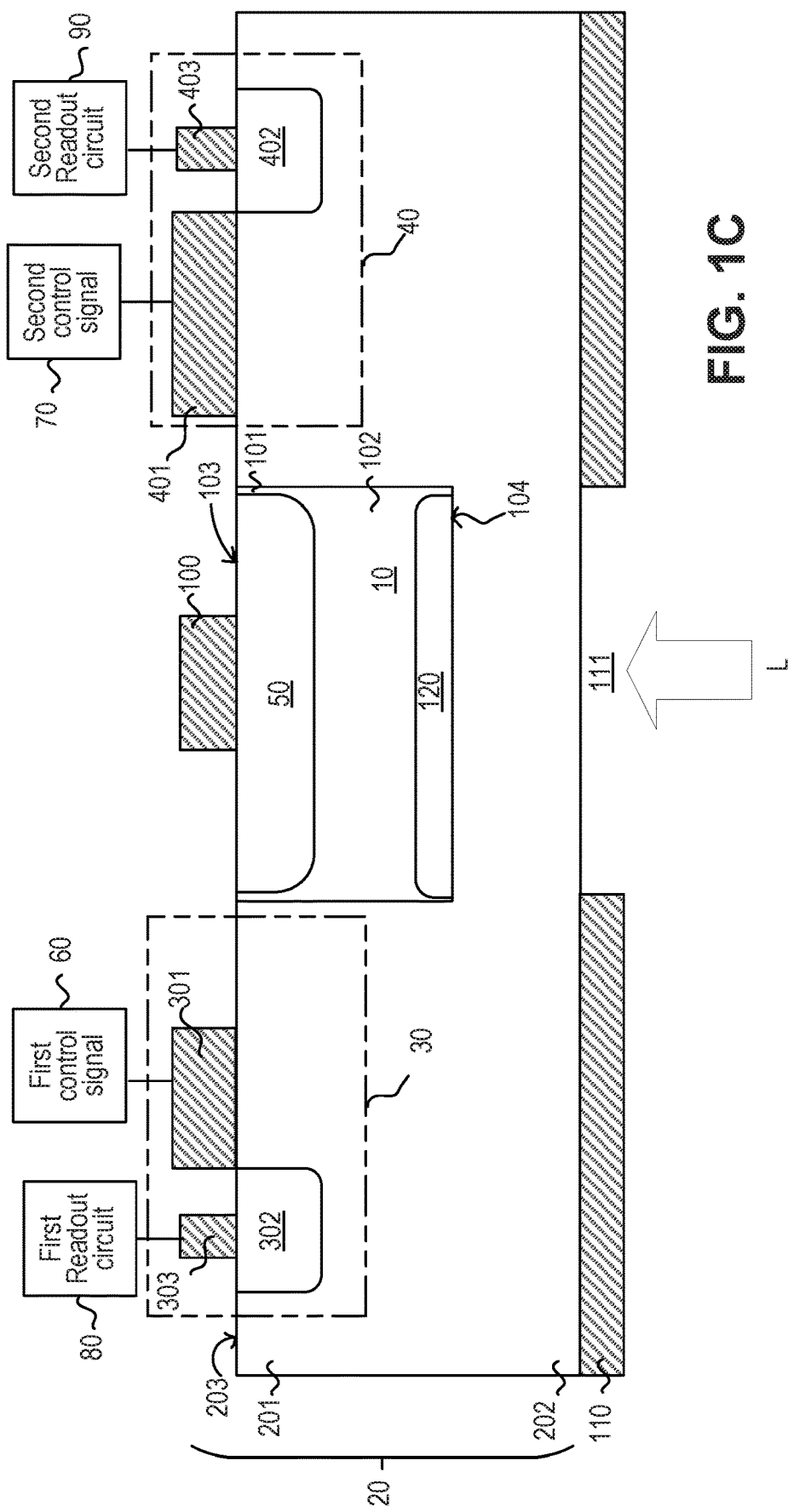
FIG. 1C illustrates a cross-sectional view of a photo-detecting apparatus, according to some embodiments.

FIG. 1C illustrates a cross-sectional view of a photo-detecting apparatus, according to some embodiments. The photo-detecting apparatus in FIG. 1C is similar to the photo-detecting apparatus in FIG. 1B. The difference is described below. In some embodiments, the material of the first zone 120 and the material of the common region 50 are the same, and the material of the first carrier-output region 302 and the material of the second carrier-output region 402 are the same. In some embodiments, the absorption layer 10 is between the first gate terminal 301 and the second gate terminal 401. In some embodiments, the first zone 120 is at the bottom side 102 of the absorption layer 10, and the common region 50 is at the top side 101 of the absorption layer 10. In some embodiments, the second terminal (not shown) as described in FIG. 1 is in the substrate 20 to electrically couple the first zone 120 and the second external source. In some embodiments, one of the sides of the second terminal reaches the first side 201 of the substrate 20. Therefore, the second terminal, the first readout terminal 303, the first gate terminal 301, the second gate terminal 401, and the second readout terminal 403 can be processed at the same side of the substrate 20.

In some embodiment, the common region 50, the absorption layer 10 and the first zone 120 are referred as a vertical photodiode. In some embodiments, the vertical photodiode is a homojunction diode. In some embodiments, since the material of the absorption layer 10 is different from the material of the substrate 20, by having the first carrier-output region 302 and the second carrier-output region 402 outside of the absorption layer 10 and integrated with the substrate 20, a leakage current between the second carrier-output region 402 and the first carrier-output region 302 is lower.

In some embodiments, the substrate 20 includes n-type silicon. The absorption layer 10 includes intrinsic germanium. The first carrier-output region 302 includes p-type silicon, the second carrier-output region 402 includes p-type silicon. The common region 50 includes p-type germanium, and the first zone 120 includes n-type germanium. For example, the substrate 20 includes silicon doped with phosphorous having a peak concentration between $1\times10^{14}$ cm$^{-3}$ and $5\times10^{16}$ cm$^{-3}$. The first carrier-output region 302 and the second carrier-output region 402 include silicon doped with boron having a peak concentration between $1\times10^{18}$ cm$^{-3}$ and $5\times10^{20}$ cm$^{-3}$. The common region 50 includes germanium doped with boron having a peak concentration between $1\times10^{18}$ cm$^{-3}$ and $5\times10^{20}$ cm$^{-3}$. The first zone 120 includes germanium doped with phosphorous having a peak concentration between $1\times10^{18}$ cm$^{-3}$ and $5\times10^{20}$ cm$^{-3}$. In these embodiments, the photo-detecting apparatus is configured to collects holes.

In some embodiments, the first carrier-output region 302 includes n-type silicon, the absorption layer 10 includes intrinsic germanium, the second carrier-output region 402 includes n-type silicon, and the common region 50 includes n-type germanium. The first zone 120 includes p-type germanium. For example, the first carrier-output region 302 and the second carrier-output region 402 include silicon doped with phosphorous having a peak concentration between $1\times10^{18}$ cm$^{-3}$ and $5\times10^{20}$ cm$^{-3}$. The common region 50 includes germanium doped with phosphorous having a peak concentration between $1\times10^{18}$ cm$^{-3}$ and $5\times10^{20}$ cm$^{-3}$. The first zone 120 includes germanium doped with boron having a peak concentration between $1\times10^{18}$ cm$^{-3}$ and $5\times10^{20}$ cm$^{-3}$. In these embodiments, the photo-detecting apparatus is configured to collects electrons. The operating method of the photo-detecting apparatus in FIG. 1C is similar to the operating method of the photo-detecting apparatus disclosed in FIG. 1B. Similarly, in some embodiments, the common region 50 is not coupled to any external control and thus is floated. The floated common region reduces leakage current between the common region 50 and the first carrier-output region 302 or reduces the leakage current between the common region 50 and the second carrier-output region 402 during the operation of the photo-detecting apparatus.

Figure 2A:
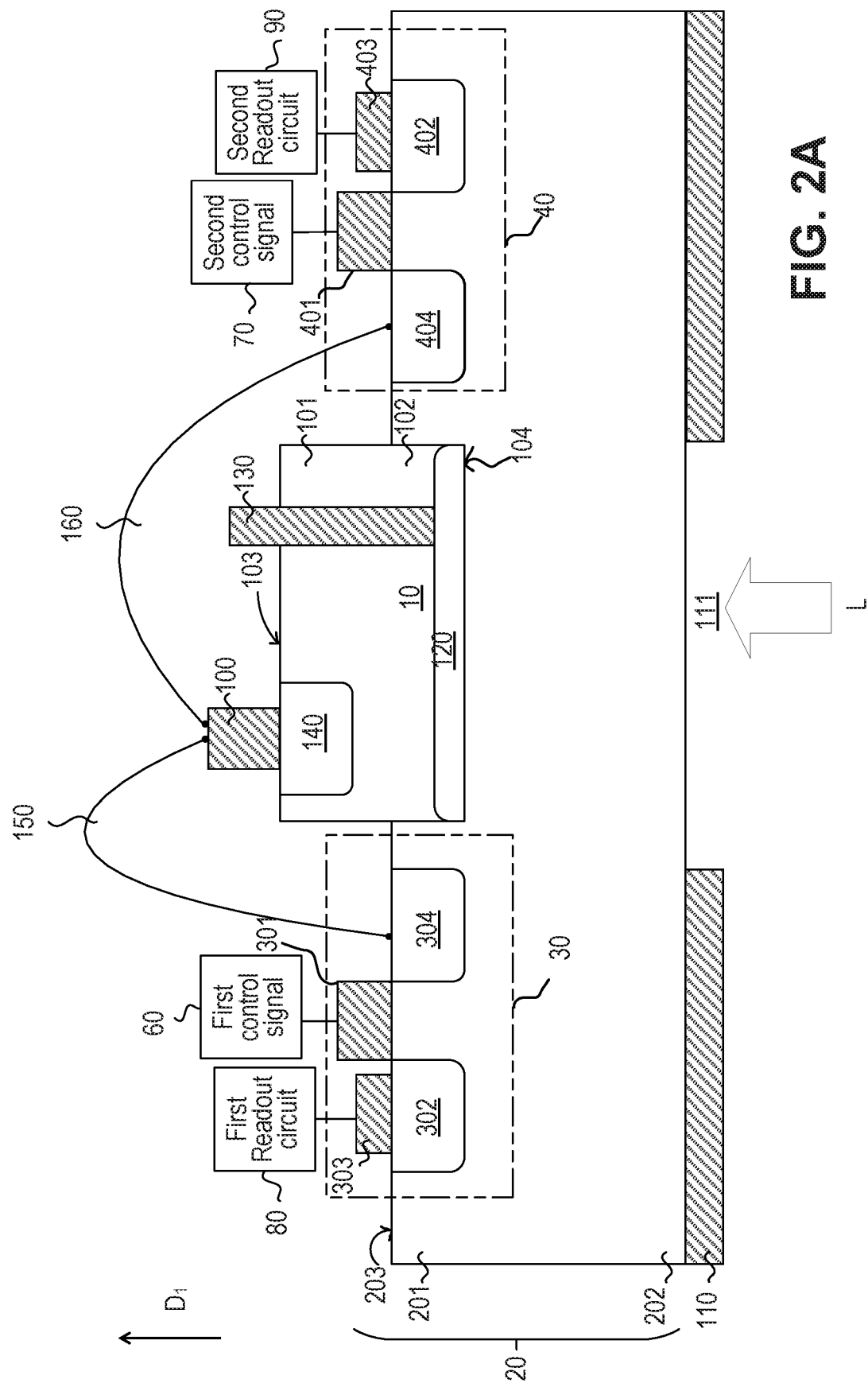
FIG. 2A illustrates a cross-sectional view of a photo-detecting apparatus, according to some embodiments.

FIG. 2A illustrates a cross-sectional view of a photo-detecting apparatus, according to some embodiments. The photo-detecting apparatus in FIG. 2A is similar to the photo-detecting apparatus in FIG. 1C, the difference is described below. In some embodiments, the first switch 30 and the second switch 40 are at two opposite sides of the absorption layer 10. In some embodiments, instead of the common region 50 in FIGS. 1A through 1C, the first switch 30 includes a first carrier-input region 304, and the second switch 40 includes a second carrier-input region 404. The first carrier-output region 302 and the first carrier-input region 304 are at two opposite sides of the first gate terminal 301. The second carrier-output region 402 and the second carrier-input region 404 are at two opposite sides of the second gate terminal 401. The second carrier-input region 404 is between the first carrier-input region 304 and the second gate terminal 401. In some embodiments, the absorption layer 10 is between the first switch 30 and the second switch 40. In some embodiments, the first carrier-output region 302, the second carrier-output region 402, the first carrier-input region 304, and the second carrier-input region 404 are at the first side 201 of the substrate 20. The first gate terminal 301 and the second gate terminal 401 are on the first surface 203 of the substrate 20. In some embodiments, the conductivity type of the first carrier-output region 302, the conductivity type of the second carrier-output region 402, the conductivity type of the first carrier-input region 304, and the conductivity type of the second carrier-input region 404 are the same. In some embodiments, the material of the first carrier-output region 302, the material of the first carrier-input region 304, the material of the second carrier-output region 402 and the material of the second carrier-input region 404 are the same. For example, the material of the first carrier-output region 302, the material of the first carrier-input region 304, the material of the second carrier-output region 402 and the material of the second carrier-input region 404 all include silicon. For another example, the material of the first carrier-output region 302, the material of the first carrier-input region 304, the material of the second carrier-output region 402 and the material of the second carrier-input region 404 all include GeSi. In some embodiments, the photo-detecting apparatus further includes a connected to the absorption layer 10. In some embodiments, the first region 140 is in the absorption layer 10. In some embodiments, the first region 140 is at the top side 101 of the absorption layer 10 and is opposite to the first zone 120. In some embodiment, the material of the first region 140 and the material of the first zone 120 are the same. For example, the material of the first region 140 and the material of the first zone 120 both include germanium. The first region 140 is of a first conductivity type different from the conductivity type of the first zone 120. In some embodiment, the first region 140 includes a dopant, and the dopant includes a peak concentration between $1\times10^{18}$ cm$^{-3}$ and $5\times10^{20}$ cm$^{-3}$. In some embodiments, the absorption layer 10 is protruded from the first surface 203 of the substrate 20. In some embodiments, the second terminal 130 penetrates through the absorption layer 10 and is connected to the first zone 120. In some embodiments, the photo-detecting apparatus further includes a first conductive wire 150 and a second conductive wire 160. In some embodiments, first conductive wire 150 connects the first terminal 100 and the first carrier-input region 304. In some embodiments, the second conductive wire 160 connects the first terminal 100 and the second carrier-input region 404. The first conductive wire 150 is for establishing a path outside of the absorption layer 10 for carriers flowing from the first region 140 to the first carrier-input region 304. The second conductive wire 160 is for establishing a path outside of the absorption layer 10 for carriers flowing from the first region 140 to the second carrier-input region 404. In some embodiments, the first region 140, the absorption layer 10 and the first zone 120 are referred as a vertical photodiode. In some embodiments, the vertical photodiode is a homojunction diode. In some embodiments, the first switch 30 is referred as a first MOSFET. The second switch 40 is referred as a second MOSFET. In some embodiments, the first switch 30 is referred as a first MESFET. The second switch 40 is referred as a second MESFET.

In some embodiments, the substrate 20 includes p-type silicon. The absorption layer 10 includes intrinsic germanium. The first carrier-output region 302 includes n-type silicon, the second carrier-output region 402 includes n-type silicon. The first carrier-input region 304 includes n-type silicon, the second carrier-input region 404 includes n-type silicon. The first zone 120 includes p-type germanium. The first region 140 includes n-type germanium. For example, the first carrier-output region 302, the second carrier-output region 402, the first carrier-input region 304 and the second carrier-input region 404 include silicon doped with phosphorous having a peak concentration between $1\times10^{18}$ cm$^{-3}$ and $5\times10^{20}$ cm$^{-3}$. The first region 140 includes germanium doped with phosphorous having a peak concentration between $1\times10^{18}$ cm$^{-3}$ and $5\times10^{20}$ cm$^{-3}$. The first zone 120 includes germanium doped with boron having a peak concentration between $1\times10^{18}$ cm$^{-3}$ and $5\times10^{20}$ cm$^{-3}$. In these embodiments, the photo-detecting apparatus is configured to collects electrons.

In some embodiments, the substrate 20 includes n-type silicon. The absorption layer 10 includes intrinsic germanium. The first carrier-output region 302 includes p-type silicon, the second carrier-output region 402 includes p-type silicon. The first carrier-input region 304 includes p-type silicon, the second carrier-input region 404 includes p-type silicon. The first zone 120 includes n-type germanium. The first region 140 includes p-type germanium. For example, the first carrier-output region 302, the second carrier-output region 402, the first carrier-input region 304 and the second carrier-input region 404 include silicon doped with boron having a peak concentration between $1\times10^{18}$ cm$^{-3}$ and $5\times10^{20}$ cm$^{-3}$. The first region 140 includes germanium doped with boron having a peak concentration between $1\times10^{18}$ cm$^{-3}$ and $5\times10^{20}$ cm$^{-3}$. The first zone 120 includes germanium doped with phosphorous having a peak concentration between $1\times10^{18}$ cm$^{-3}$ and $5\times10^{20}$ cm$^{-3}$. In these embodiments, the photo-detecting apparatus is configured to collects holes. The operating method of the photo-detecting apparatus in FIG. 4 is similar to the operating method of the photo-detecting apparatus disclosed in FIG. 1B. The difference is described below. During the operation of the photo-detecting apparatus, the carriers are moving toward the first switch 30 via the first conductive wire 150, and similarly, the carriers are moving toward the second switch 40 via the second conductive wire 160. Since the photo-detecting apparatus includes the first conductive wire 150 and the second conductive wire 160 for establishing a path outside of the absorption layer 10 for carriers, and thus carriers can be prevented from moving through the interface of the absorption layer 10 and the substrate 20, and thus the photo-detecting apparatus is with lower dark current and the carriers are transferred at a higher speed.

Figure 2C:
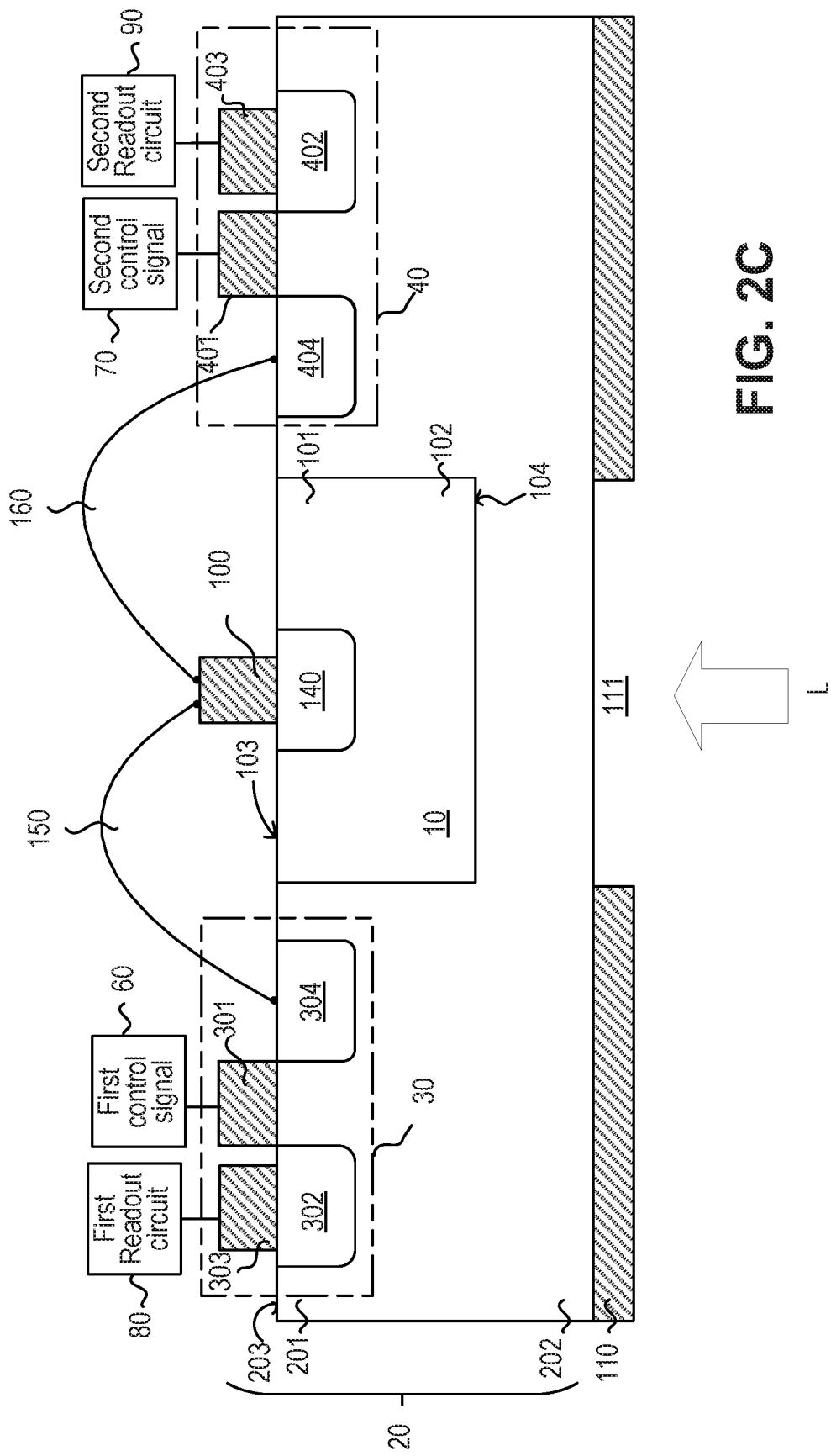
FIG. 2C illustrates a cross-sectional view of a photo-detecting apparatus shown in FIG. 2B, according to some embodiments.

FIG. 2B illustrates a top view of a photo-detecting apparatus, according to some embodiments. FIG. 2C illustrates a cross-sectional view of a photo-detecting apparatus shown in FIG. 2B. The photo-detecting apparatus in FIG. 2C is similar to the photo-detecting apparatus in FIG. 2A, the difference is described below. In some embodiments, the top surface 103 of the absorption layer 10 is flush with the first surface 203 of the substrate 20. In some embodiments, the first region 140 and the first zone 120 are both at the top side 101 of the absorption layer 10. The first region 140 is between the first carrier-input region 304 and the second carrier-input region 404. In some embodiments, a direction from the first zone 120 to the first region 140 is substantially perpendicular to the direction from the first carrier-input region 304 to the second carrier-input region 404. In some embodiments, the first zone 120 is not overlapped with the first region 140 along a vertical direction $D_1$. The first region 140, the absorption layer 10 and the first zone 120 are referred as a lateral photodiode. In some embodiments, the lateral photodiode is a homojunction diode. The term "lateral photodiode" refers to a photodiode in which a direction from the p-terminal to the n-terminal is substantially perpendicular to a direction from the bottom surface 104 to the top surface 103 of the absorption layer 10. The operating method of the photo-detecting apparatus in FIG. 2C is similar to the operating method of the photo-detecting apparatus disclosed in FIG. 2A.

Figure 2D:
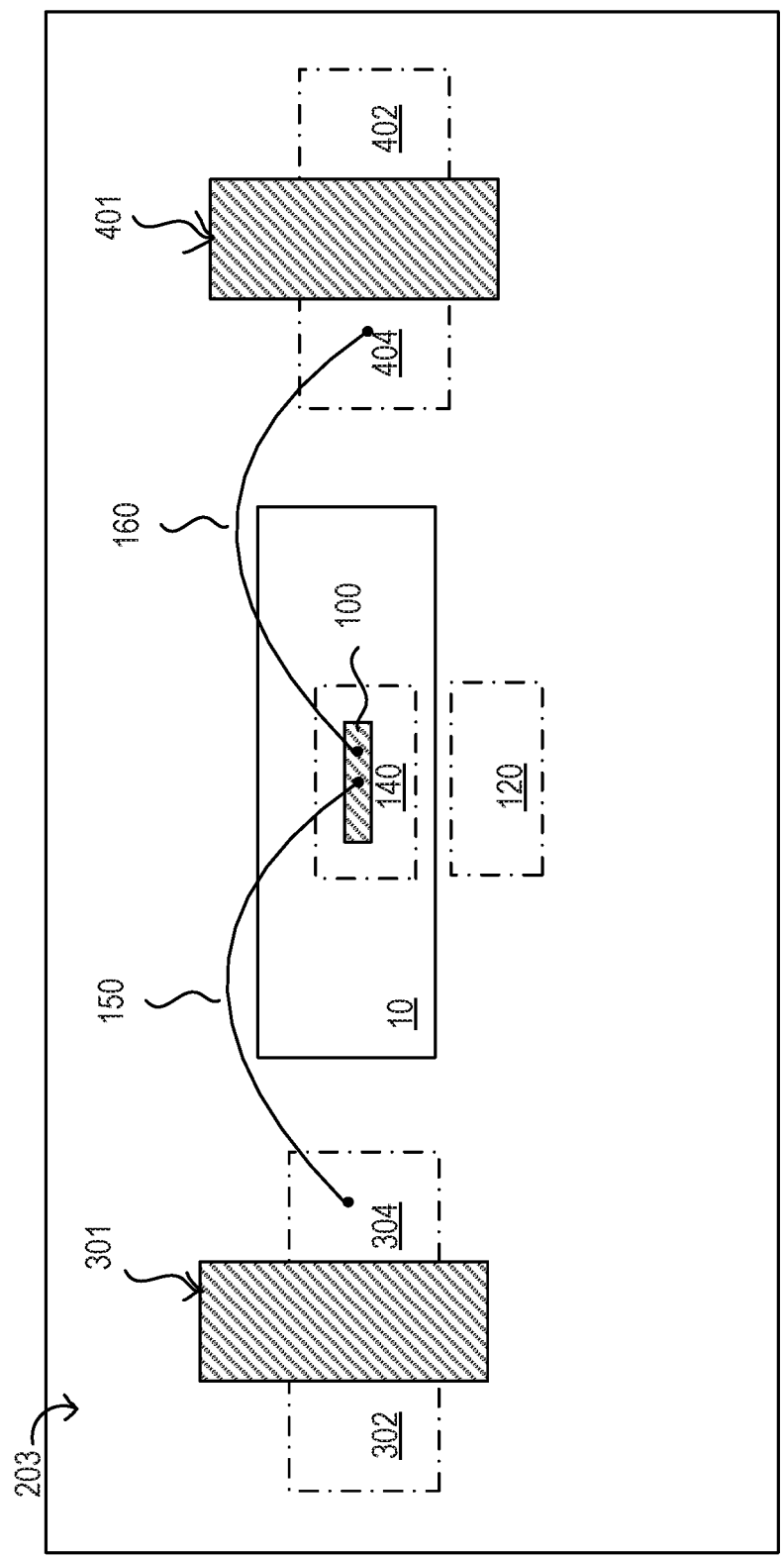
FIG. 2D illustrates a top view of a photo-detecting apparatus, according to some embodiments.

FIG. 2D illustrates a top view of a photo-detecting apparatus according to some embodiments. The photo-detecting apparatus in FIG. 2D is similar to the photo-detecting apparatus in FIG. 2C, the difference is described below. In some embodiments, the first zone 120 is at the first side 201 of the substrate 20. In some embodiments, the material of the first zone 120 is different from the material of the first region 140. The first region 140, the absorption layer 10 and the first zone 120 are referred as a lateral photodiode. In some embodiments, the lateral photodiode is a heterojunction diode. The operating method of the photo-detecting apparatus in FIG. 2D is similar to the operating method of the photo-detecting apparatus disclosed in FIG. 2C.

Figure 2E:
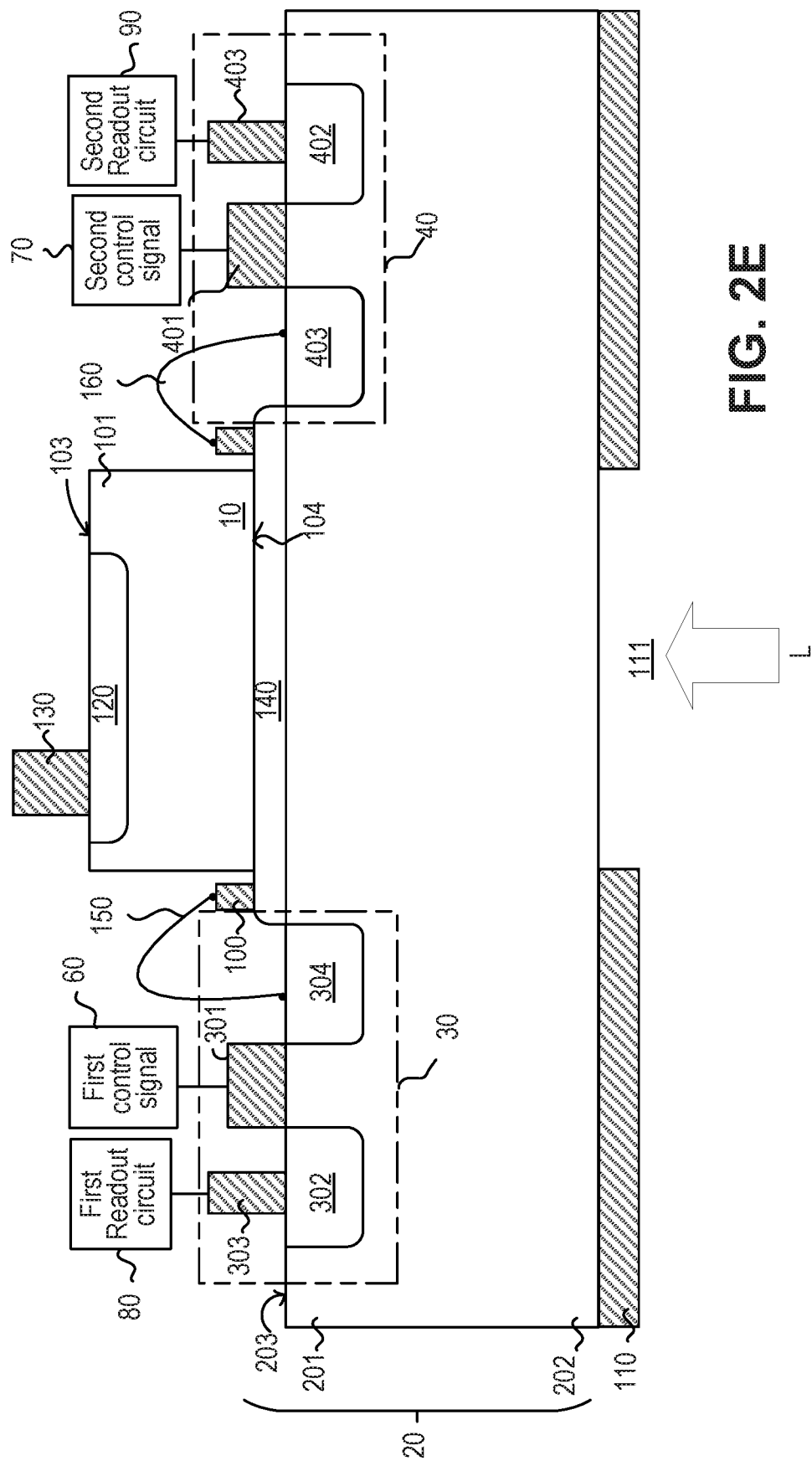
FIG. 2E illustrates a cross-sectional view of a photo-detecting apparatus, according to some embodiments.

FIG. 2E illustrates a cross-sectional view of a photo-detecting apparatus, according to some embodiments. The photo-detecting apparatus in FIG. 2E is similar to the photo-detecting apparatus in FIG. 2A, the difference is described below. In some embodiments, the first region 140 is between the substrate 20 and the absorption layer 10 and includes an exposed region exposed from the absorption layer 10. The first terminal 100 is on the exposed region of the first region 140. In some embodiments, the first region 140 is between the first surface 203 of the substrate 20 and the absorption layer 10. In some embodiments, from a cross-sectional view of a photo-detecting apparatus, the first region 140 includes a width wider than a width of the absorption layer 10. The first region 140 is electrically coupled to the first carrier-input region 304 via the first conductive wire 150 and the first terminal 100. The first region 140 is electrically coupled to the second carrier-input region 404 via the second conductive wire 160 and the first terminal 100. A method of forming the photo-detecting apparatus includes a step of forming a blanket layer; removing a part of the blanket layer to form a bottom part and an absorption layer 10 on the bottom part, wherein the bottom part includes an exposed region exposed from the absorption layer 10; and doping the bottom part to form the first region 140. Since the photo-detecting apparatus includes the first conductive wire 150 and the second conductive wire 160 for establishing a path outside of the absorption layer 10 for carriers, and thus carriers can be prevented from moving through the interface of the absorption layer 10 and the substrate 20, and thus the photo-detecting apparatus is with lower dark current and the carriers are transferred at a higher speed.

The operating method of the photo-detecting apparatus in FIG. 2E is similar to the operating method of the photo-detecting apparatus disclosed in FIG. 2C.

Figure 2F:
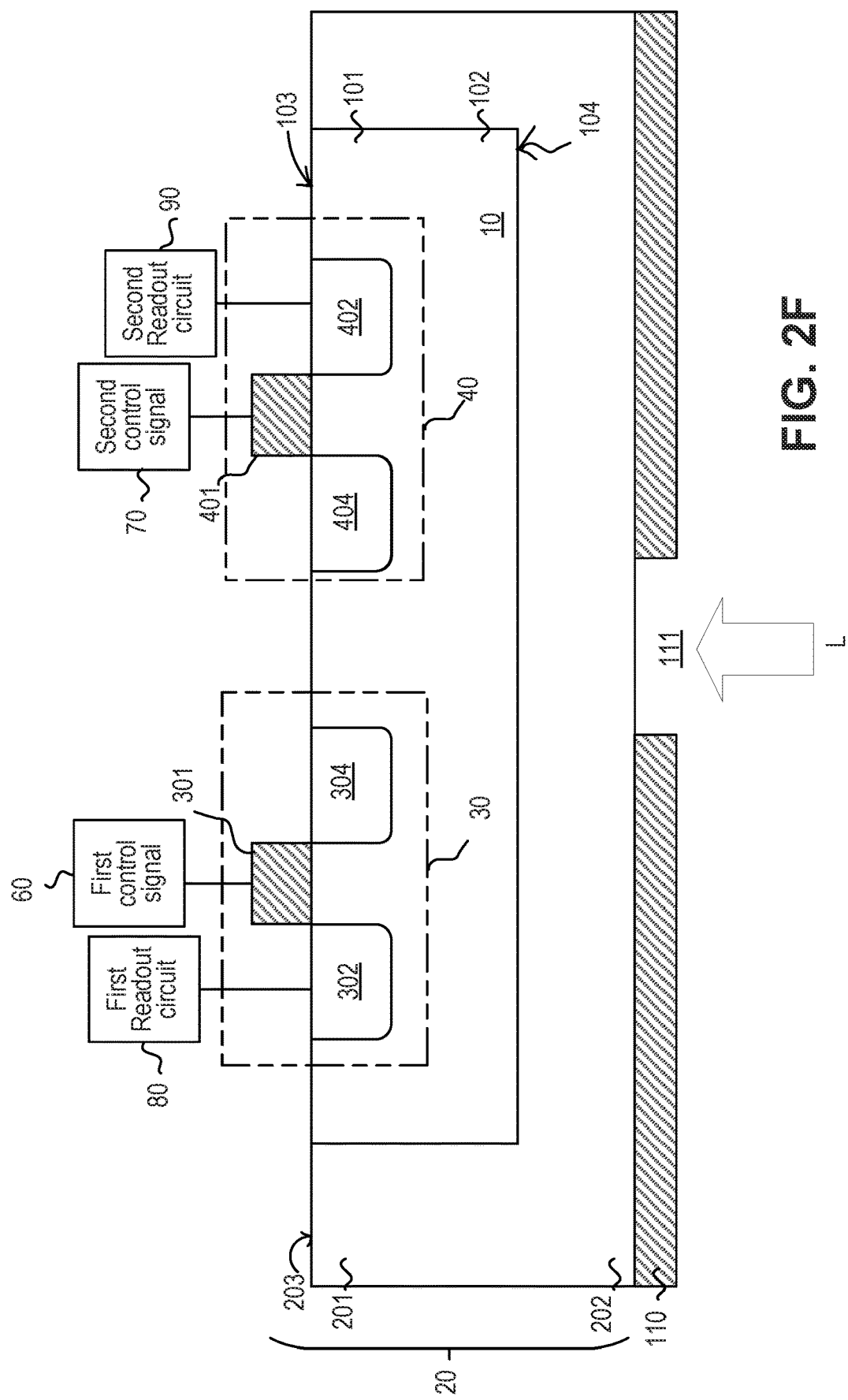
FIG. 2F illustrates a cross-sectional view of a photo-detecting apparatus, according to some embodiments.

FIG. 2F illustrates a cross-sectional view of a photo-detecting apparatus, according to some embodiments. The photo-detecting apparatus in FIG. 2F is similar to the photo-detecting apparatus in FIG. 1A. The difference is described below. The absorption layer 10 is embedded in the substrate 20. In some embodiments, the top surface 103 of the absorption layer 10 is flush with the first surface 203 of the substrate 20. In some embodiments, the first switch 30 includes a first carrier-input region 304 as described in FIG. 2A and the second switch 40 includes a second carrier-input region 404 as described in FIG. 2A. The absorption layer 10 is of a conductivity type different from the conductivity type of the first carrier-input region 304 and the conductivity type of the second carrier-input region 404. In some embodiments, the first carrier-output region 302, the second carrier-output region 402, the first carrier-input region 304, and the second carrier-input region 404 are at the top side 101 of the absorption layer 10. In some embodiments, the material of the first carrier-output region 302, the material of the first carrier-input region 304, the material of the second carrier-output region 402 and the material of the second carrier-input region 404 are the same. For example, the material of the first carrier-output region 302, the material of the first carrier-input region 304, the material of the second carrier-output region 402 and the material of the second carrier-input region 404 all include p-type germanium. In some embodiments, the absorption layer 10 and the first carrier-input region 304 are referred as a first photodiode, and the absorption layer 10 and the second carrier-input region 404 are referred as a second photodiode. In some embodiments, the first photodiode and the second photodiode are both homojunction diodes.

The operating method of the photo-detecting apparatus in FIG. 2F is similar to the operating method of the photo-detecting apparatus disclosed in FIG. 1A. In some embodiments, the incident light L enters into the absorption layer 10 from the top side 101 of the absorption layer 10.

Figure 2G:
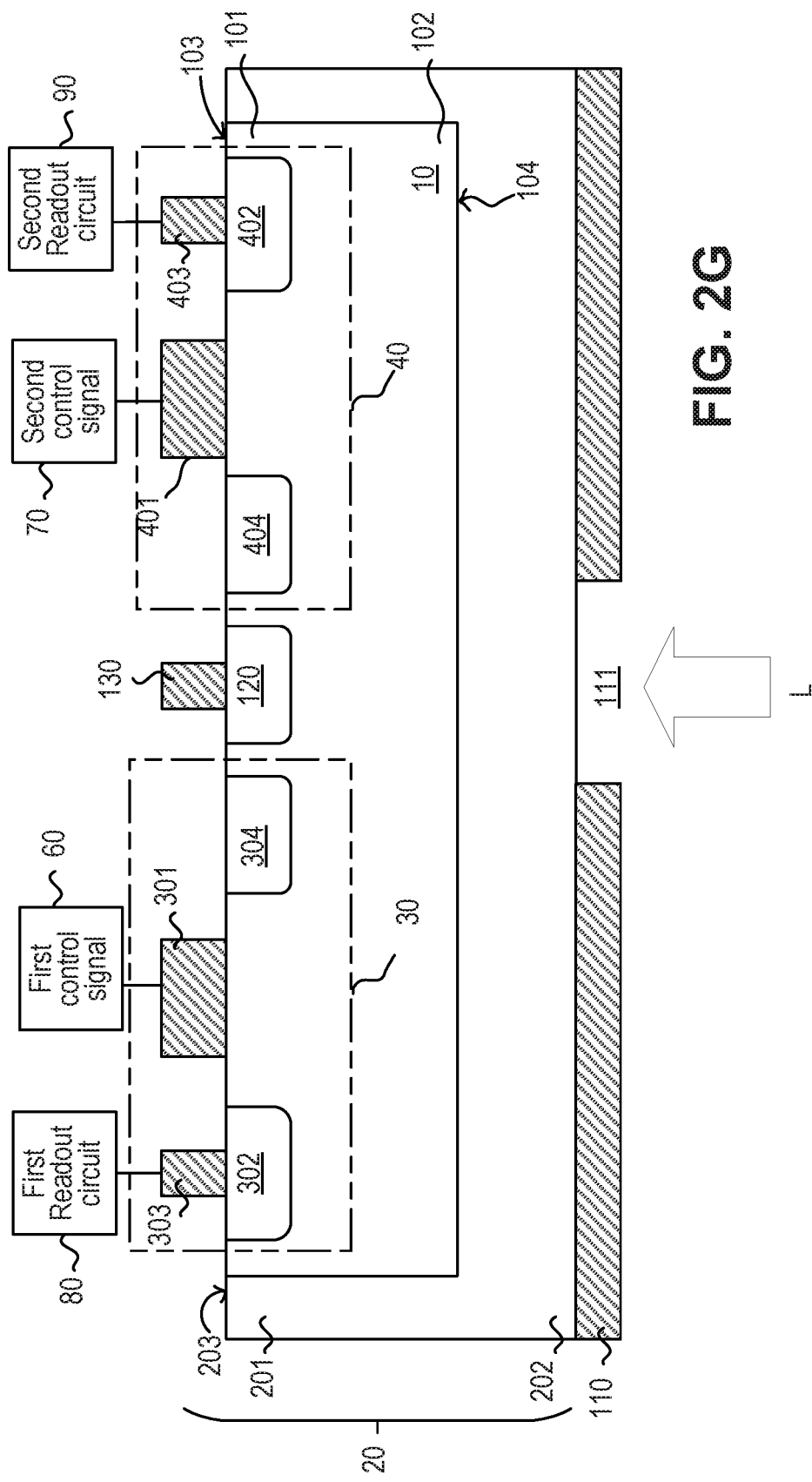
FIG. 2G illustrates a cross-sectional view of a photo-detecting apparatus, according to some embodiments.

FIG. 2G illustrates a cross-sectional view of a photo-detecting apparatus, according to some embodiments. The photo-detecting apparatus in FIG. 2G is similar to the photo-detecting apparatus in FIG. 2F. The difference is described below. The photo-detecting apparatus includes a first zone 120 as described in FIG. 1A. The first zone 120 is in the absorption layer 10. In some embodiments, the first zone 120 is at the top side 101 of the absorption layer 10. The first zone 120 is of a conductivity type different from the conductivity type of the first carrier-input region 304 and the conductivity type of the second carrier-input region 404. In some embodiments, the absorption layer 10 is intrinsic. The first carrier-input region 304, the absorption layer 10 and the first zone 120 are referred as a first lateral photodiode. In some embodiments, the second carrier-input region 404, the absorption layer 10 and the first zone 120 are referred as a second lateral photodiode. In some embodiments the first lateral photodiode and the second lateral photodiode are both homojunction diodes.

In some embodiments, the first switch 30 is referred as a first MESFET. The second switch 40 is referred as a second MESFET. In some embodiments, the first carrier-input region 304 is one end of the first MESFET, and also one end of the first lateral photodiode. In some embodiments, the second carrier-input region 404 is one end of the second MESFET, and also one end of the second lateral photodiode. In some embodiments, the first MESFET, the second MESFET, the first lateral photodiode and the second lateral photodiode are integrated with a single absorption layer 10.

In some embodiments, the first switch 30 is referred as a first MOSFET. The second switch 40 is referred as a second MOSFET. In some embodiments, the first carrier-input region 304 is one end of the first MOSFET, and one end of the first lateral photodiode. In some embodiments, the second carrier-input region 404 is one end of the second MOSFET, and one end of the second lateral photodiode. In some embodiments, the first MOSFET, the second MOSFET, the first lateral photodiode and the second lateral photodiode are integrated with a single absorption layer 10. For example, when the first carrier-output region 302, the first carrier-input region 304, the second carrier-output region 402 and the second carrier-input region 404 are of n-type, and the first zone 120 is of p-type, the first carrier-input region 304 is the n terminal of the first lateral photodiode, and the source of the first MOSFET or the first MESFET. The second carrier-input region 404 is the n terminal of the second lateral photodiode, and the source of the second MOSFET or the second MESFET. The first zone 120 is the p terminal of the first lateral photodiode and the p terminal of the second lateral photodiode. In some embodiments, the first MOSFET and the second MOSFET can be enhancement mode. In some embodiments, the first MOSFET and the second MOSFET can be depletion mode.

For another example, when the first carrier-output region 302, the first carrier-input region 304, the second carrier-output region 402 and the second carrier-input region 404 are of p-type, and the first zone 120 is of n-type, the first carrier-input region 304 is the p terminal of the first lateral photodiode, and the source of the first MOSFET or the first MESFET. The second carrier-input region 404 is the p terminal of the second lateral photodiode, and the source of the second MOSFET or the second MESFET. The first zone 120 is the n terminal of the first lateral photodiode and the n terminal of the second lateral photodiode at the same time.

In some embodiments, the absorption layer 10 includes intrinsic germanium. The first carrier-output region 302 includes n-type germanium, the second carrier-output region 402 includes n-type germanium, the first carrier-input region 304 includes n-type germanium, and the second carrier-input region 404 includes n-type germanium. The first zone 120 includes p-type germanium. For example, the first carrier-output region 302, the second carrier-output region 402, the first carrier-input region 304 and the second carrier-input region 404 include germanium doped with phosphorous having a peak concentration between $1 \times 10^{18}$ cm$^{-3}$ and $5 \times 10^{20}$ cm$^{-3}$. The first zone 120 includes germanium doped with boron having a peak concentration between $1 \times 10^{18}$ cm$^{-3}$ and $5 \times 10^{20}$ cm$^{-3}$. In these embodiments, the photo-detecting apparatus is configured to collects electrons.

In some embodiments, the first carrier-output region 302 includes p-type germanium, the second carrier-output region 402 includes p-type germanium, the first carrier-input region 304 includes p-type germanium, and the second carrier-input region 404 includes p-type germanium. The first zone 120 includes n-type germanium. For example, the first carrier-output region 302, the second carrier-output region 402, the first carrier-input region 304 and the second carrier-input region 404 include germanium doped with boron having a peak concentration between $1\times10^{18}$ cm$^{-3}$ and $5\times10^{20}$ cm$^{-3}$. The first zone 120 includes germanium doped with phosphorous having a peak concentration between $1\times10^{18}$ cm$^{-3}$ and $5\times10^{20}$ cm$^{-3}$. In these embodiments, the photo-detecting apparatus is configured to collects holes. The operating method of the photo-detecting apparatus in FIG. 2G is similar to the operating method of the photo-detecting apparatus disclosed in FIG. 1A. The difference is described below. In some embodiments, during the operation of the photo-detecting apparatus, when the p-n junction between first zone 120 and the first carrier-input region 304 is reverse biased, an incident light L is absorbed by an area between the first zone 120 and the first carrier-input region 304 to generate photo-carriers including electrons and holes. The first switch 30 is switched on to collect a major portion of the holes or the electrons of the photo-carriers. Since the area generating photo-carriers is closer to the first switch 30 that is switched on, the photo-detecting apparatus is with improved demodulation contrast. Similarly, when the p-n junction between first zone 120 and the second carrier-input region 404 is reverse biased, an incident light L is absorbed by an area between the first zone 120 and the second carrier-input region 404 to generate photo-carriers including electrons and holes. The second switch 40 is switched on to collect a major portion of the holes or electrons of the photo-carriers. Since the area generating photo-carriers is closer to the second switch 40 that is switched on, the photo-detecting apparatus is with improved demodulation contrast.

Figure 2H:
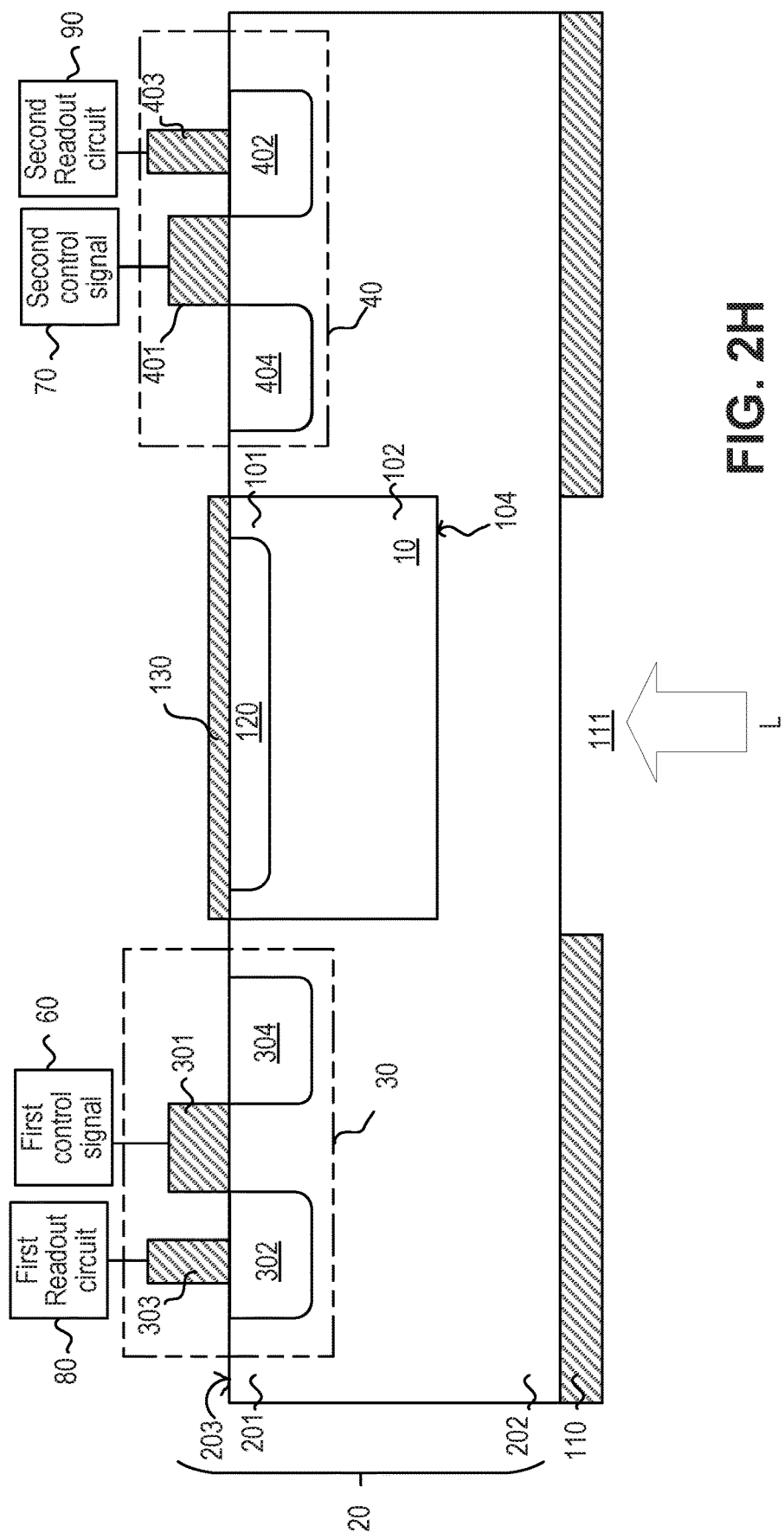
FIG. 2H illustrates a cross-sectional view of a photo-detecting apparatus, according to some embodiments.

FIG. 2H illustrates a cross-sectional view of a photo-detecting apparatus, according to some embodiments. The photo-detecting apparatus in FIG. 2H is similar to the photo-detecting apparatus in FIG. 2G. The difference is described below. In some embodiments, the first carrier-output region 302, the second carrier-output region 402, the first carrier-input region 304, and the second carrier-input region 404 are at the first side 201 of the substrate 20. In some embodiments, the absorption layer 10 is between the first switch 30 and the second switch 40. In some embodiments, the material of the first carrier-output region 302, the material of the first carrier-input region 304, the material of the second carrier-output region 402 and the material of the second carrier-input region 404 are the same. In some embodiments, the absorption layer 10 is intrinsic. The first carrier-input region 304, the absorption layer 10 and the first zone 120 are referred as a first lateral photodiode. The second carrier-input region 404, the absorption layer 10 and the first zone 120 are referred as a second lateral photodiode. In some embodiments, the first lateral photodiode and the second lateral photodiode are both heterojunction diodes. In some embodiments, from a cross-sectional view of a photo-detecting apparatus, the second terminal 130 includes a width not less than a width of the absorption layer 10. In some embodiments, the second terminal 130 is referred as a reflector for reflecting the incident light L back into the absorption layer 10. Therefore, quantum efficiency of the photo-detecting apparatus is higher. Since the material of the absorption layer 10 is different from the material of the substrate 20, by having the first switch 30 and the second switch 40 outside of the absorption layer 10 and integrated with the substrate 20, a leakage current between the second carrier-output region 402 and the first carrier-output region 302 is lower.

The operating method of the photo-detecting apparatus in FIG. 2H is similar to the operating method of the photo-detecting apparatus disclosed in FIG. 2G.

Figure 3A:
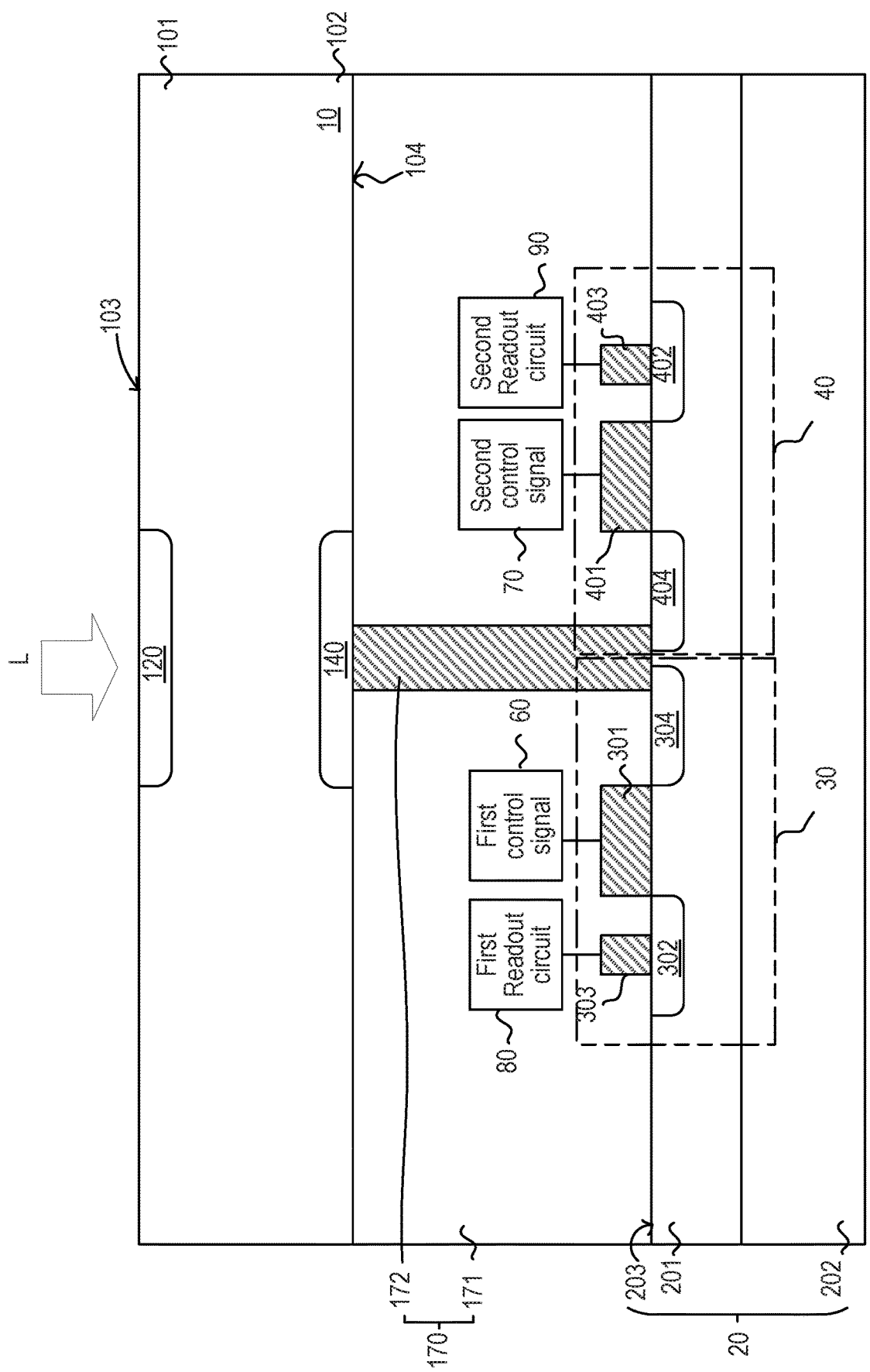
FIG. 3A illustrates a cross-sectional view of a photo-detecting apparatus, according to some embodiments.

FIG. 3A illustrates a cross-sectional view of a photo-detecting apparatus, according to some embodiments. The photo-detecting apparatus includes a substrate 20, an absorption layer 10, a first readout circuit 80, a second readout circuit 90, a first control signal 60, a second control signal 70, and a carrier guiding unit (not labeled) as described in FIG. 2A. The carrier guiding unit (not labeled), the first readout circuit 80, the second readout circuit 90, the first control signal 60, and the second control signal 70 are integrated with the substrate 20, and the first readout circuit 80, the second readout circuit 90, the first control signal 60, and the second control signal 70 are electrically coupled to the carrier guiding unit (not labeled). The carrier guiding unit is similar to the carrier guiding unit described in FIG. 2A. In some embodiments, the first region 140 is at the bottom side 102 of the absorption layer 10. The first zone 120 is at the top side 101 of the absorption layer 10. In some embodiment, the first region 140, the absorption layer 10 and the first zone 120 are referred as a vertical photodiode. In some embodiments, the vertical photodiode is a homojunction diode. In some embodiments, the photo-detecting apparatus further includes a bonding structure 170 between the substrate 20 and the absorption layer 10 for establishing electrical connections between the carrier guiding unit (not labeled) and the photodiode. In some embodiments, the bonding structure 170 connects the carrier guiding unit (not labeled) and the absorption layer 10. In some embodiments, the bonding structure 170 connects the first region 140 and the carrier guiding unit (not labeled). In some embodiments, the bonding structure 170 includes a bonding layer 171 and a first conductive structure 172 penetrating through the bonding layer 171. The first conductive structure 172 connects the first carrier-input region 304 and first region 140, and connects the second carrier-input region 404 and first region 140 for establishing electrical connections between the photodiode and the carrier guiding unit (not labeled). During the operation of the photo-detecting apparatus, the carriers are moving toward the first switch 30 or the second switch 40 through the first conductive structure 172. In some embodiments, the first gate terminal 301 and the second gate terminal 401 are covered by the bonding layer 171. The first readout terminal 303 and the second readout terminal 403 are covered by the bonding layer 171. In some embodiments, the first readout circuit 80, the second readout circuit 90, the first control signal 60, and the second control signal 70 are covered by the bonding layer 171. The bonding layer 171 is for isolating individual conductive electrical path. In some embodiments, the bonding layer 171 includes multiple sub-insulating layers (not shown) stacked together. In some embodiments, the bonding structure 170 further includes multiple conductive trenches (not shown) and internal contacts (not shown). Each of the multiple conductive trenches vertically penetrates at least one of the sub-insulating layers for establishing electrical connections within different sub-insulating layers. Each of the internal contacts is within one of the sub-insulating layers to horizontally connect two of the conductive trenches. In some embodiment, the first conductive structure 172 also includes multiple conductive trenches and internal contacts, wherein one of the conductive trenches connects the first region 140, and another one of the conductive trenches connects both the first carrier-input region 304 and the second carrier-input region 404. In some embodiments, the material of the conductive trenches and the material of the internal contacts Include, but is not limited to, metals. The bonding layer 171 includes insulating material including aluminum oxide ($AlO_x$), silicon oxide ($SiO_x$), silicon oxynitride ($SiO_xN_y$), silicon nitride ($Si_xN_y$), epoxy, polyimide, perfluorocyclobutane, benzocyclobutene (BCB) or silicone.

The operating method of the photo-detecting apparatus in FIG. 3A is similar to the operating method of the photo-detecting apparatus disclosed in FIG. 2A.

Figure 3B:
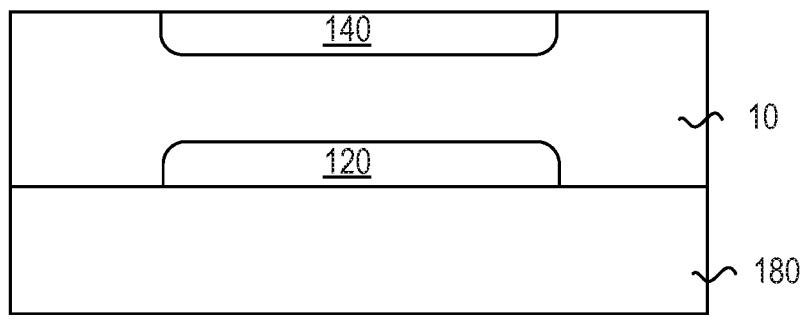
FIG. 3B through FIG. 3E illustrates the method for manufacturing the photo-detecting apparatus in FIG. 3A, according to some embodiments.
Figure 3C:
Figure 3D:
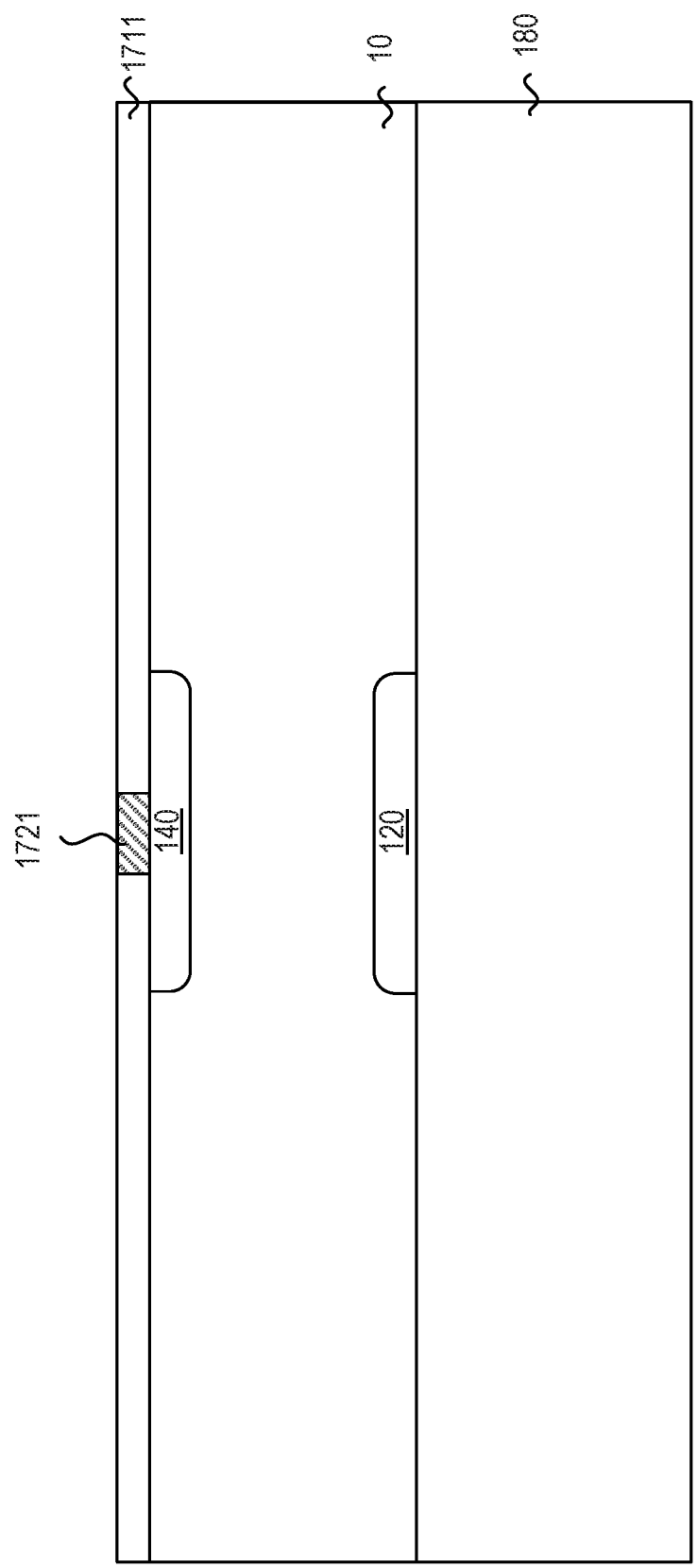
Figure 3E:
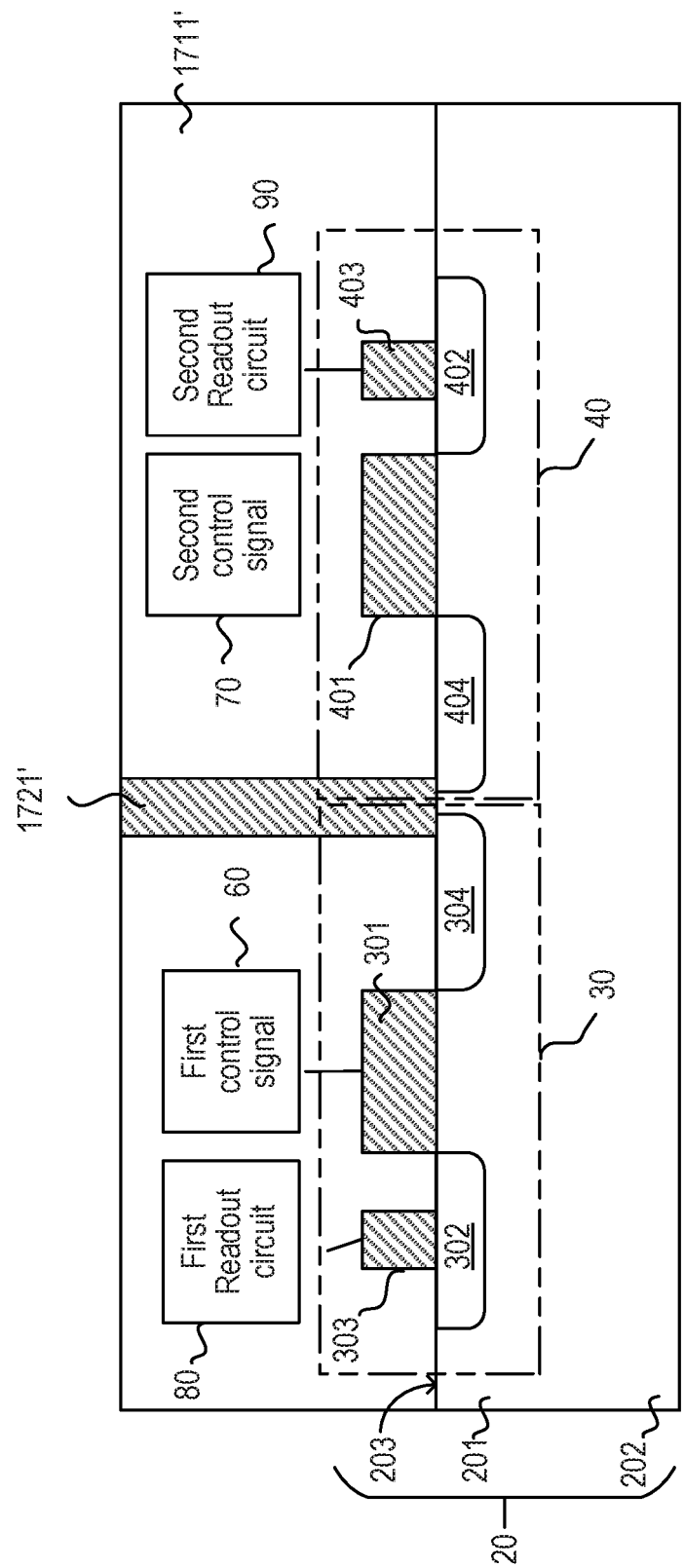

FIG. 3B through FIG. 3E illustrates the method for manufacturing the photo-detecting apparatus in FIG. 3A, according to some embodiments. Referring to FIG. 3B, the method includes providing a growth substrate 180; forming an absorption layer 10 on the growth substrate 180 by epitaxial growth or any suitable method. Referring to FIG. 3C, the method further includes forming a first region 140 and a first zone 120 in the absorption layer 10 by any suitable method, for example, ion implant. Referring to FIG. 3D, the method further includes forming a sub-insulating layer 1711 on the absorption layer 10; forming a conductive trench 1721 penetrating through the sub-insulating layer on the absorption layer 10 to connect the first region 140. Referring to FIG. 3E, the method further includes providing a substrate 20 integrated with a carrier guiding unit (not labeled), a first readout circuit 80, a second readout circuit 90, a first control signal 60, and a second control signal 70, wherein the first control signal 60, and the second control signal 70 are electrically coupled to the carrier guiding unit (not labeled). The substrate 20 includes a first side 201 and a second side 202 opposite to the first side 201, and first side 201 includes a first surface 203; forming a sub-insulating layer 1711' on first surface 203 of the substrate 20 and covering the first gate terminal 301, the second gate terminal 401; forming a conductive trench 1721' penetrating through the sub-insulating layer 1711' on first surface 203 of the substrate 20 to connect the first carrier-input region 304 and the second carrier-input region 404. The method further includes bonding the structure in FIG. 3E and the structure in FIG. 3D. In some embodiments, the method includes bonding the sub-insulating layer 1711' on the substrate 20 and the sub-insulating layer 1711 on the absorption layer 10 to form a bonding structure 170, wherein the two conductive trenches 1721, 1721' are connected after the bonding step; and removing the growth substrate 180 by any suitable method such as ICP or wet etching. After the bonding step, the carrier guiding unit is electrically coupled to the photodiode in the absorption layer 10. In some embodiments, after the bonding step, the carrier guiding unit is electrically coupled to the first region 140 in the absorption layer 10.

In some embodiments, the growth substrate 180 provides a surface for epitaxially growing the absorption layer 10. The growth substrate 180 has a thickness thick enough for supporting the layers or the structures grown thereon. The growth substrate 180 is single crystal and includes a semiconductor material, for example, a Group IV semiconductor material. In one embodiment, the growth substrate 180 includes Si.

In some embodiments, the bonding step is carried out by any suitable techniques such as thermal bonding or hybrid bonding including metal-metal bonding and oxide-oxide bonding.

Figure 3F:
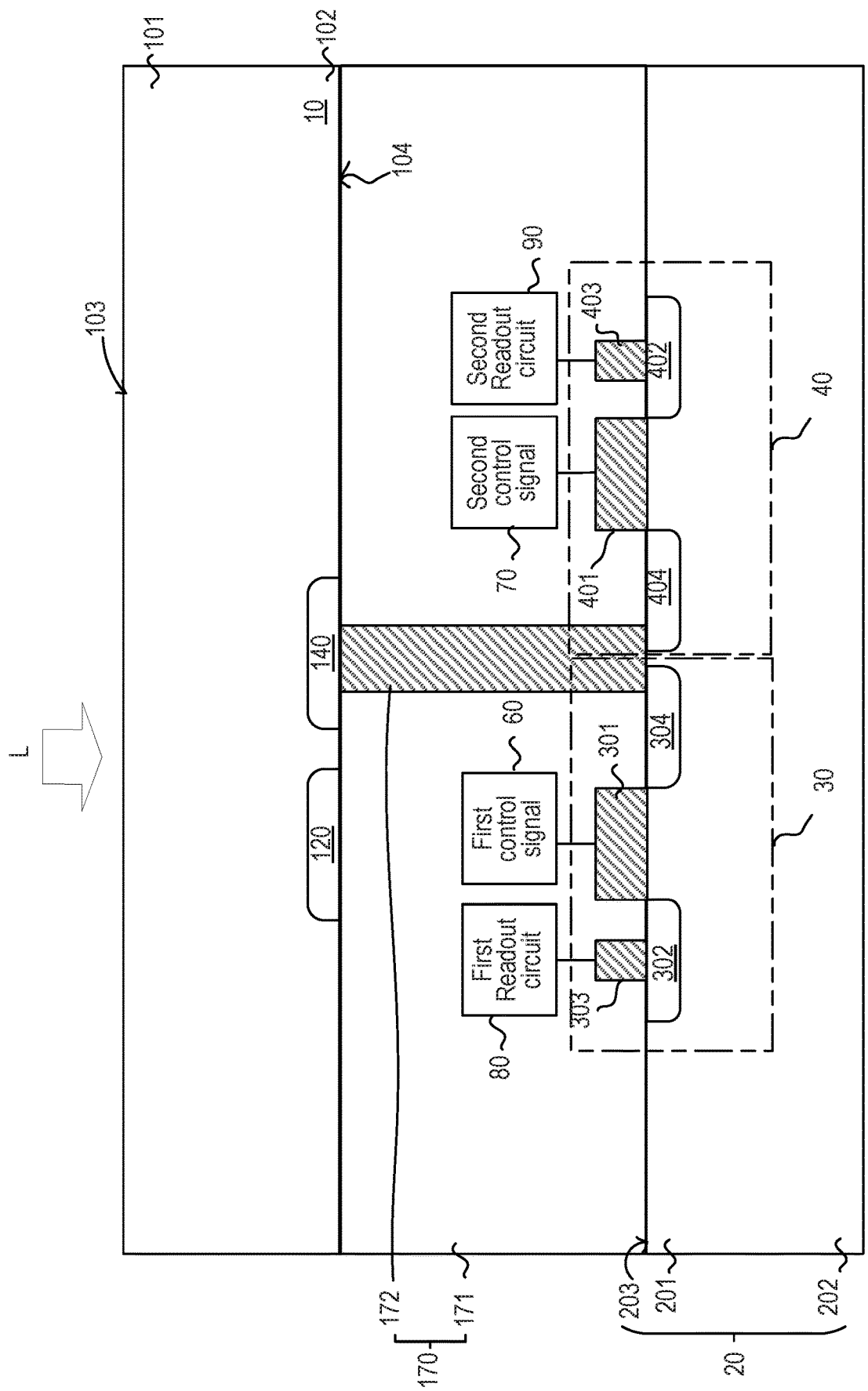
FIG. 3F illustrates a cross-sectional view of a photo-detecting apparatus, according to some embodiments.

FIG. 3F illustrates a cross-sectional view of a photo-detecting apparatus, according to some embodiments. The photo-detecting apparatus in FIG. 3F is similar to the photo-detecting apparatus in FIG. 3A. The difference is described below. In some embodiments, the first zone 120 is at the bottom side 102 of the absorption layer 10. The first region 140, the absorption layer 10 and the first zone 120 are referred as a lateral photodiode. The lateral photodiode is a homojunction diode. The operating method of the photo-detecting apparatus in FIG. 3F is similar to the operating method of the photo-detecting apparatus disclosed in FIG. 3A. The method for manufacturing the photo-detecting apparatus in FIG. 3F is similar to the method for manufacturing the photo-detecting apparatus in FIG. 3A.

Figure 3G:
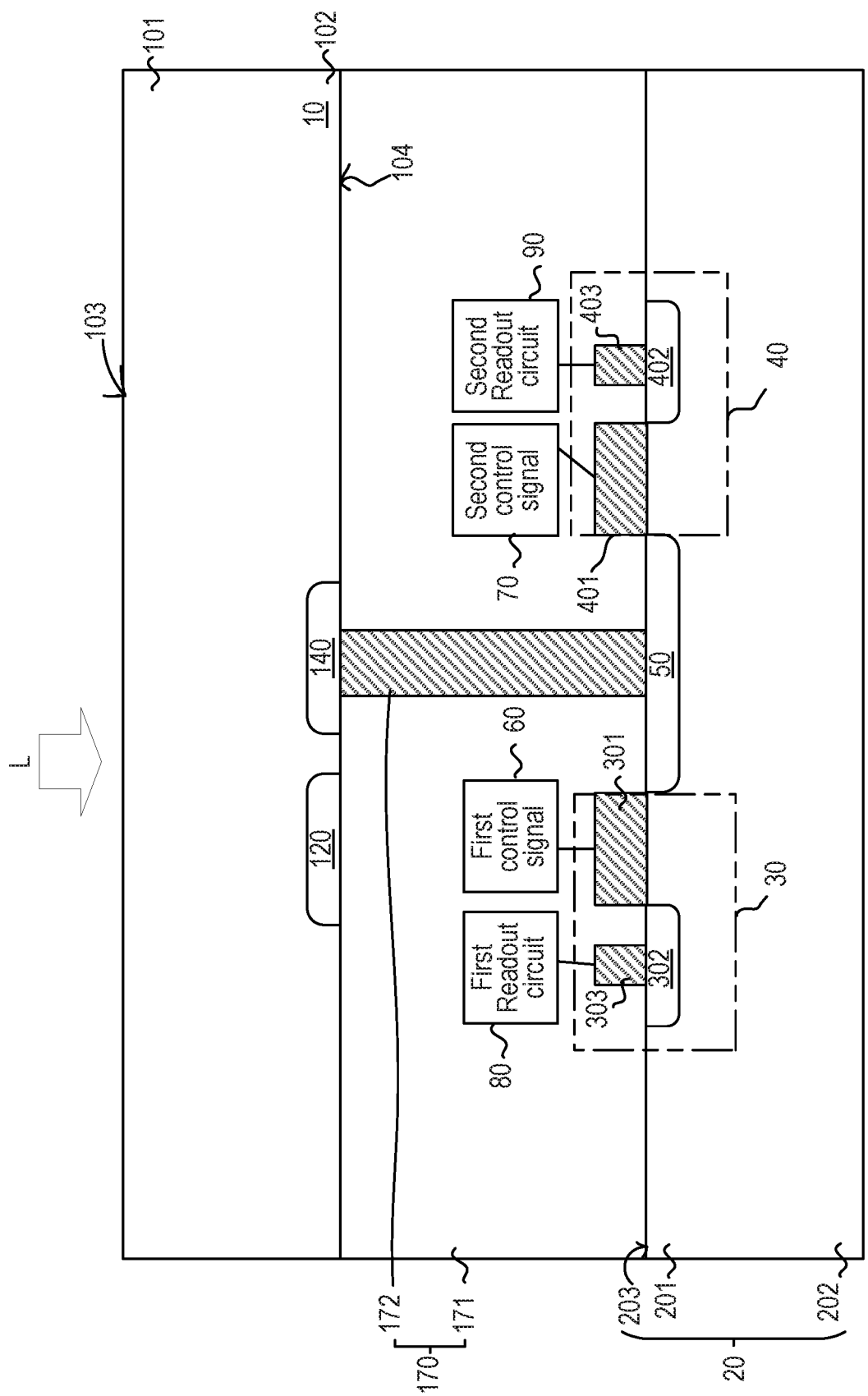
FIG. 3G illustrates a cross-sectional view of a photo-detecting apparatus, according to some embodiments.

FIG. 3G illustrates a cross-sectional view of a photo-detecting apparatus, according to some embodiments. The photo-detecting apparatus in FIG. 3G is similar to the photo-detecting apparatus in FIG. 3F. The differences between the embodiments of FIGS. 3F and 3G are described below. In some embodiments, instead of the first carrier-input region 304 being physically separated from the second carrier-input region 404 first carrier-input region, the carrier guiding unit (not labeled) includes a common region 50 between the first gate terminal 301 and the second gate terminal 401. The common region 50 is similar to the common region 50 described in FIG. 1A. The first conductive structure 172 connects the first region 140 and the common region 50. In some embodiments, the first switch 30 and the common region 50 is referred as a first MOSFET. The second switch 40 and the common region 50 is referred as a second MOSFET. In some embodiments, the first MOSFET and the second MOSFET share the common region 50. In some embodiments, the first switch 30 and the common region 50 is referred as a first MESFET. The second switch 40 and the common region 50 is referred as a second MESFET. In some embodiments, the first MESFET and the second MESFET share the common region 50.

Figure 3H:
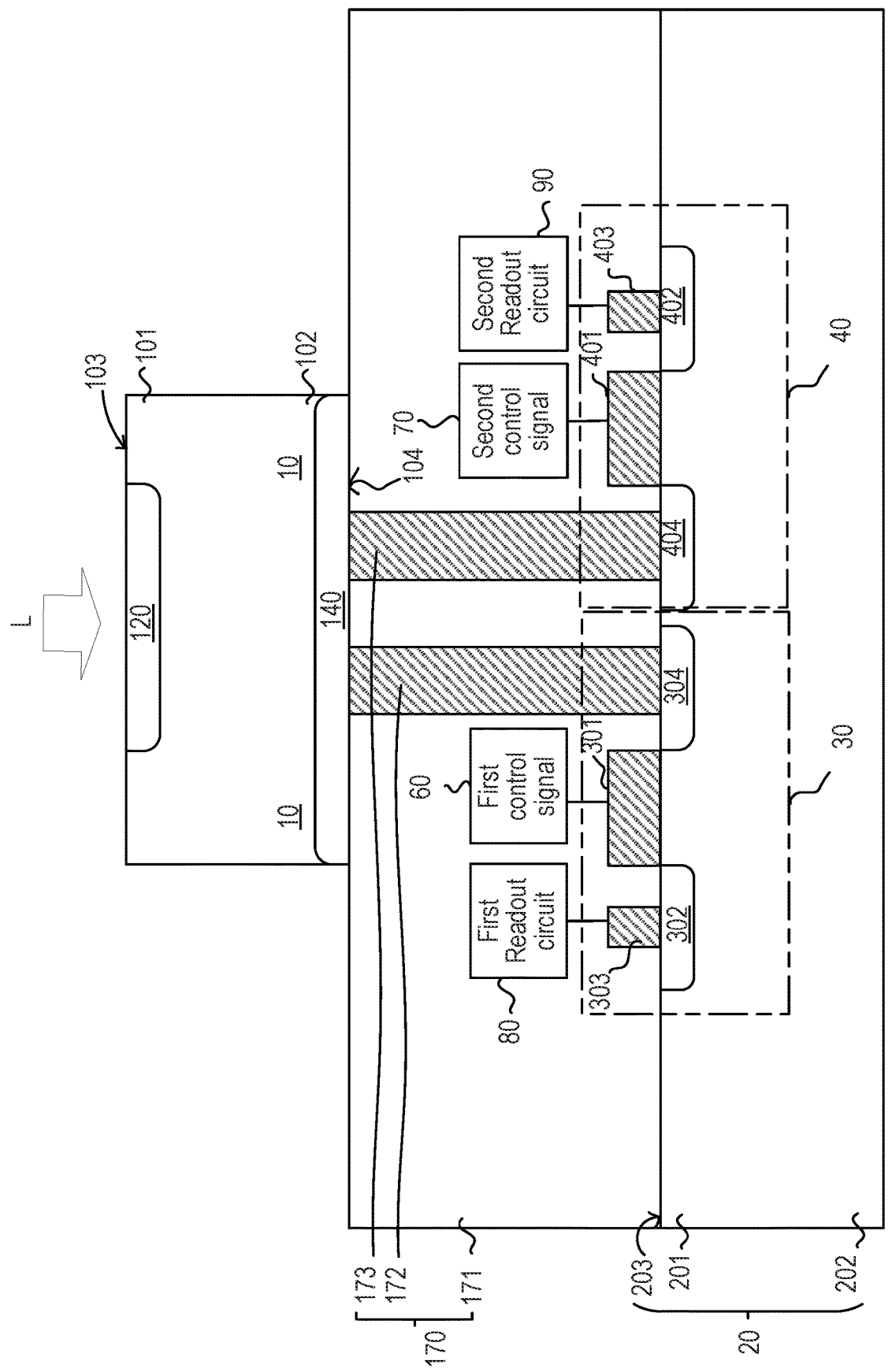
FIG. 3H illustrates a cross-sectional view of a photo-detecting apparatus, according to some embodiments.

FIG. 3H illustrates a cross-sectional view of a photo-detecting apparatus, according to some embodiments. The photo-detecting apparatus in FIG. 3H is similar to the photo-detecting apparatus in FIG. 3A. The difference is described below. In some embodiments, the bonding structure 170 further includes a second conductive structure 173 penetrating through the bonding layer 171. The first conductive structure 172 connects the first carrier-input region 304 and the first region 140 for establishing electrical connections between the photodiode and the first switch 30. The second conductive structure 173 connects the second carrier-input region 404 and the first region 140 for establishing electrical connections between the photodiode and the second switch 40. In some embodiments, the first conductive structure 172 includes multiple conductive trenches (not shown) and internal contacts (not shown), wherein one of the conductive trenches connects the first region 140, and one of the conductive trenches connects the second carrier-input region 404. In some embodiments, from a cross-sectional view of a photo-detecting apparatus, the absorption layer 10 includes a width less than a width of the substrate 20. During the operation of the photo-detecting apparatus, the carriers are moving toward the first switch 30 through the first conductive structure 172. The carriers are moving toward the second switch 40 through the second conductive structure 173.

The method for manufacturing the photo-detecting apparatus in FIG. 3H is similar to the method for manufacturing the photo-detecting apparatus disclosed in FIG. 3A. The operating method of the photo-detecting apparatus in FIG. 3H is similar to the operating method of the photo-detecting apparatus disclosed in FIG. 3A.

Figure 3I:
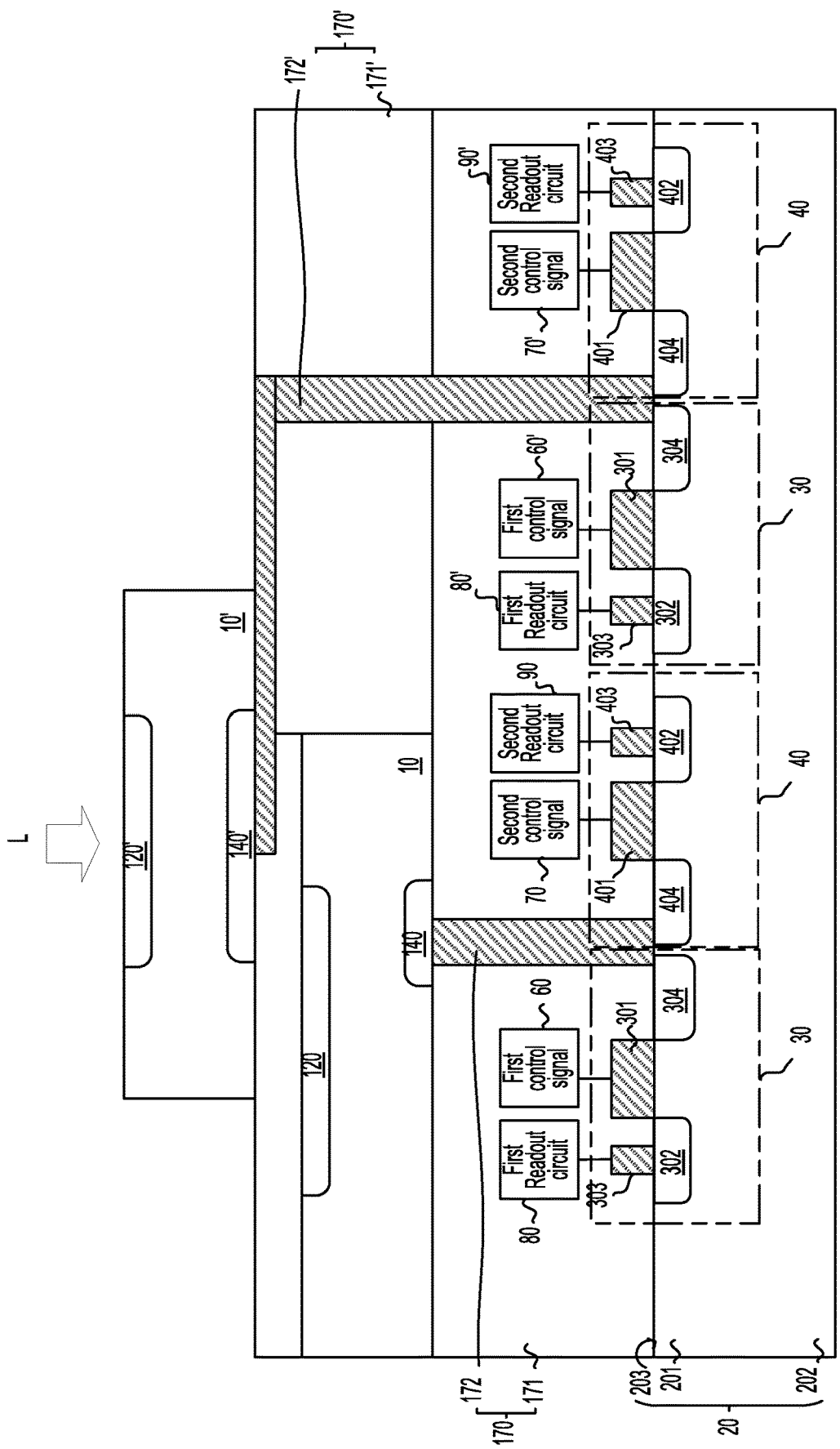
FIG. 3I illustrates a cross-sectional view of a photo-detecting apparatus, according to some embodiments.

FIG. 3I illustrates a cross-sectional view of a photo-detecting apparatus according to some embodiments. The photo-detecting apparatus in FIG. 3I is similar to the photo-detecting apparatus in FIG. 3A. The difference is described below. The photo-detecting apparatus further includes a second absorption layer 10', a second carrier guiding unit (not labeled) and a second bonding structure 170'. In some embodiments, the second absorption layer 10' is overlapped with the absorption layer 10 along a light incident direction. The second carrier guiding unit (not labeled) is integrated with the substrate 20 and has the same structure as the carrier guiding unit (not labeled) as described in FIG. 1A or FIG. 2A.

In some embodiments, the photo-detecting apparatus further includes another first readout circuit 80', a second readout circuit 90', a first control signal 60' and a second control signal 70' electrically coupled to the second carrier guiding unit (not labeled) and integrated with the substrate 20. In other words, the carrier guiding unit (not labeled), the first readout circuit 80 electrically coupled to the carrier guiding unit (not labeled), the second readout circuit 90 electrically coupled to the carrier guiding unit (not labeled), the first control signal 60 electrically coupled to the carrier guiding unit (not labeled), the second control signal 70 electrically coupled to the carrier guiding unit (not labeled), the second carrier guiding unit (not labeled), the first readout circuit 80' electrically coupled to the second carrier guiding unit (not labeled), the second readout circuit 90' electrically coupled to the second carrier guiding unit (not labeled), the first control signal 60' electrically coupled to the second carrier guiding unit (not labeled), and the second control signal 70' electrically coupled to the second carrier guiding unit (not labeled) are all integrated with the same substrate 20.

The second bonding structure 170' is for connecting the second absorption layer 10' and the absorption layer 10, and also is for connecting the second absorption layer 10' and the substrate 20. In some embodiments, the second bonding structure 170' is for establishing electrical connections between the second carrier guiding unit (not labeled) and the and the second absorption layer 10'. In some embodiments, the second bonding structure 170' is for connecting the second absorption layer 10' and the second carrier guiding unit (not labeled). The second absorption layer 10 is configured to absorb photons and to generate photo-carriers from the absorbed photons. In some embodiments, the second absorption layer 10' is configured to absorb photons having a peak wavelength different from the peak wavelength of the photons absorbed by the absorption layer 10. In some embodiments, the second absorption layer 10' is configured to absorb photons having a peak wavelength in a visible range between 350 nm and 750 nm. In some embodiments, the second absorption layer 10' is configured to absorb photons having a peak wavelength not less than 800 nm, and not more than 2000 nm. In some embodiments, the second absorption layer 10' includes a material different from the material of the absorption layer 10, In some embodiments, the second absorption layer 10' includes GeSi, Si or germanium. In some embodiments, the second absorption layer 10' is composed of Si, and the absorption layer 10 is composed of Ge. In some embodiments, the second absorption layer 10' includes a thickness depending on the wavelength of photons to be detected and the material of the second absorption layer 10'. In some embodiments, when the second absorption layer 10' includes Si and is designed to absorb photons having a wavelength in a visible range, the second absorption layer 10' has a thickness between 0.5 um and 10 um. In some embodiments, the photo-detecting apparatus includes another first region 140' and another first zone 120' in the second absorption layer 10'. Similarly, the first zone 120' in the second absorption layer 10' is of a conductivity type different from the first conductivity type of the first region 140' in the second absorption layer 10'. The first zone 120' in the second absorption layer 10', the first region 140' in the second absorption layer 10' are referred as a photodiode. In some embodiments, the first region 140' in the second absorption layer 10' can be arranged as a vertical photodiode. In some embodiments, the first region 140' in the second absorption layer 10' can be arranged as a lateral photodiode. In some embodiments, the second bonding structure 170' is for establishing electrical connections between the second carrier guiding unit (not labeled) and the photodiode. In some embodiments, the second bonding structure 170' is for establishing electrical connections between the second carrier guiding unit (not labeled) and the first region 140'. In some embodiments, the second bonding structure 170' is for connecting the first region 140' and the second carrier guiding unit (not labeled).

The second bonding structure 170' includes a second bonding layer 171' and a first conductive structure 172' penetrating through the second bonding layer 171' for establishing electrical connections between the second carrier guiding unit (not labeled) and the photodiode in the absorption layer 10. In some embodiments, the first conductive structure 172' connects the first region 140' in the second absorption layer 10 and the first carrier-input region 304 of the second carrier guiding unit (not labeled) and also connects the first region 140' in the second absorption layer 10 and the second carrier-input region 404 of the second carrier guiding unit (not labeled). In some embodiments, the first conductive structure 172' includes multiple conductive trenches (not shown) and internal contacts (not shown), wherein one of the conductive trenches connects the first region 140' in the second absorption layer 10 and another one of the conductive trenches connects the second carrier-input region 404 of the second carrier guiding unit (not labeled). In some embodiments, the second bonding layer 171 includes multiple sub-insulating layers stacked together. In some embodiments, the second bonding structure 170 further includes multiple conductive trenches (not shown) and internal contacts (not shown). Each of the multiple conductive trenches vertically penetrates at least one of the sub-insulating layers of the second bonding layer 171 for establishing electrical connections within different sub-insulating layers of the second bonding layer 171. The second bonding layer 171 includes insulating material including aluminum oxide ($AlO_x$), silicon oxide ($SiO_x$), silicon oxynitride ($SiO_xN_y$), silicon nitride ($Si_xN_y$), epoxy, polyimide, perfluorocyclobutane, benzocyclobutene (BCB) or silicone. In some embodiments, a single photo-detecting apparatus is configured to absorb photons at different wavelengths.

Figure 3J:
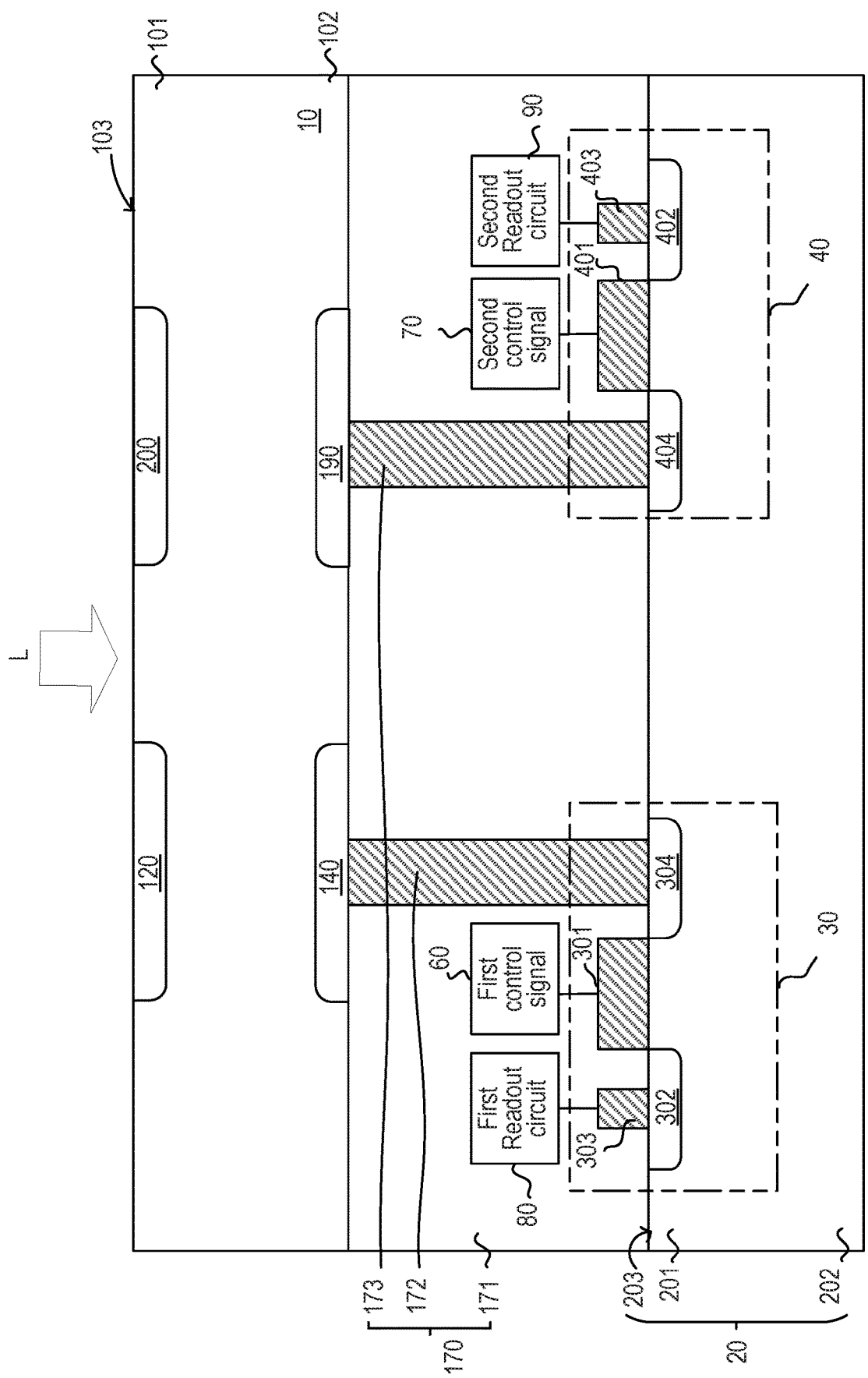
FIG. 3J illustrates a cross-sectional view of a photo-detecting apparatus, according to some embodiments.

FIG. 3J illustrates a cross-sectional view of a photo-detecting apparatus, according to some embodiments. The photo-detecting apparatus in FIG. 3J is similar to the photo-detecting apparatus in FIG. 3A. The difference is described below. In some embodiments, the photo-detecting apparatus further includes a second conductive structure 173 as described in FIG. 3H. In some embodiments, the photo-detecting apparatus further includes a second region 190 and a second zone 200. The second zone 200 is physically separated from the first zone 120. The second region 190 is physically separated from the first region 140. The second region 190 and the first region 140 are at the bottom side 102 of the absorption layer 10. The second zone 200 and the first zone 120 are at the top side 101 of the absorption layer 10. The second region 190 is of a second conductivity type the same as the first conductivity type of the first region 140. The second zone 200 is of a conductivity type the same as the conductivity type of the first zone 120. The first region 140, the absorption layer 10 and the first zone 120 are referred as a first vertical photodiode. In some embodiments, the second region 190, the absorption layer 10 and the second zone 200 are referred as a second vertical photodiode. The first conductive structure 172 connects the first carrier-input region 304 and first region 140 for establishing electrical connections between the first vertical photodiode and the first switch 30. The second conductive structure 173 connects the second carrier-input region 404 and second region 190 for establishing electrical connections between the second vertical photodiode and the second switch 40. In some embodiments, the photo-detecting apparatus further includes a third terminal (not shown) electrically coupled to the second zone 200 to evacuate the photo-carriers with opposite type not collected by the second carrier-output region 402 during the operation of the photo-detecting apparatus. In some embodiments, the second terminal (not shown) as described in FIG. 1 is electrically coupled to the first zone 120 for evacuating the photo-carriers with opposite type not collected by the first carrier-output region 302 during the operation of the photo-detecting apparatus. The third terminal includes metal including, but is not limited to, copper, aluminum, or tungsten. In some embodiments, the photo-detecting apparatus further includes a third external source (not shown) electrically coupled to the second zone 200. In some embodiments, the third external source is electrically coupled to the third terminal for establishing electrical connections between the third external source and the second zone 200. In some embodiments, when the photo-detecting apparatus is configured to collects electrons, the third external source includes an electrical ground, or provides a preset voltage less than the voltage at the second carrier-input region 404 to evacuate holes. In some embodiments, the second zone 200 is not coupled to any external control and thus is floated.

The operating method of the photo-detecting apparatus in FIG. 3J is similar to the operating method of the photo-detecting apparatus disclosed in FIG. 3A. The difference is described below. In some embodiments, during the operation of the photo-detecting apparatus, two different voltages are applied to the first gate terminal 301 and the second gate terminal 401 to generate different depletion regions between the second zone 200 and the second region 190 and between the first region 140 and the first zone 120. When the first switch 30 is switched on, a larger depletion is formed between the first region 140 and the first zone 120, and the first carrier-output region 302 collects a major portion of the holes or electrons of the photo-carriers through the first conductive structure 172. Similarly, When the second switch 40 is switched on, a larger depletion is formed between the second zone 200 and the second region 190, and the second carrier-output region 402 collects a major portion of the holes or electrons of the photo-carriers through the second conductive structure 173. The photo-detecting apparatus is with higher speed.

Figure 3K:
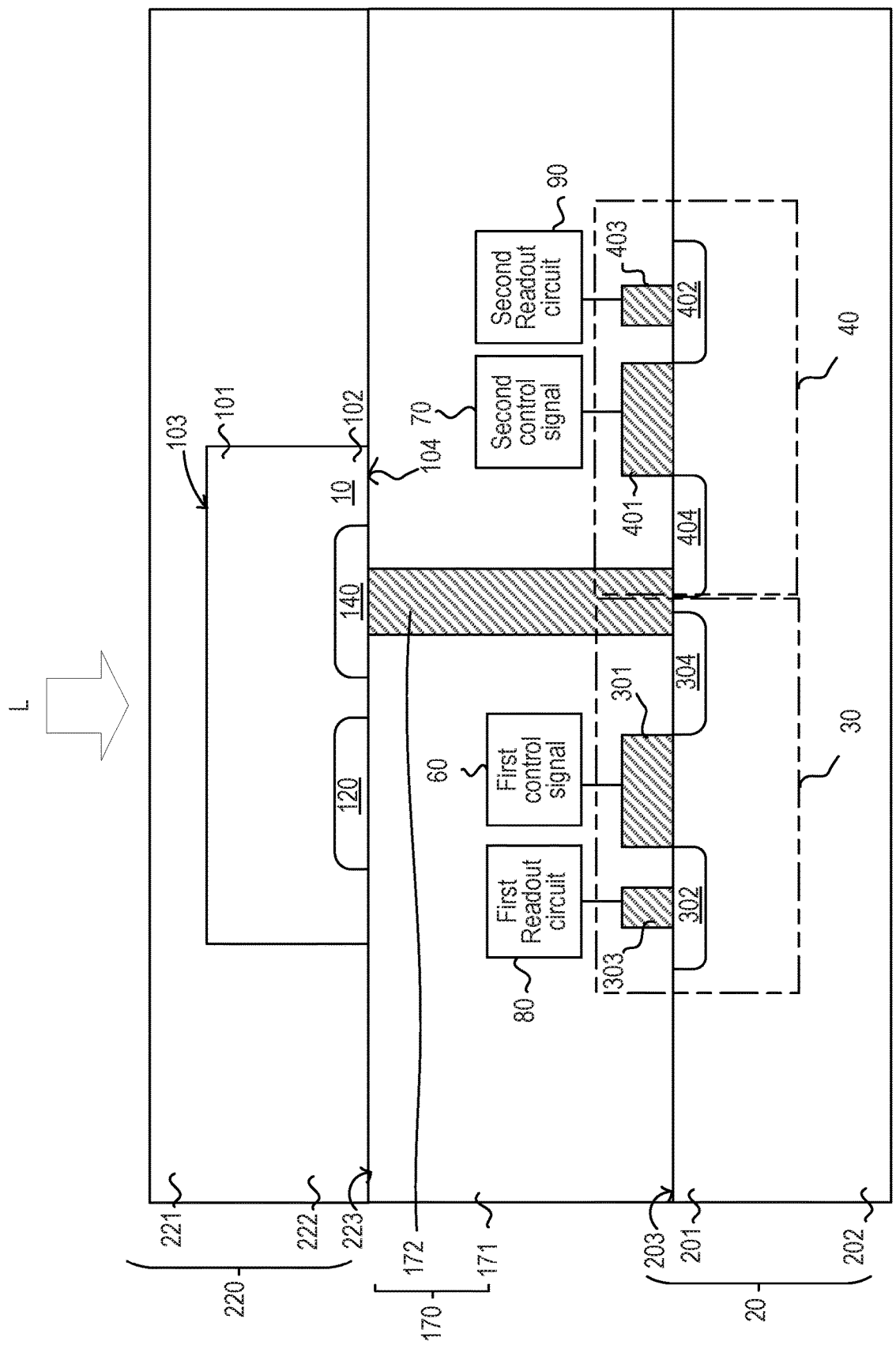
FIG. 3K illustrates a cross-sectional view of a photo-detecting apparatus, according to some embodiments.

FIG. 3K illustrates a cross-sectional view of a photo-detecting apparatus, according to some embodiments. The photo-detecting apparatus in FIG. 3K is similar to the photo-detecting apparatus in FIG. 3F. The difference is described below. In some embodiments, the photo-detecting apparatus further includes a supporting member 220. The supporting member 220 supports the absorption layer 10. In some embodiments, absorption layer 10 is embedded in the supporting member 220. In some embodiments, the absorption layer 10 is between a part of the supporting member 220 and the substrate 20. In some embodiments, the supporting member 220 includes an upper side 221 and a lower side 222 opposite to the upper side 221. The lower side 222 includes a lower surface 223. In some embodiments, the lower surface 223 of the supporting member 220 is flush with the bottom surface 104 of the absorption layer 10. In some embodiment, the supporting member includes a material different from the material of the absorption layer 10. The supporting member 220 includes any suitable material that the absorption layer 10 can be fabricated on. In some embodiment, the supporting member 220 includes a material the same as the material of the substrate 20. In some embodiments, the supporting member 220 includes silicon. In some embodiments, the photo-detecting apparatus further includes a second terminal (not shown) as described in FIG. 1 connected to the first zone 120 to receive a voltage.

The operating method of the photo-detecting apparatus in FIG. 3K is to the method for manufacturing the photo-detecting apparatus in FIG. 3F. The method for manufacturing the photo-detecting apparatus in FIG. 3K is similar to the method for manufacturing the photo-detecting apparatus disclosed in FIG. 3A. The difference is described below. The growth substrate 20 is the supporting member 220 and is remained after the bonding step.

Figure 3L:
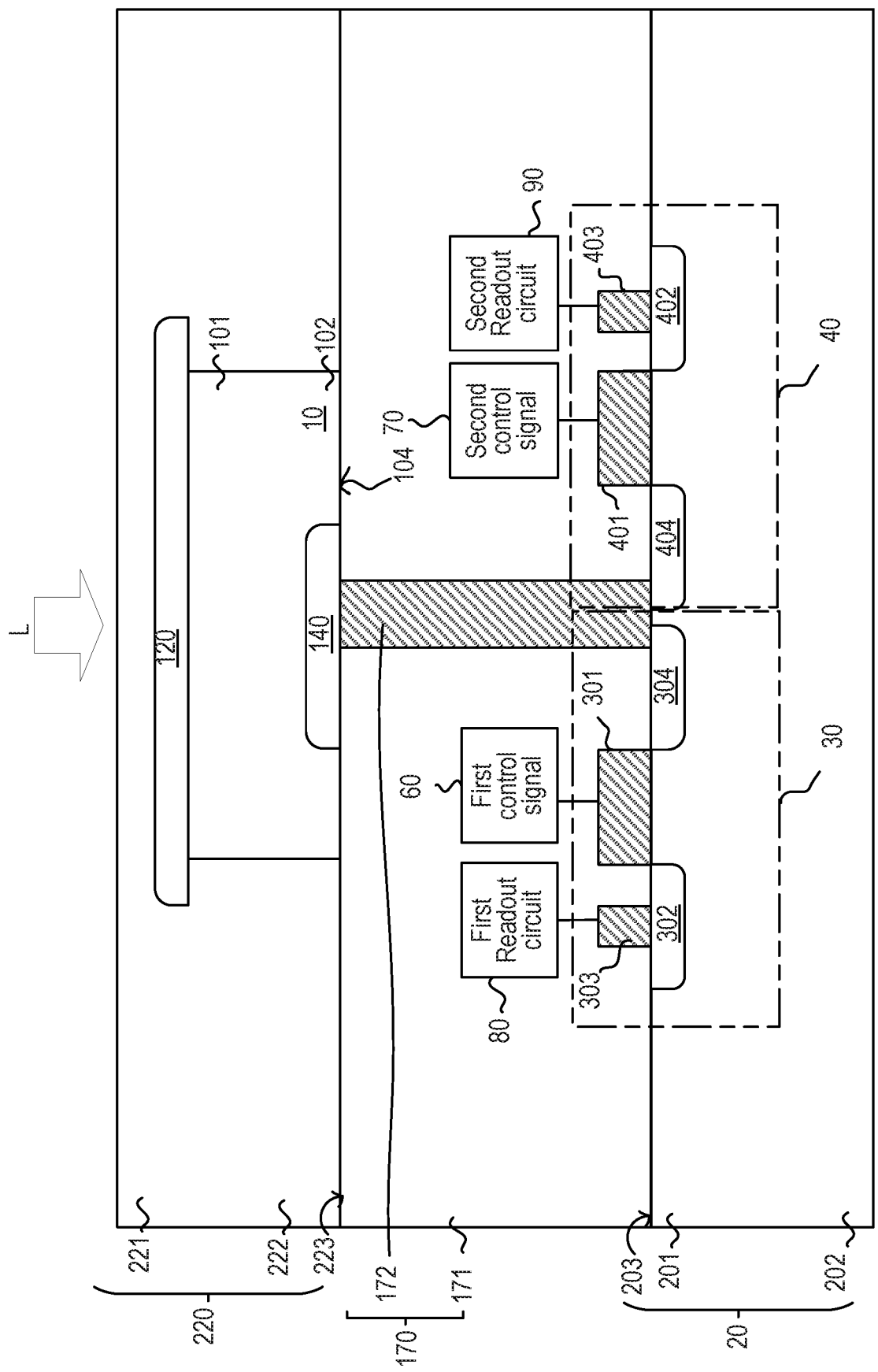
FIG. 3L illustrates a cross-sectional view of a photo-detecting apparatus, according to some embodiments.

FIG. 3L illustrates a cross-sectional view of a photo-detecting apparatus, according to some embodiments. The photo-detecting apparatus in FIG. 3L is similar to the photo-detecting apparatus in FIG. 3K. The difference is described below. In some embodiments, the first zone 120 is in the supporting member 220 and connected to the absorption layer 10. In some embodiments, the material of the first zone 120 is different from the material of the first region 140. In some embodiments, the first zone 120 includes silicon, the first region 140 includes germanium. In some embodiments, the first region 140, the absorption layer 10 and the first zone 120 are referred as a vertical photodiode. In some embodiments, the vertical photodiode is a heterojunction diode.

The method for manufacturing the photo-detecting apparatus in FIG. 3L is similar to the method for manufacturing the photo-detecting apparatus disclosed in FIG. 3K.

Figure 3M:
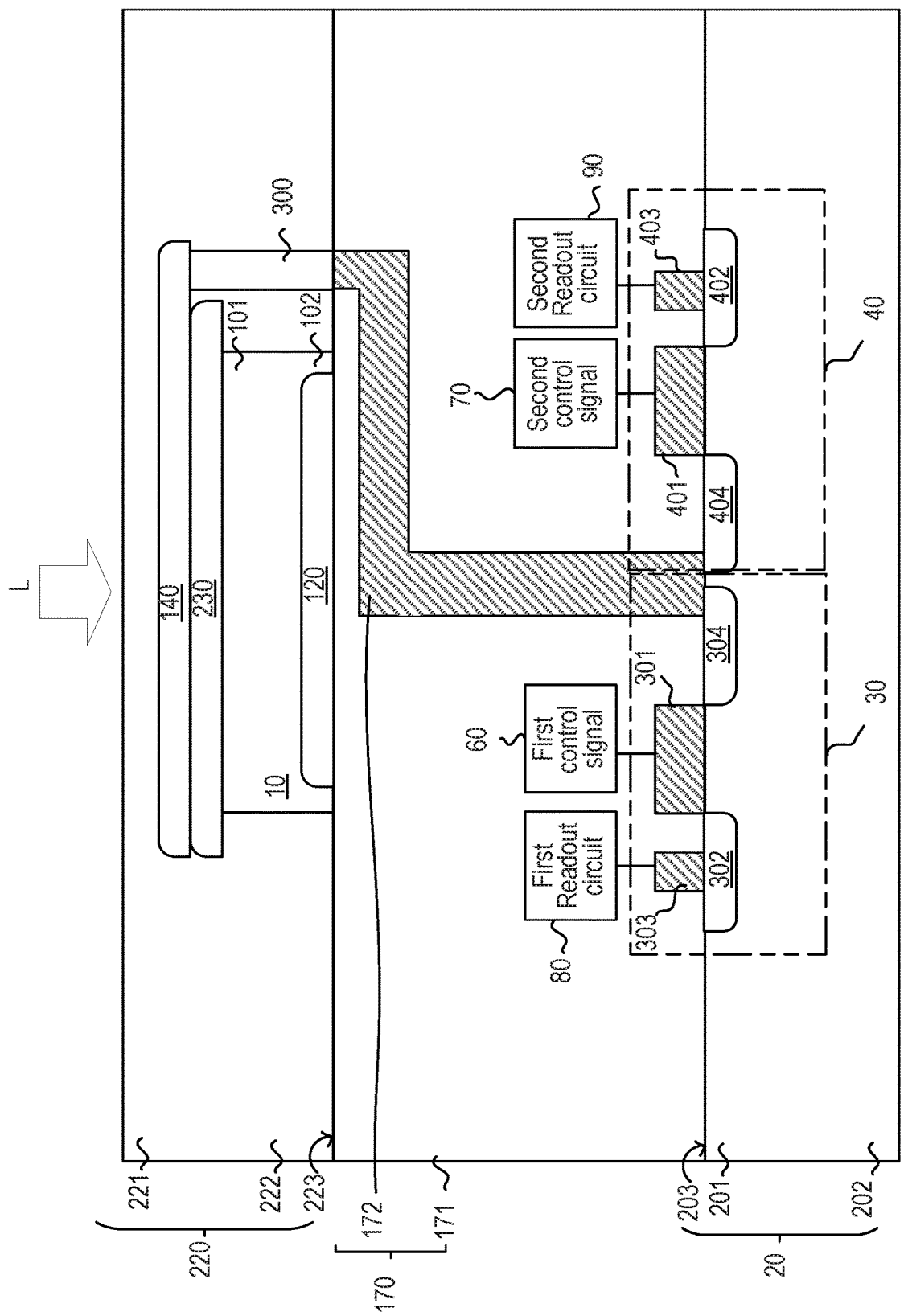
FIG. 3M illustrates a cross-sectional view of a photo-detecting apparatus, according to some embodiments.

FIG. 3M illustrates a cross-sectional view of a photo-detecting apparatus, according to some embodiments. The photo-detecting apparatus in FIG. 3M is similar to the photo-detecting apparatus in FIG. 3L. The difference is described below. The first region 140 is in the supporting member 220. The first zone 120 is in the absorption layer 10. The photo-detecting apparatus further includes a multiplication region 230 between the first region 140 and the first zone 120. In some embodiments, the multiplication region 230 is in the supporting member 220. The multiplication region 230 is of a conductivity type different from the first conductivity type of the first region 140, and is the same the conductivity type of the first zone 120. In some embodiments, the multiplication region 230 includes a dopant, and the dopant includes a peak concentration between $1 \times 10^{14}$ cm$^{-3}$ and $1 \times 10^{18}$ cm$^{-3}$. In some embodiments, the peak concentration of the dopant of the first zone 120 is higher than peak concentration of the dopant of the multiplication region 230. In some embodiments, the absorption layer 10 is intrinsic. In some embodiments, the first zone 120, the multiplication region 230, the absorption layer 10 and the first region 140 are referred as a vertical avalanche photo-diode. In some embodiments, the vertical avalanche photo-diode is a heterojunction diode. In some embodiments, the photo-detecting apparatus further includes a conductive region 300 connecting the first region 140 and the first conductive structure 172 for establishing electrical connections between the first region 140 and the first conductive structure 172. In some embodiments, the conductive region 300 is in the supporting member 220. In some embodiments, the conductive region 300 includes metal. In some embodiments, the conductive region 300 includes a semiconductor material of a conductivity type the same as the first conductivity type of the first region 140. For example, when the first conductivity type of the first region 140 is n-type, the conductive region 300 includes an n-type semiconductor material. In these embodiments, when the photodiode is under a high reverse bias voltage, such as between 10 V and 30 V, the photodiode has an internal gain. In some embodiments, the material of the first region 140 and the material of the multiplication region 230 include Si, the material of the absorption layer 10 and the material of the first zone 120 include Ge.

The operating method of the photo-detecting apparatus in FIG. 3M is similar to the operating method of the photo-detecting apparatus disclosed in FIG. 3K. The difference is that the photo-detecting apparatus is capable of operated at a high reverse bias voltage, such as between 10 V and 30 V, and thus the photodiode has an internal gain. Therefore, more carriers are collected by the first carrier-output region 302 or the second carrier-output region 402.

Figure 3N:
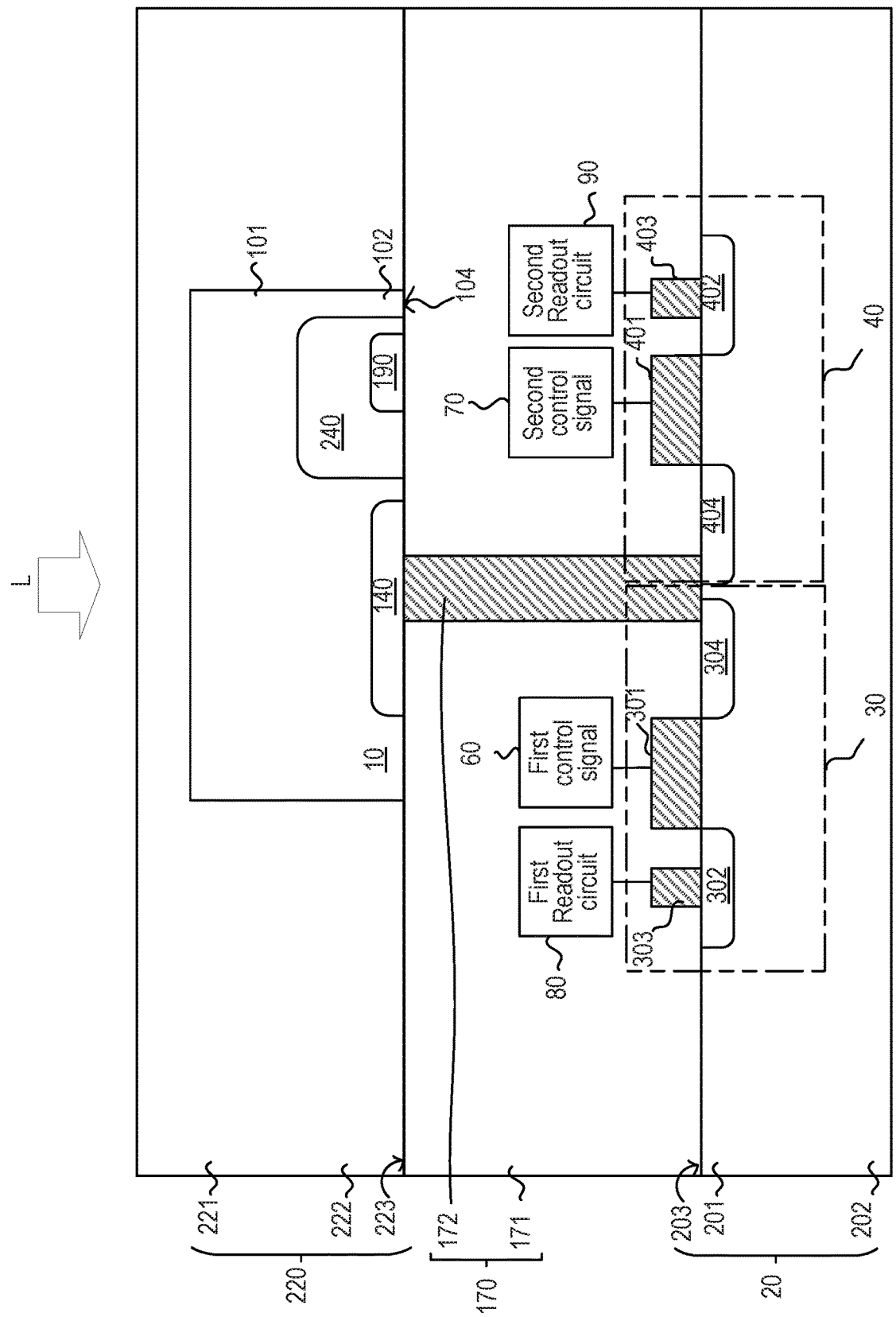
FIG. 3N illustrates a cross-sectional view of a photo-detecting apparatus, according to some embodiments.

FIG. 3N illustrates a cross-sectional view of a photo-detecting apparatus, according to some embodiments. The photo-detecting apparatus in FIG. 3N is similar to the photo-detecting apparatus in FIG. 3K. The difference is described below. In some embodiments, the photo detecting apparatus includes a second region 190 and a third region 240. The second region 190 is in the absorption layer 10 and is physically separated from the first region 140. In some embodiments, the second region 190 and the third region 240 are at the bottom side 102 of the absorption layer 10. The second region 190 is of a second conductivity type the same as the first conductivity type of the first region 140. In some embodiments, the second region 190 includes a dopant, and the dopant includes a peak concentration between $1 \times 10^{18}$ cm$^{-3}$ and $5 \times 10^{20}$ cm$^{-3}$. In some embodiments, the peak concentration of the dopant of the second region 190 is higher than the peak concentration of the dopant of the first region 140. The third region 240 is in the absorption layer 10. The third region 240 is physically separated from the first region 140 and surrounds the second region 190. The third region 240 is of a third conductivity type different from the first conductivity type of the first region 140 and different from the second conductivity type of the second region 190. In some embodiments, the third region 240 includes a dopant, the peak concentration of the dopant of the third region 240 is lower than the peak concentration of the dopant of the first region 140 and lower than the peak concentration of the dopant of the second region 190. In some embodiments, the dopant of the third region 240 includes a peak concentration between $1 \times 10^{15}$ cm$^{-3}$ and $1 \times 10^{18}$ cm$^{-3}$. In some embodiments, the material of the first region 140, the material of the second region 190 and the material of the third region 240 are the same. In some embodiment, the absorption layer 10 is intrinsic. In some embodiment, the first region 140, the second region 190 and the third region 240 are referred as a phototransistor, wherein the first region 140 is refereed as a collector, the second region 190 is refereed as an emitter, and the third region 240 is referred as a base. In some embodiments, the phototransistor is a homojunction phototransistor.

In some embodiments, the third region 240 is not coupled to any external control and thus is floated.

The operating method of the photo-detecting apparatus in FIG. 3N is similar to the operating method of the photo-detecting apparatus disclosed in FIG. 3K. The difference is described below. When the photo-detecting apparatus is operated, some of the photo carriers are accumulated in the third region 240, which partially screens the depletion region in-between the second region 190 and the third region 240. A forward-biased PN junction between the second region 190 and the third region 240 is resulted, and thus force the second region 190 to introduce more carriers and extracted by the first region 140. Therefore, the photo-detecting apparatus has a β gain. The photo-detecting apparatus is with improved sensitivity and signal-to-noise-ratio.

Figure 3O:
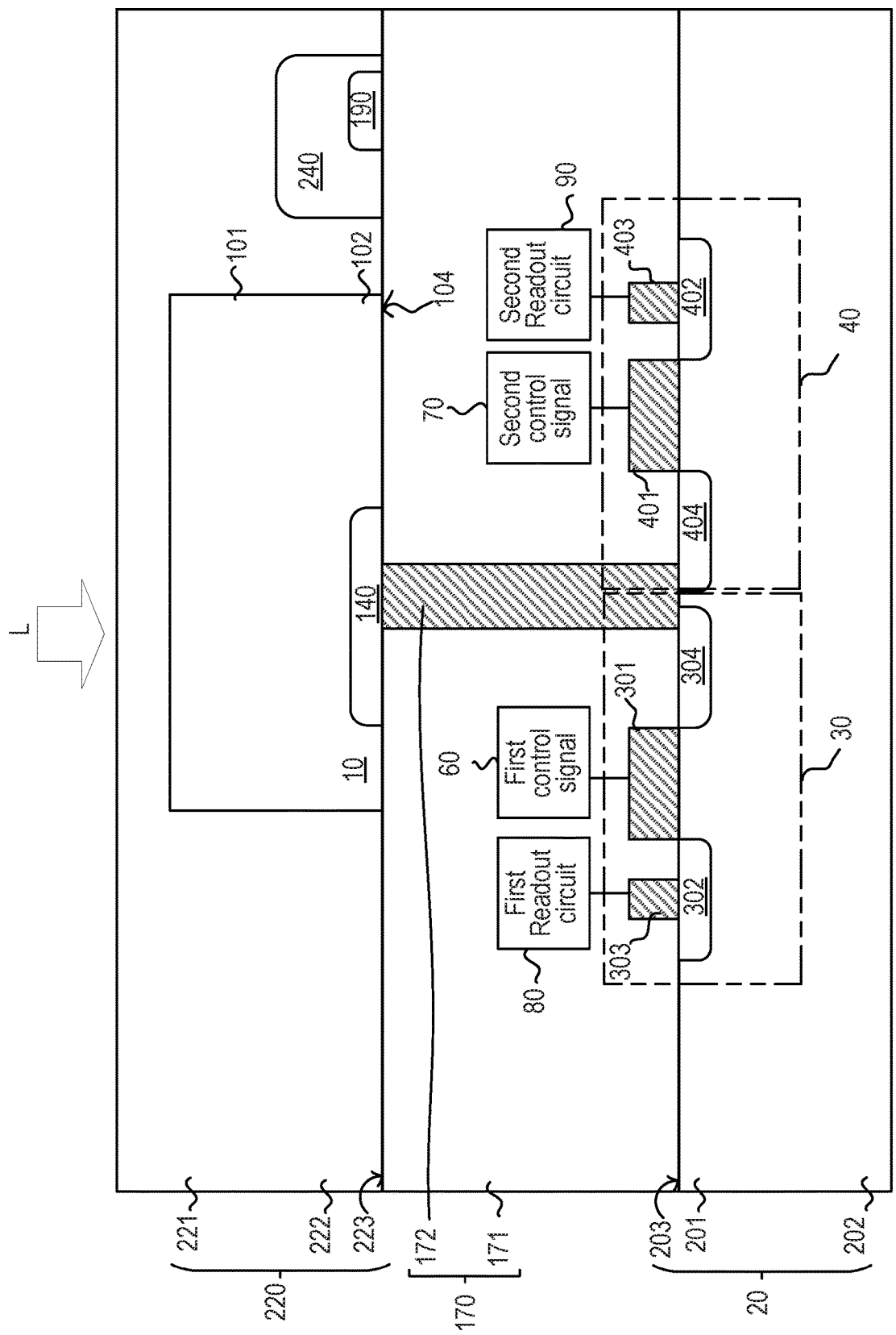
FIG. 3O illustrates a cross-sectional view of a photo-detecting apparatus, according to some embodiments.

FIG. 3O illustrates a cross-sectional view of a photo-detecting apparatus, according to some embodiments. The photo-detecting apparatus in FIG. 3O is similar to the photo-detecting apparatus in FIG. 3N. The difference is described below. In some embodiments, the second region 190 and the third region 240 are in the supporting member 220 and outside of the absorption layer 10. In some embodiments, the second region 190 and the third region 240 are at the lower side 222 of the supporting member 220. In some embodiments, the material of the first region 140 is different from the material of the second region 190 and the material of the third region 240. For example, the material of the first region 140 includes Ge, and the material of the second region 190 and the material of the third region 240 include Si. In some embodiment, the first region 140, the second region 190 and the third region 240 are referred as a phototransistor, wherein the first region 140 is refereed as a collector, the second region 190 is refereed as an emitter, and the third region 240 is referred as a base. In some embodiments, the phototransistor is a heterojunction phototransistor. In some embodiments, since the second region 190 is in the supporting member 220, the contact resistance between the second region 190 and the second terminal (not shown) is lower. Therefore, the photo-detecting apparatus is with lower RC delay.

The operating method of the photo-detecting apparatus in FIG. 3O is similar to the operating method of the photo-detecting apparatus disclosed in FIG. 3N.

Figure 3P:
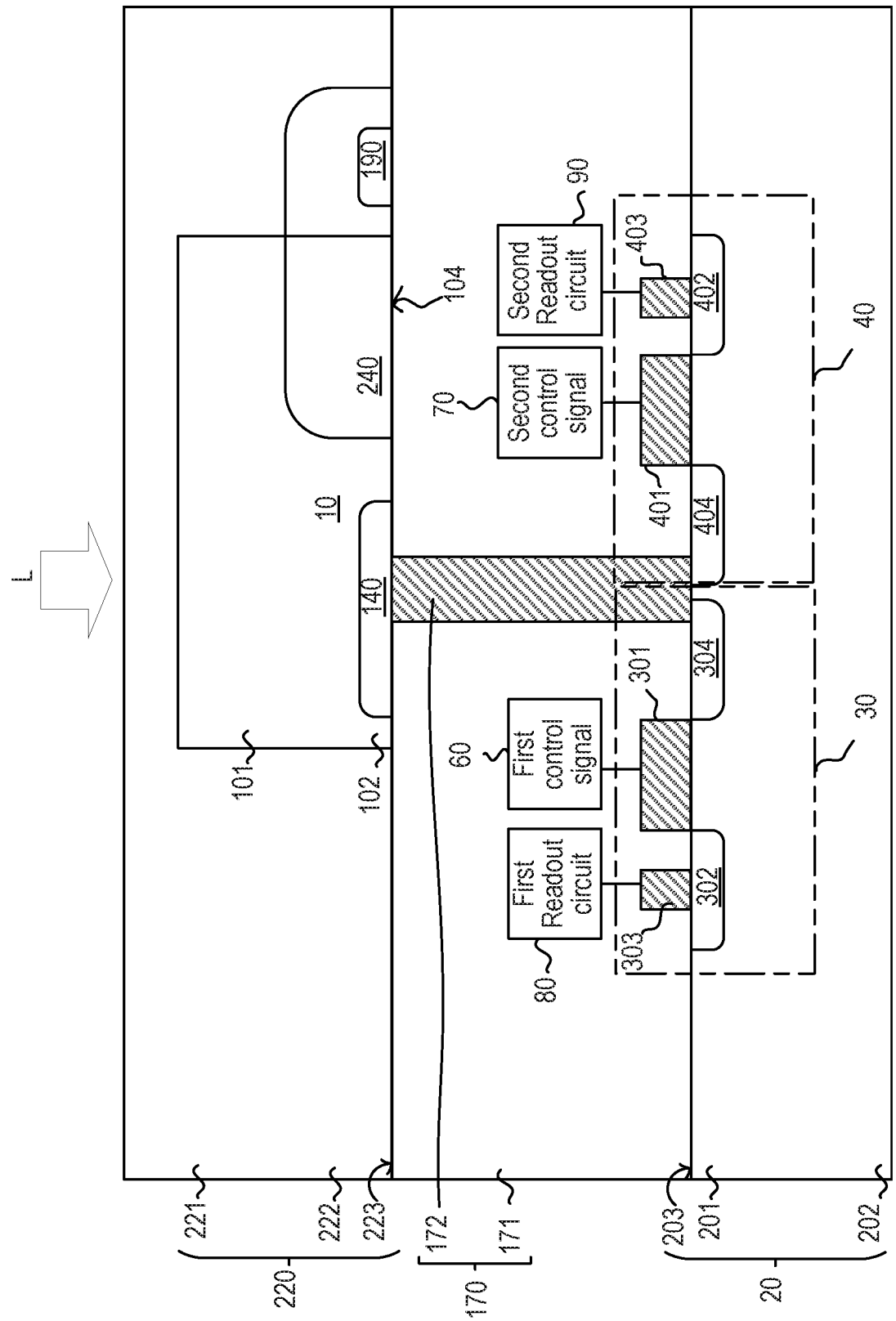
FIG. 3P illustrates a cross-sectional view of a photo-detecting apparatus, according to some embodiments.

FIG. 3P illustrates a cross-sectional view of a photo-detecting apparatus, according to some embodiments. The photo-detecting apparatus in FIG. 3P is similar to the photo-detecting apparatus in FIG. 3O. The difference is described below. In some embodiments, the third region 240 is in both absorption layer 10 and the supporting member 220. In some embodiments, the third region 240 includes two different materials. For example, the third region 240 includes Si and Ge. The operating method of the photo-detecting apparatus in FIG. 3P is similar to the operating method of the photo-detecting apparatus disclosed in FIG. 3O.

Figure 3Q:
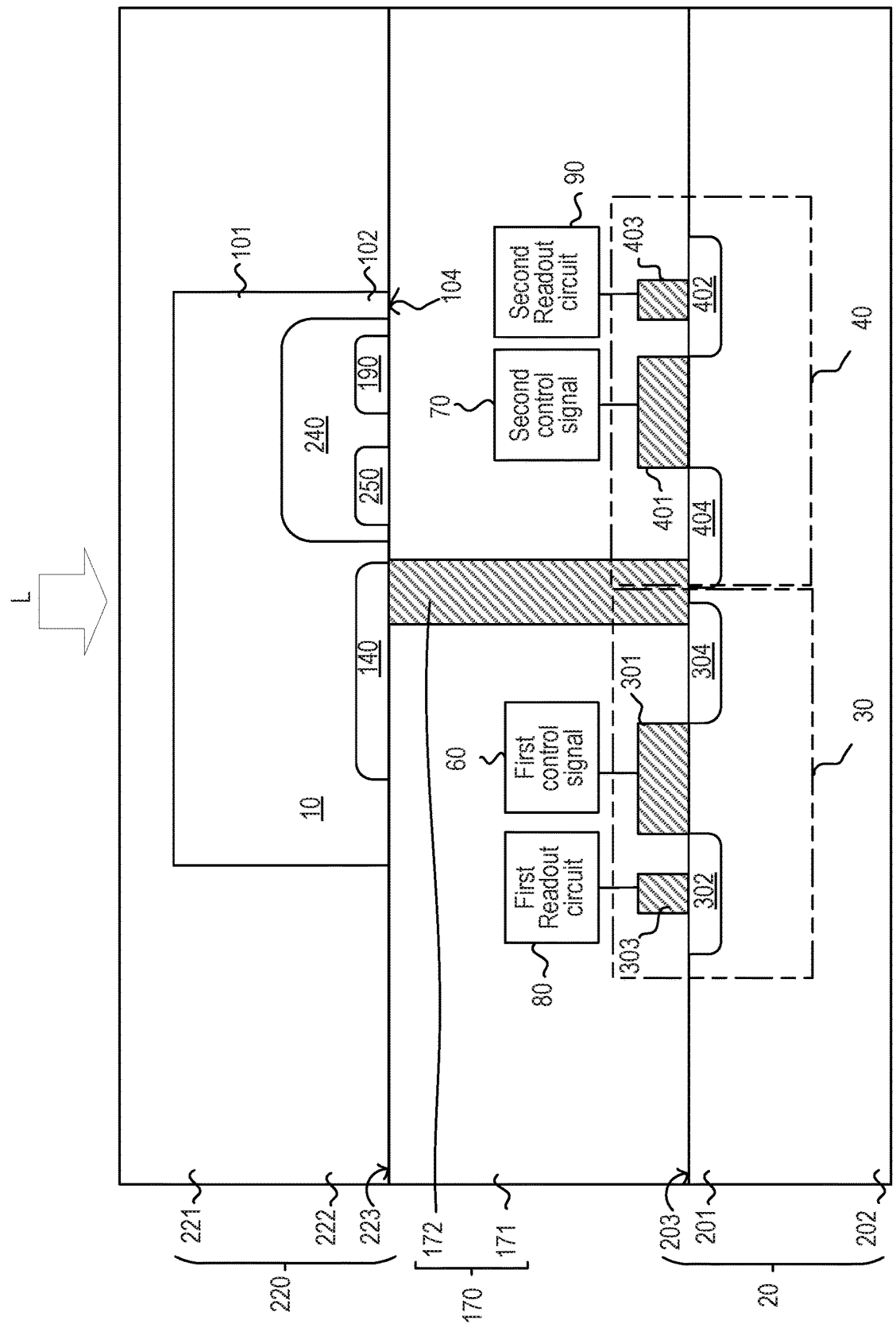
FIG. 3Q illustrates a cross-sectional view of a photo-detecting apparatus, according to some embodiments.

FIG. 3Q illustrates a cross-sectional view of a photo-detecting apparatus, according to some embodiments. The photo-detecting apparatus in FIG. 3Q is similar to the photo-detecting apparatus in FIG. 3P. The difference is described below. In some embodiments, the photo-detecting apparatus further includes a fourth region 250 in the absorption layer 10. In some embodiments, the fourth region 250 is physically separated from the second region 190 and is also physically separated from the first region 140. The fourth region 250 is between the first region 140 and the second region 190 and is surrounded by the third region 240. In some embodiments, the fourth region 250 includes a material the same as the material of the first region 140, the material of the second region 190 and the material of the third region 240. For example, the material of the first region 140, the material of the second region 190, the material of the third region 240 and the material of the fourth region 250 all include Ge. In some embodiments, the fourth region 250 is of a fourth conductivity type different from the first conductivity type of the first region 140 and the second conductivity type of the second region 190. The fourth conductivity type of the fourth region 250 is the same as the third conductivity type of the third region 240. In some embodiments, the fourth region 250 includes a dopant including a peak concentration between $1 \times 10^{18}$ cm$^{-3}$ and $5 \times 10^{20}$ cm$^{-3}$. In some embodiments, the peak concentration of the dopant of the fourth region 250 is higher than the peak concentration of the dopant of the third region 240. In some embodiments, a second terminal 130 (not shown) as described in FIG. 1 is connected to the fourth region 250 for evacuating the photo-carriers with opposite type not collected by the first region 140 during the operation of the photo-detecting apparatus.

In some embodiment, the first region 140, the second region 190 and the third region 240 are referred as a phototransistor, wherein the first region 140 is refereed as a collector, the second region 190 is refereed as an emitter, and the third region 240 is referred as a base. In some embodiments, the phototransistor is a homojunction phototransistor.

The operating method of the photo-detecting apparatus in FIG. 3Q is similar to the operating method of the photo-detecting apparatus disclosed in FIG. 3P. The difference is described below. In some embodiments, when the photo-detecting apparatus is configured to collect electrons, the holes are evacuated from the second terminal (not shown) connected to the fourth region 250, which force more electrons to move across the third region 240 to reach the first region 140. Therefore, the photo-detecting apparatus has a β gain. The photo-detecting apparatus is with improved sensitivity and signal-to-noise-ratio.

Figure 3R:
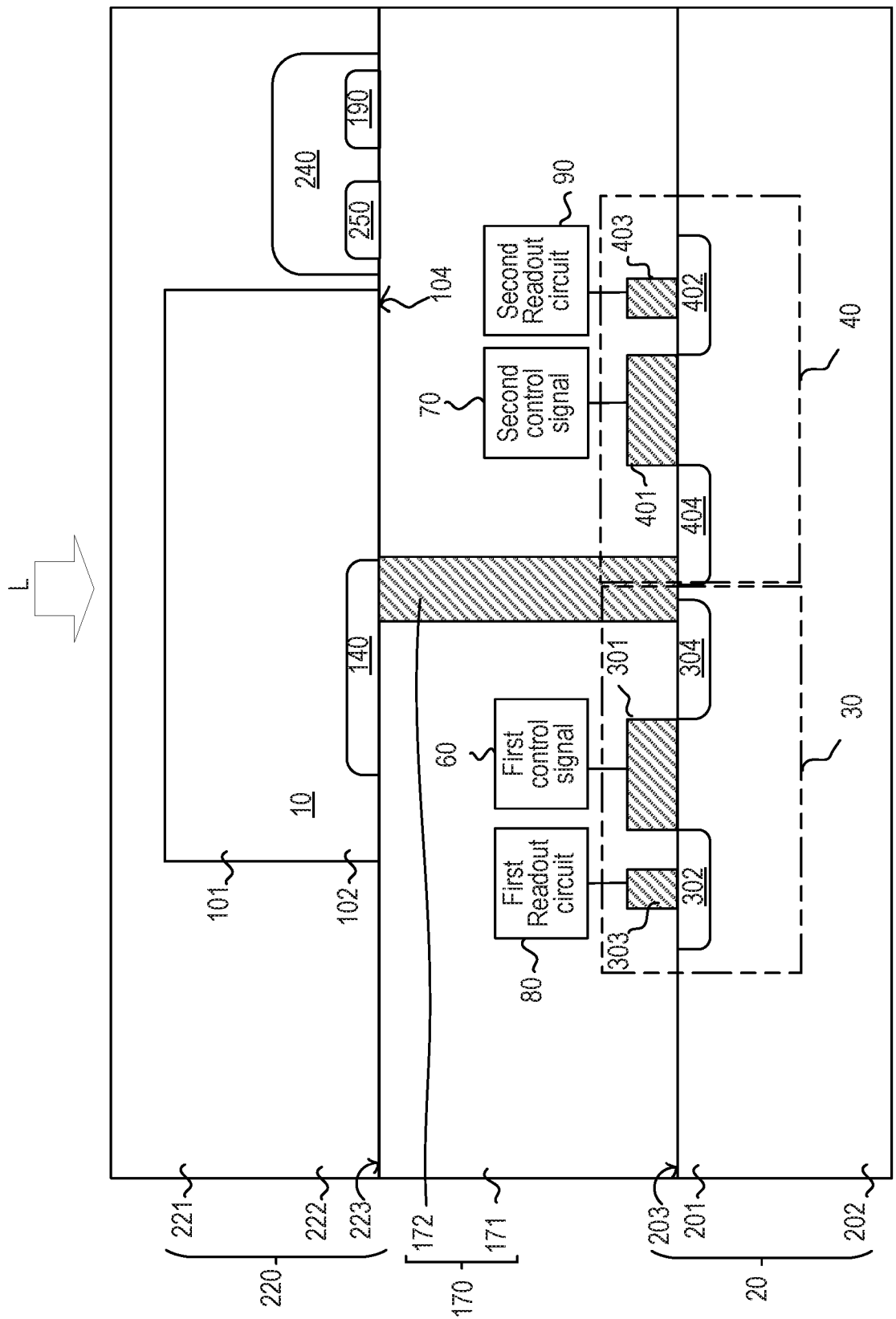
FIG. 3R illustrates a cross-sectional view of a photo-detecting apparatus, according to some embodiments.

FIG. 3R illustrates a cross-sectional view of a photo-detecting apparatus, according to some embodiments. The photo-detecting apparatus in FIG. 3R is similar to the photo-detecting apparatus in FIG. 3Q. The difference is described below. In some embodiments, the second region 190, the third region 240 and the fourth region 250 are outside of the absorption layer 10 and at the lower side 222 of the supporting member 220. In some embodiments, the material of the first region 140 is different from the material of the second region 190, the material of the third region 240, and the material of the fourth region 250. For example, the material of the first region 140 includes Ge, and the material of the second region 190, the material of the third region 240 and the material of the fourth region 250 include Si. In some embodiments, the first region 140, the second region 190 and the third region 240 are referred as a phototransistor, wherein the first region 140 is refereed as a collector, the second region 190 is refereed as an emitter, and the third region 240 is referred as a base. In some embodiments, the phototransistor is a heterojunction phototransistor. In some embodiments, since the second region 190 is in the supporting member 220, the contact resistance between the second region 190 and the second terminal (not shown) is lower. Therefore, the photo-detecting apparatus is with lower RC delay.

The operating method of the photo-detecting apparatus in FIG. 3R is similar to the operating method of the photo-detecting apparatus disclosed in FIG. 3Q.

Figure 3S:
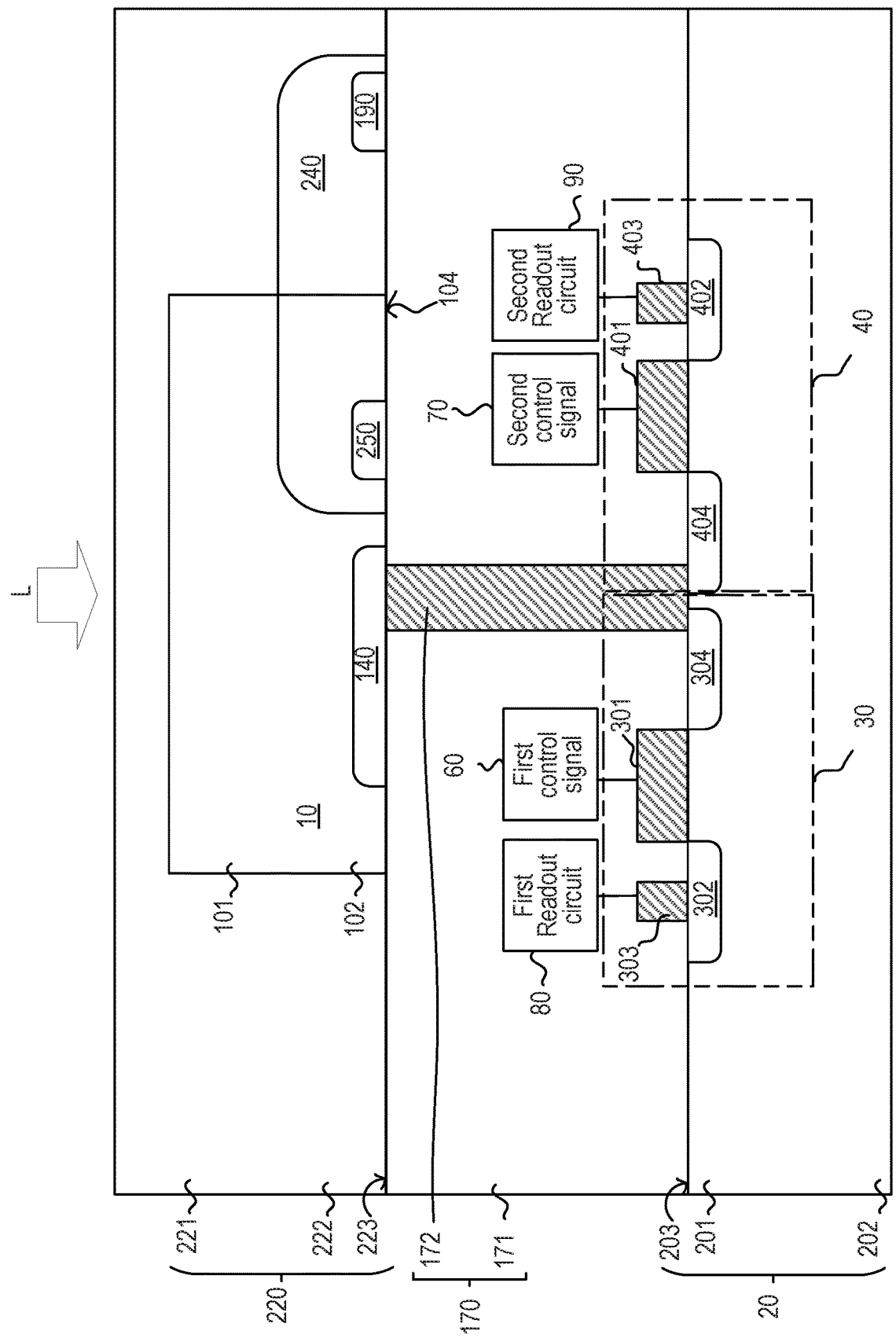
FIG. 3S illustrates a cross-sectional view of a photo-detecting apparatus, according to some embodiments.

FIG. 3S illustrates a cross-sectional view of a photo-detecting apparatus, according to some embodiments. The photo-detecting apparatus in FIG. 3S is similar to the photo-detecting apparatus in FIG. 3R. The difference is described below. In some embodiments, the third region 240 is in both the absorption layer 10 and the supporting member 220. The third region 240 includes two different materials. For example, the fourth region 250 includes Si or Ge. In some embodiments, the fourth region 250 is in the absorption layer 10, and the second region 190 is in the supporting member 220. the first region 140, the second region 190 and the third region 240 are referred as a phototransistor, wherein the first region 140 is refereed as a collector, the second region 190 is refereed as an emitter, and the third region 240 is referred as a base. In some embodiments, the phototransistor is a heterojunction phototransistor.

The operating method of the photo-detecting apparatus in FIG. 3S is similar to the operating method of the photo-detecting apparatus disclosed in FIG. 3R.

Figure 4A:
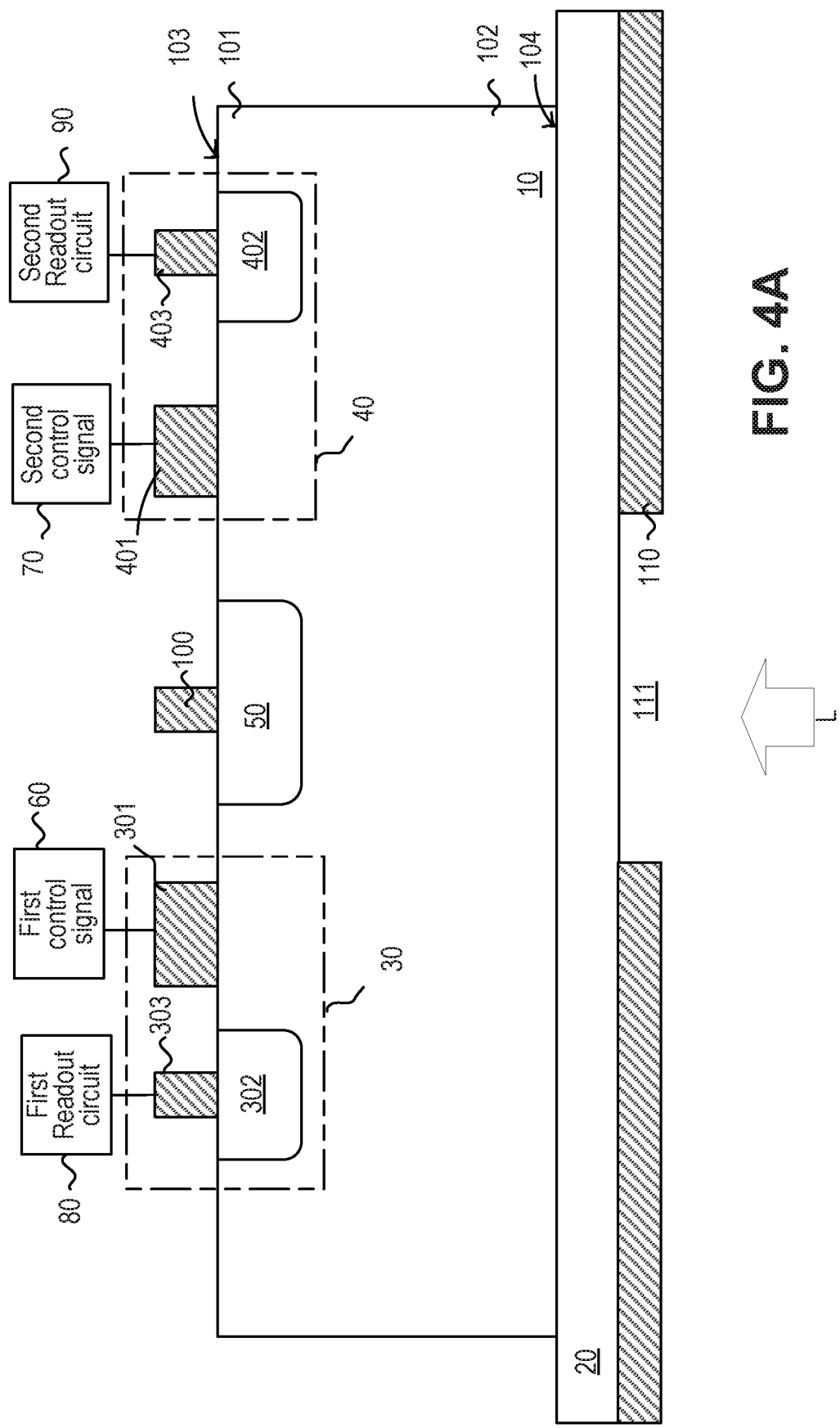
FIG. 4A illustrates a cross-sectional view of a photo-detecting apparatus, according to some embodiments.

FIG. 4A illustrates a cross-sectional view of a photo-detecting apparatus, according to some embodiments. The photo-detecting apparatus in FIG. 4A is similar to the photo-detecting apparatus in FIG. 1A. The difference is described below. The first carrier-output region 302 is of a conductivity type different from the conductivity type of the common region 50. The second carrier-output region 402 is of a conductivity type different from the conductivity type of the common region 50. In some embodiments, the absorption layer 10 is of a conductivity type from the same as the conductivity type of the common region 50. In some embodiments, the common region 50 and the first carrier-output region 302 are referred as a first lateral photodiode. In some embodiments, the common region 50 and the second carrier-output region 402 are referred as a second lateral photodiode. In some embodiments, the first lateral photodiode is a homojunction diode. The second lateral photodiode is a homojunction diode. In some embodiments, the first switch 30, the second switch 40, and the common region 50 are integrated with a single absorption layer 10, and thus the photo-detecting apparatus is with improved demodulation contrast. In some embodiments, the first gate terminal 301 includes the first insulating layer between the first contact layer and the absorption layer 10, and the second gate terminal 401 includes the second insulating layer between the first contact layer and the absorption layer 10.

In some embodiments, when the photo-detecting apparatus in FIG. 4A is operated, an incident light L is absorbed by the absorption layer 10 and photo-carriers including electrons and holes are then generated. Two different voltages are applied to the first gate terminal 301 and the second gate terminal 401 to form an inversion area beneath the first insulating layer (not shown) or beneath the second insulating layer (not shown). However, since the conductivity type of the first carrier-output region 302 and the conductivity type of the second carrier-output region 402 are different from the common region 50, the first switch 30 with the inversion area formed or the second switch 40 with the inversion area formed is not switched on. Instead, since the depletion region is smaller compared to the other switch without the inversion area formed, a major portion of holes or electrons of the photo-carriers are driven to move toward the first carrier-output region 302 or the second carrier-output region 402 by the electric field in the larger depletion region. For example, when two different voltages are applied to the first gate terminal 301 and the second gate terminal 401 to form an inversion area beneath the first insulating layer (not shown), the depletion region between the common region 50 and the first carrier-output region 302 is smaller than the depletion region between the common region 50 and the second carrier-output region 402, and thus a major portion of holes or electrons of the photo-carriers are driven by a larger electric field to move toward the second carrier-output region 402. For another example, when two different voltages are applied to the first gate terminal 301 and the second gate terminal 401 to form an inversion area beneath the second insulating layer (not shown), the depletion region between the common region 50 and the first carrier-output region 302 is larger than the depletion region between the common region 50 and the second carrier-output region 402, and thus a major portion of holes or electrons of the photo-carriers are driven by a larger electric field to move toward the first carrier-output region 302. By forming an inversion layer to generate different sizes of depletion regions at two opposite sides of the common region 50, a major portion of the carriers are driven to move toward a direction opposite to the inversion layer.

In the present disclosure, in a same photo-detecting apparatus, the type of the carriers collected by the first carrier-output region 302 and the type of the carriers collected by the second carrier-output region 402 are the same. For example, when the photo-detecting apparatus is configured to collects electrons, when an inversion layer is formed beneath the first insulating layer (not shown), the second carrier-output region 402 collects electrons of the photo-carriers, and when an inversion layer is formed beneath the second insulating layer (not shown), the first carrier-output region 302 collects a major portion of electrons of the photo-carriers.

In some embodiments, the substrate 20 includes silicon, the absorption layer 10 includes n-type germanium, the common region 50 includes p-type germanium. The first carrier-output region 302 and the second carrier-output region 402 include n-type germanium. Each of the first carrier-output region 302 and the second carrier-output region 402 has a dopant having a peak concentration higher than the peak concentration of the dopant of the absorption layer 10. For example, the absorption layer 10 includes germanium doped with phosphorous having a peak concentration between $1 \times 10^{14}$ cm$^{-3}$ and $5 \times 10^{16}$ cm$^{-3}$. The common region 50 includes germanium doped with boron having a peak concentration between $1 \times 10^{18}$ cm$^{-3}$ and $5 \times 10^{20}$ cm$^{-3}$. The first carrier-output region 302 and the second carrier-output region 402 include germanium doped with phosphorous having a peak concentration between $1 \times 10^{18}$ cm$^{-3}$ and $5 \times 10^{20}$ cm$^{-3}$.

During the operation of the photo-detecting apparatus, the absorption layer 10 is at a first voltage V1 (e.g. 3 V), and the common region 50 is at a second voltage (e.g. 0V) lower than the first voltage. An incident light L enters into the absorption layer 10 from the second side 202 of the substrate 20, and then is absorbed by the absorption layer 10 to generate photo-carriers including electrons and holes. The first gate terminal 301 receives a third voltage (e.g. 0V), and the second gate terminal 401 receives a fourth voltage (e.g. 1V) higher than the third voltage. The holes of the photo-carriers are driven to move toward the first gate terminal 301 and an inversion area is formed beneath the first insulating layer (not shown). Since the inversion area is formed, the depletion region between the first carrier-output region 302 and the common region 50 is smaller than the depletion region between the second carrier-output region 402 and the common region 50. A major portion of the electrons of the photo-carriers are then driven to move toward the second carrier-output region 402 by the stronger electric field. Alternately, the first gate terminal 301 receives a fifth voltage (e.g. 1V) and the second gate terminal 401 receives a six voltage (e.g. 0V) lower than the fifth voltage. The holes of the photo-carriers are driven to move toward the second gate terminal 401 and an inversion area is formed beneath the second insulating layer (not shown). Since the inversion area is formed, the depletion region between the second carrier-output region 402 and the common region 50 is smaller than the depletion region between the first carrier-output region 302 and the common region 50. A major portion of the electrons of the photo-carriers are then driven to move toward the first carrier-output region 302 by the stronger electric field. In these embodiments, the photo-detecting apparatus is configured to collects electrons.

In some embodiments, the substrate 20 includes silicon, the absorption layer 10 includes intrinsic germanium, the common region 50 includes n-type germanium. The first carrier-output region 302 and the second carrier-output region 402 include p-type germanium. Each of the first carrier-output region 302 and the second carrier-output region 402 has a dopant having a peak concentration higher than the peak concentration of the dopant of the absorption layer 10. For example, the common region 50 includes germanium doped with phosphorous having a peak concentration between $1 \times 10^{18}$ cm$^{-3}$ and $5 \times 10^{20}$ cm$^{-3}$. The first carrier-output region 302 and the second carrier-output region 402 includes germanium doped with boron having a peak concentration between $1 \times 10^{18}$ cm$^{-3}$ and $5 \times 10^{20}$ cm$^{-3}$. During the operation of the photo-detecting apparatus, the absorption layer 10 is at a first voltage V1 (e.g. 0V), and the common region 50 is at a second voltage (e.g. 3V) higher than the first voltage. An incident light L enters into the absorption layer 10 from the second side 202 of the substrate 20, and then is absorbed by the absorption layer 10 to generate photo-carriers including electrons and holes. The first gate terminal 301 receives a third voltage (e.g. 1V), and the second gate terminal 401 receives a fourth voltage (e.g. 0V) lower than the third voltage. The electrons of the photo-carriers are driven to move toward the first gate terminal 301 and an inversion area is formed beneath the first insulating layer (not shown). Since the inversion area is formed, the depletion region between the first carrier-output region 302 and the common region 50 is smaller than the depletion region between the second carrier-output region 402 and the common region 50. A major portion of the holes of the photo-carriers are then driven to move toward the second carrier-output region 402 by the stronger electric field. Alternately, the first gate terminal 301 receives a fifth voltage (e.g. 0V) and the second gate terminal 401 receives a six voltage (e.g. 1V) higher than the fifth voltage. The electrons of the photo-carriers are driven to move toward the second gate terminal 401 and an inversion area is formed beneath the second insulating layer (not shown). Since the inversion area is formed, the depletion region between the second carrier-output region 402 and the common region 50 is smaller than the depletion region between the first carrier-output region 302 and the common region 50. A major portion of the holes of the photo-carriers are then driven to move toward the first carrier-output region 302 by the stronger electric field. In these embodiments, the photo-detecting apparatus is configured to collects holes.

In some embodiments, when the photo-detecting apparatus is operated above a voltage to occur an avalanche between the common region 50 and the first carrier-output region 302 or between the common region 50 and the second carrier-output region 402, which results a large number of secondary carriers generated by impact ionization. The secondary carriers are then collected by the first carrier-output region 302 or the second carrier-output region 402. Therefore, the photo-detecting apparatus is with an internal gain.

Figure 4B:
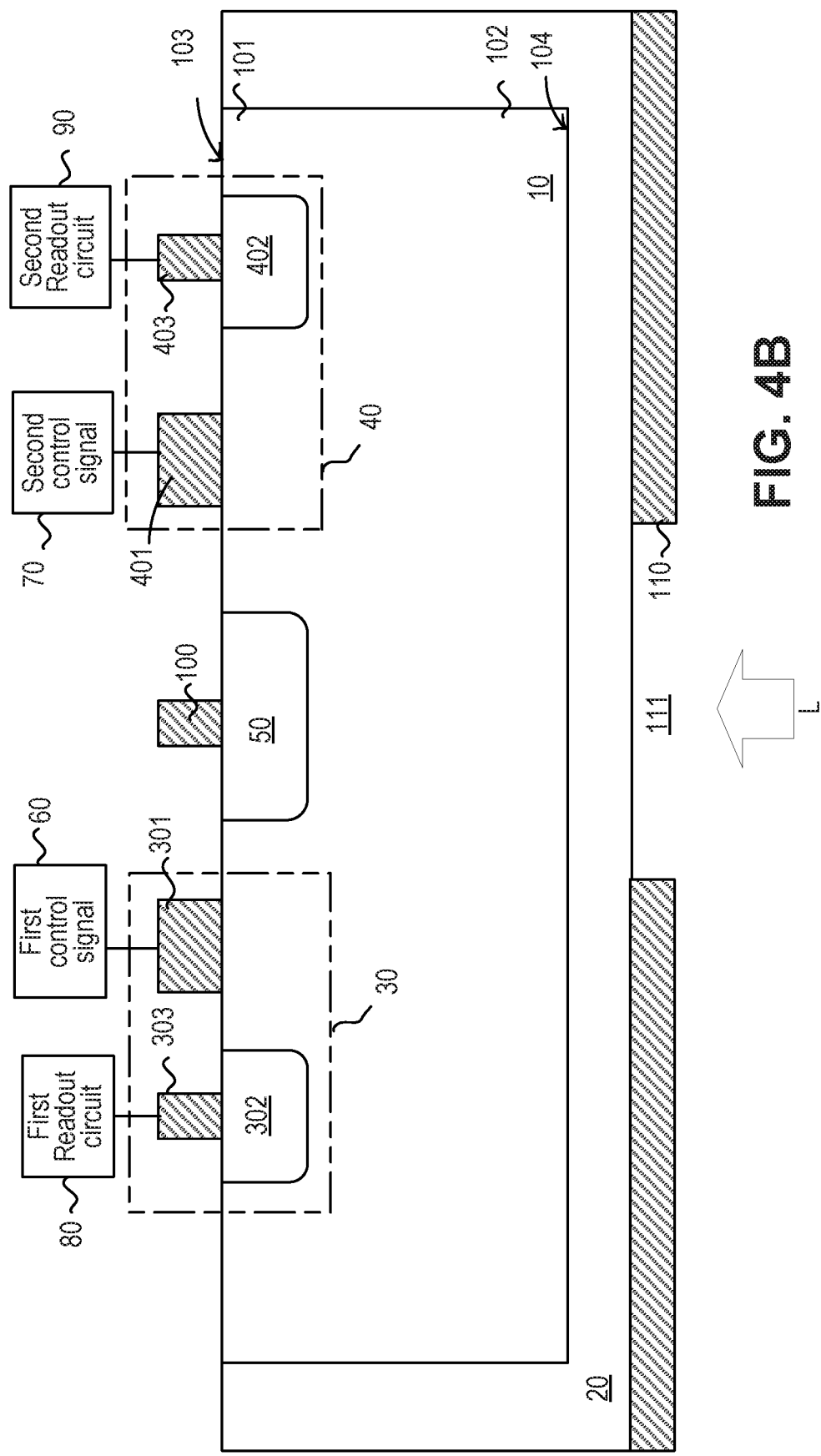
FIG. 4B illustrates a cross-sectional view of a photo-detecting apparatus, according to some embodiments.

FIG. 4B illustrates a cross-sectional view of a photo-detecting apparatus, according to some embodiments. The photo-detecting apparatus in FIG. 4B is similar to the photo-detecting apparatus in FIG. 4A, the difference is that the absorption layer 10 is embedded in the substrate 20. In some embodiments, the top surface 103 of the absorption layer 10 is flush with the first surface 203 of the substrate 20. The operating method of the photo-detecting apparatus in FIG. 4AB is similar to the operating method of the photo-detecting apparatus disclosed in FIG. 4A.

Figure 4C:
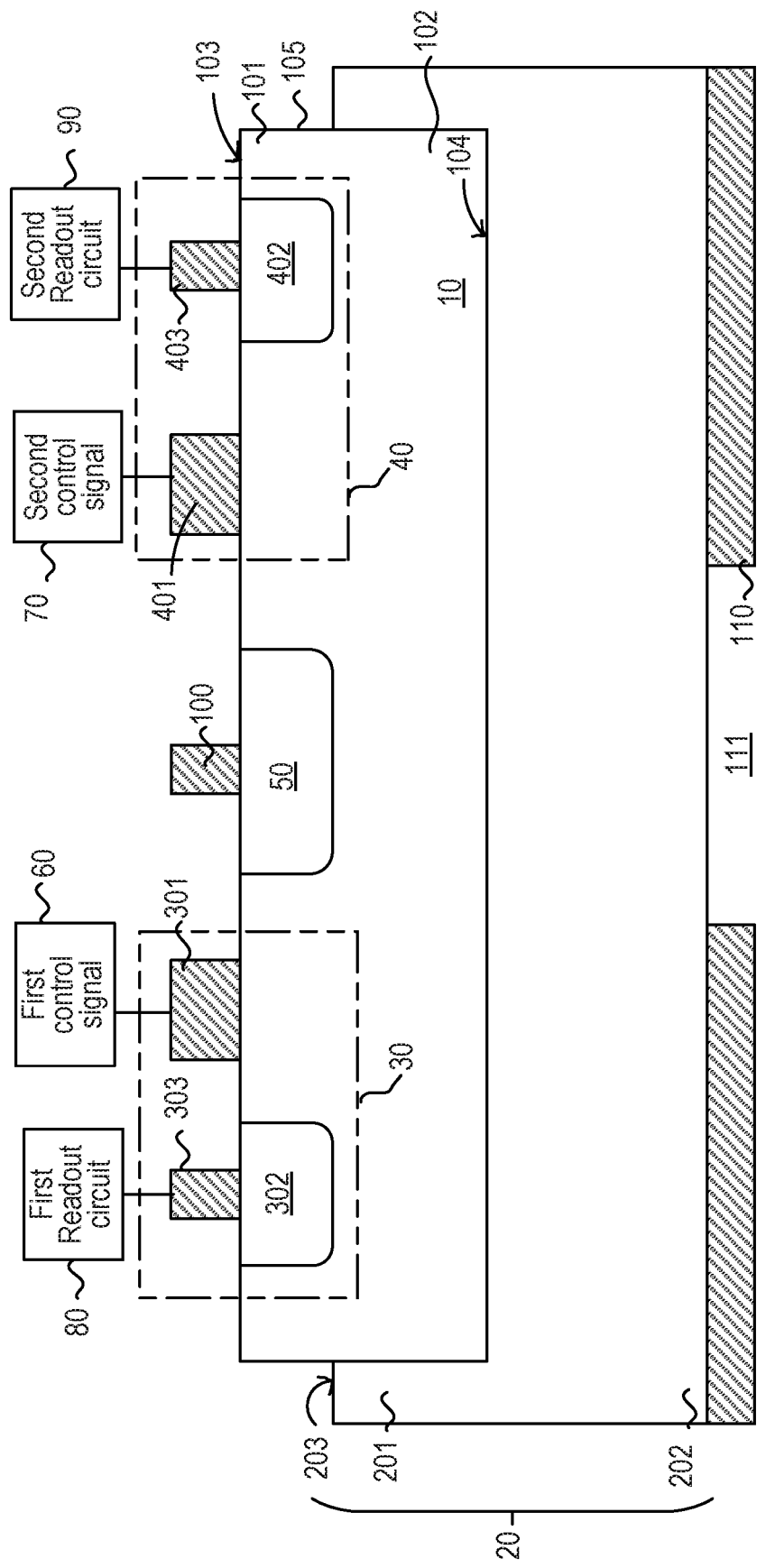
FIG. 4C illustrates a cross-sectional view of a photo-detecting apparatus, according to some embodiments.

FIG. 4C illustrates a cross-sectional view of a photo-detecting apparatus, according to some embodiments. The photo-detecting apparatus in FIG. 4C is similar to the photo-detecting apparatus in FIG. 4B, the difference is described below. In some embodiments, the absorption layer 10 is partially embedded in the substrate 20. In some embodiments, the first surface 203 of the substrate 20 is between the bottom surface 104 and the top surface 103 of the absorption layer 10. In some embodiments, the absorption layer 10 includes a sidewall 105 between the top surface 103 and the bottom surface 104. A part of the sidewall 105 is exposed from the substrate 20. The operating method of the photo-detecting apparatus in FIG. 4C is similar to the operating method of the photo-detecting apparatus disclosed in FIG. 4A.

Figure 4D:
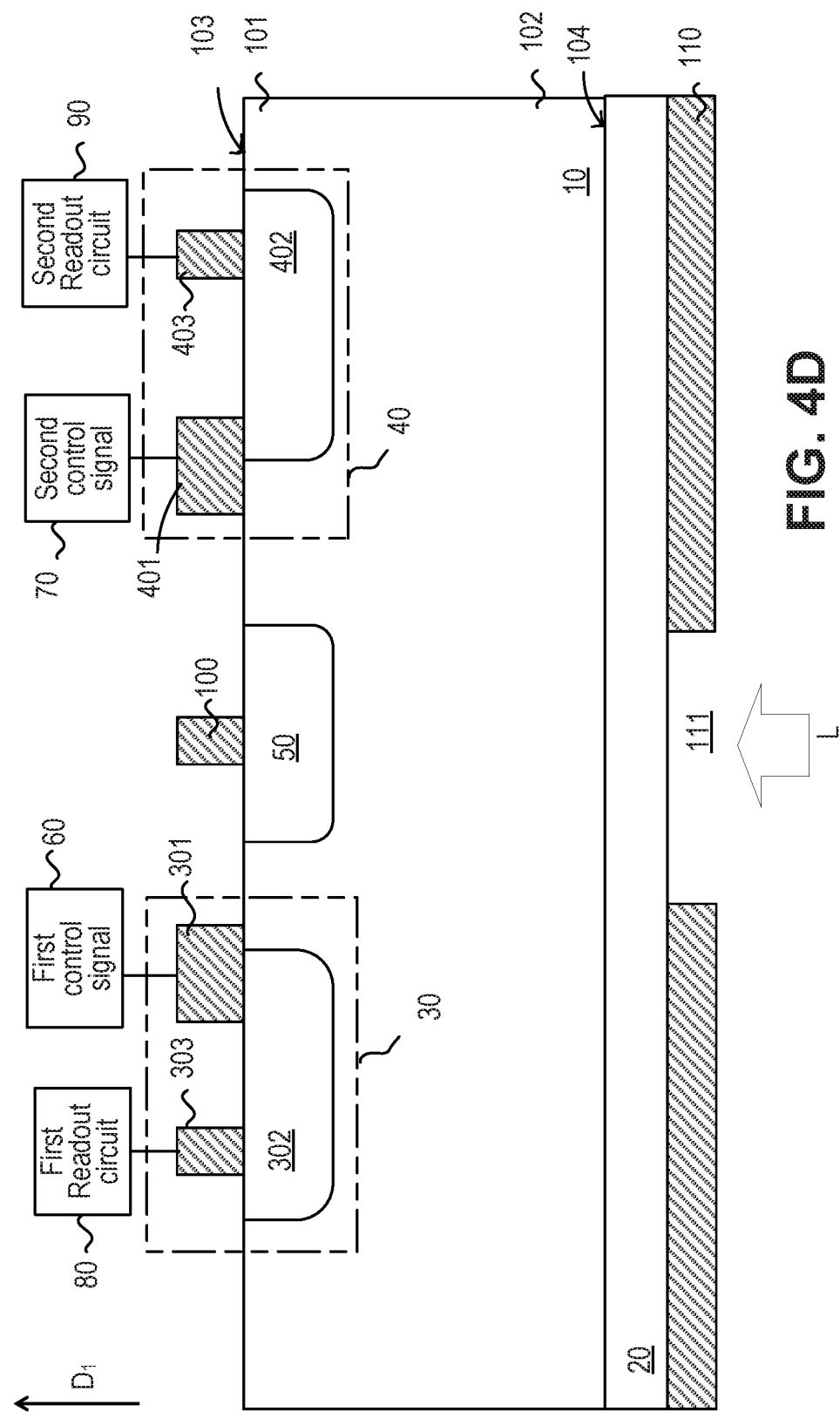
FIG. 4D illustrates a cross-sectional view of a photo-detecting apparatus, according to some embodiments.

FIG. 4D illustrates a cross-sectional view of a photo-detecting apparatus, according to some embodiments. The photo-detecting apparatus in FIG. 4D is similar to the photo-detecting apparatus in FIG. 4A, the difference is described below. In some embodiments, the first gate terminal 301 is overlapped with the first carrier-output region 302 along a vertical direction $D_1$ for a higher chance to undergo avalanche breakdown during the operation of the photo-detecting apparatus. In some embodiments, the second gate terminal 401 is overlapped with the second carrier-output region 402 along a vertical direction $D_1$. In some embodiments, the photo-detecting apparatus is configured to operate at a reverse bias high enough to undergo avalanche breakdown so as to generate an internal gain.

Figure 4E:
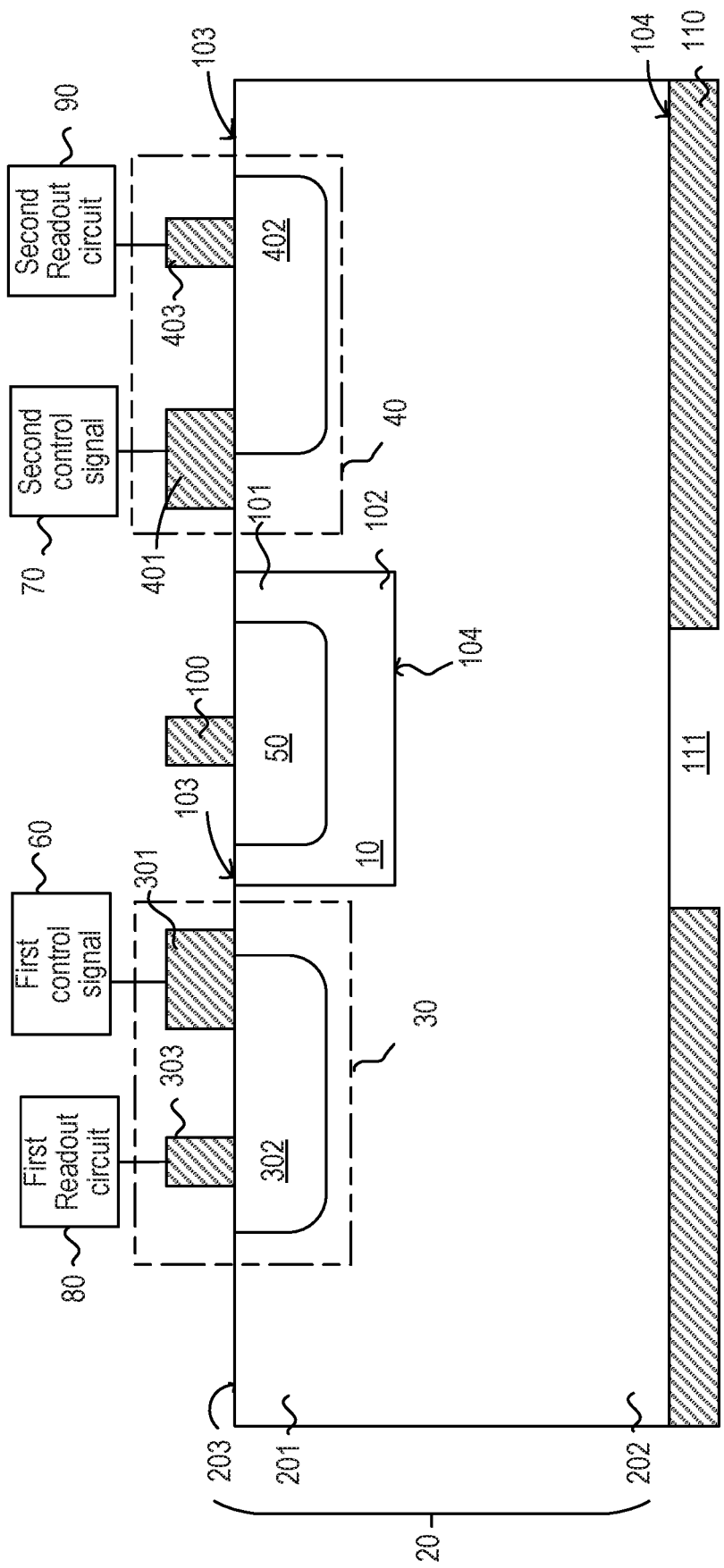
FIG. 4E illustrates a cross-sectional view of a photo-detecting apparatus, according to some embodiments.

FIG. 4E illustrates a cross-sectional view of a photo-detecting apparatus, according to some embodiments. The photo-detecting apparatus in FIG. 4E is similar to the photo-detecting apparatus in FIG. 4C, the difference is described below. In some embodiments, the absorption layer 10 is embedded in the substrate 20. In some embodiments, the top surface 103 of the absorption layer 10 is flush with the first surface 203 of the substrate 20. The material of the first carrier-output region 302 and the material of the second carrier-output region 402 are the same. The material of the common region 50 is different from the material of the first carrier-output region 302 and from the material of the second carrier-output region 402.

Figure 4F:
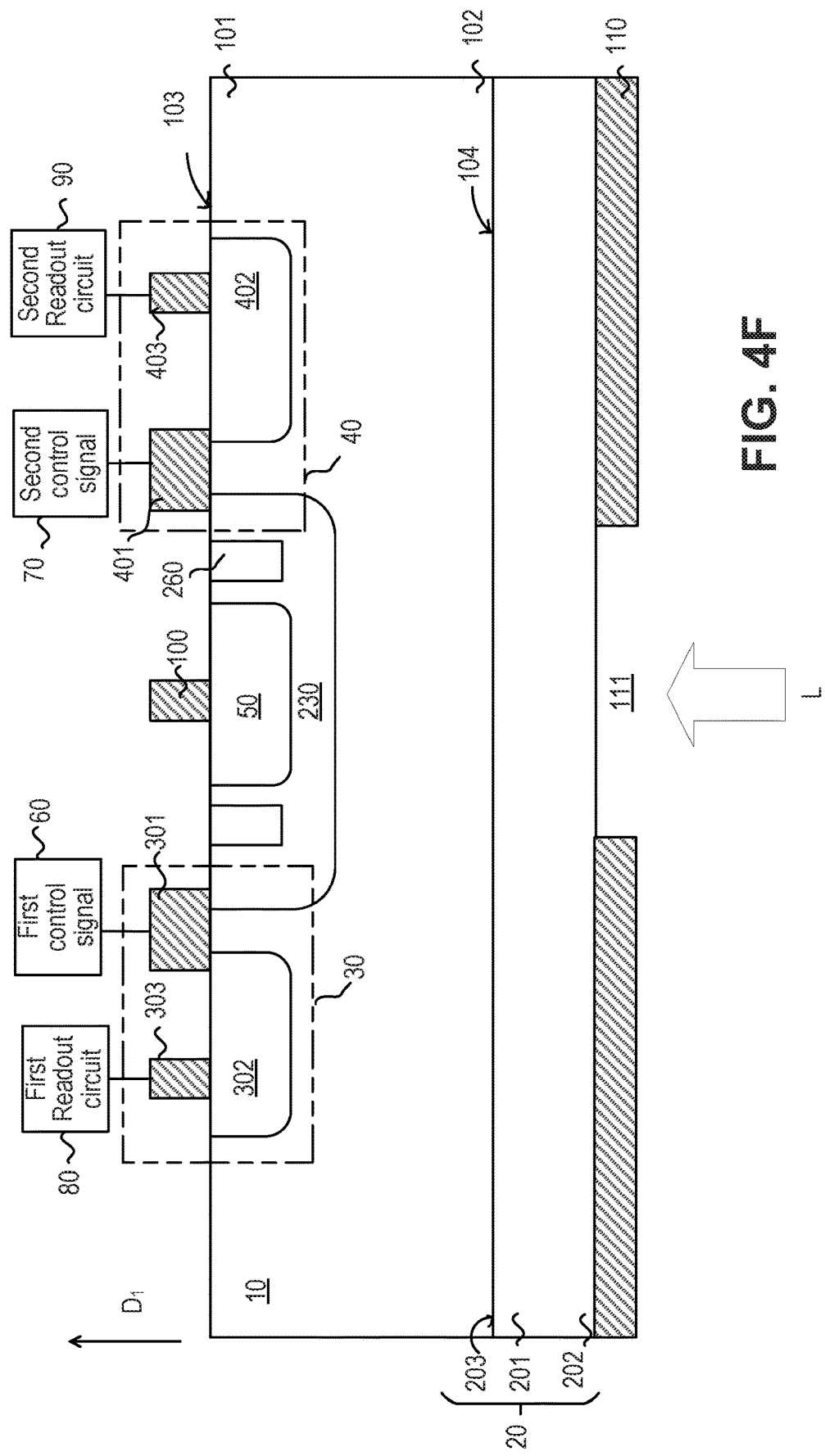
FIG. 4F illustrates a cross-sectional view of a photo-detecting apparatus, according to some embodiments.

FIG. 4F illustrates a cross-sectional view of a photo-detecting apparatus, according to some embodiments. The photo-detecting apparatus in FIG. 4F is similar to the photo-detecting apparatus in 4C, the difference is described below. The photo-detecting apparatus further includes a protection ring 260 surrounding the common region 50. The protection ring 260 is of a conductivity type the same as the conductivity type of the common region 50, In some embodiments, the protection ring 260 includes a dopant having a peak concentration lower than a peak concentration of the dopant of the common region 50. In some embodiments, the peak concentration of the dopant of the protection ring 260 is between $1\times10^{14}$ cm$^{-3}$ and $5\times10^{16}$ cm$^{-3}$. In some embodiments, the protection ring 260 includes an insulating material such as oxide including $SiO_2$. The protection ring 260 is for preventing an edge breakdown of the common region 50 when the photo-detecting apparatus is under a high reverse bias voltage.

In some embodiments, the photo-detecting apparatus further includes a multiplication region 230 in the absorption layer 10. In some embodiments, the multiplication region 230 surrounds the common region 50 and the protection ring 260. The multiplication region 230 is of a conductivity type different from the conductivity type of the common region 50. In some embodiments, the multiplication region 230 includes a dopant having a peak concentration lower than a peak concentration of the dopant of the first carrier-output region 302. In some embodiments, the peak concentration of the dopant of the multiplication region 230 is between $1\times10^{14}$ cm$^{-3}$ and $5\times10^{18}$ cm$^{-3}$. In some embodiments, the common region 50, the multiplication region 230, and the absorption layer 10 are referred as a vertical avalanche photodiode. In some embodiments, the multiplication region 230 is overlapped with the first gate terminal 301 and the second gate terminal 401 along a vertical direction $D_1$. In some embodiments, the multiplication region 23 is not overlapped with the first carrier-output region 302 and the second carrier-output region 402 along a vertical direction $D_1$ for improving the demodulation contrast of the photo-detecting apparatus.

Figure 4G:
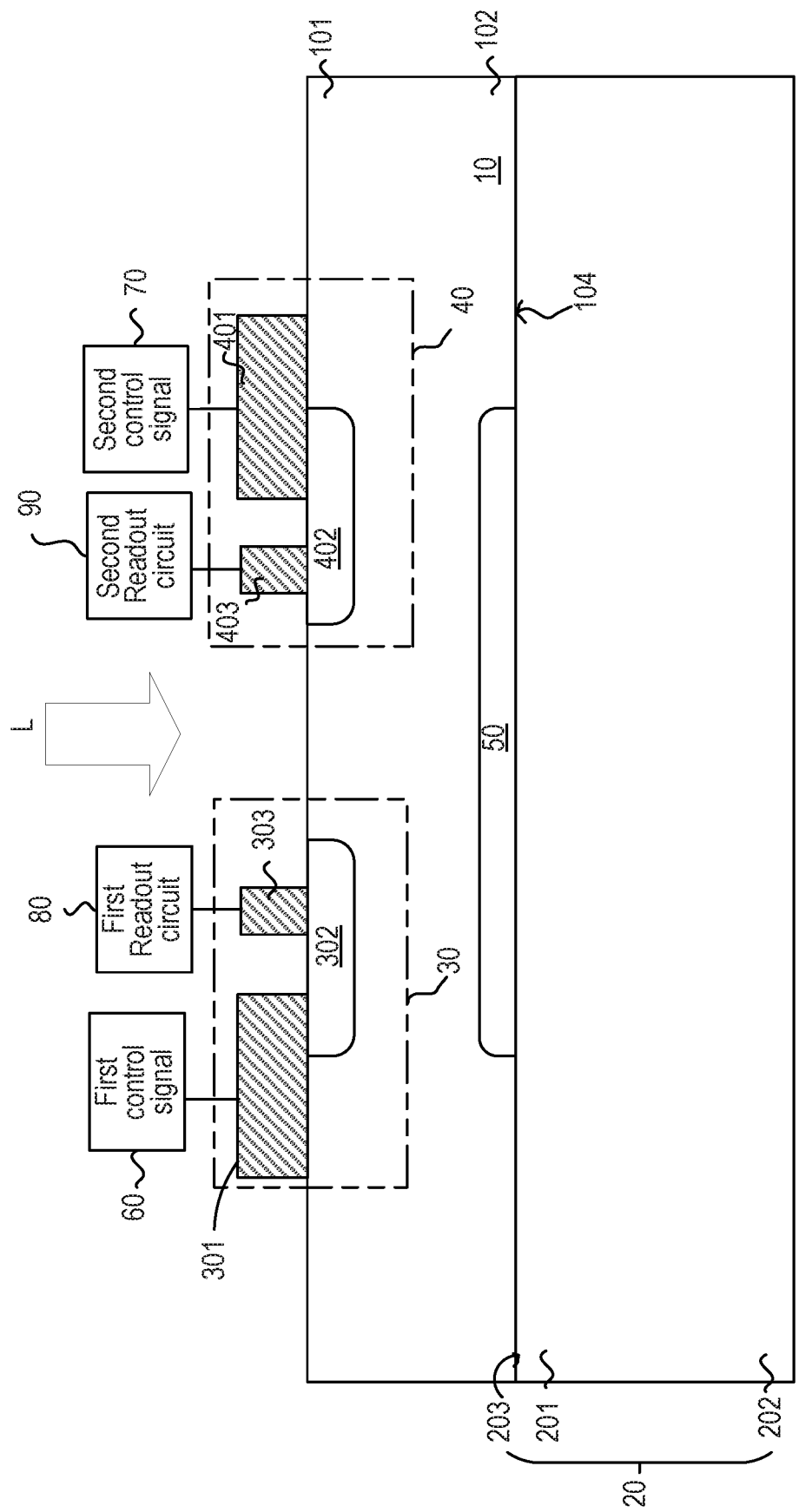
FIG. 4G illustrates a cross-sectional view of a photo-detecting apparatus, according to some embodiments.

FIG. 4G illustrates a cross-sectional view of a photo-detecting apparatus, according to some embodiments. The photo-detecting apparatus in FIG. 4G is similar to the photo-detecting apparatus in FIG. 4E, the difference is described below. The common region 50 is at the bottom side 102 of the absorption layer 10. In some embodiments, the first terminal (not shown) as described in FIG. 1A is in the substrate 20 to electrically coupled to the common region 50 for evacuate the photo-carriers with opposite type not collected by the first carrier-output region 302 or the second carrier-output region 402 during the operation of the photo-detecting apparatus. In some embodiments, one of the sides of the first terminal reaches the top side 101 of the absorption layer 10. Therefore, the first terminal, the first readout terminal 303, the first gate terminal 301, the second gate terminal 401, and the second readout terminal 403 can be processed at the same side of the absorption layer 10.

Figure 5:
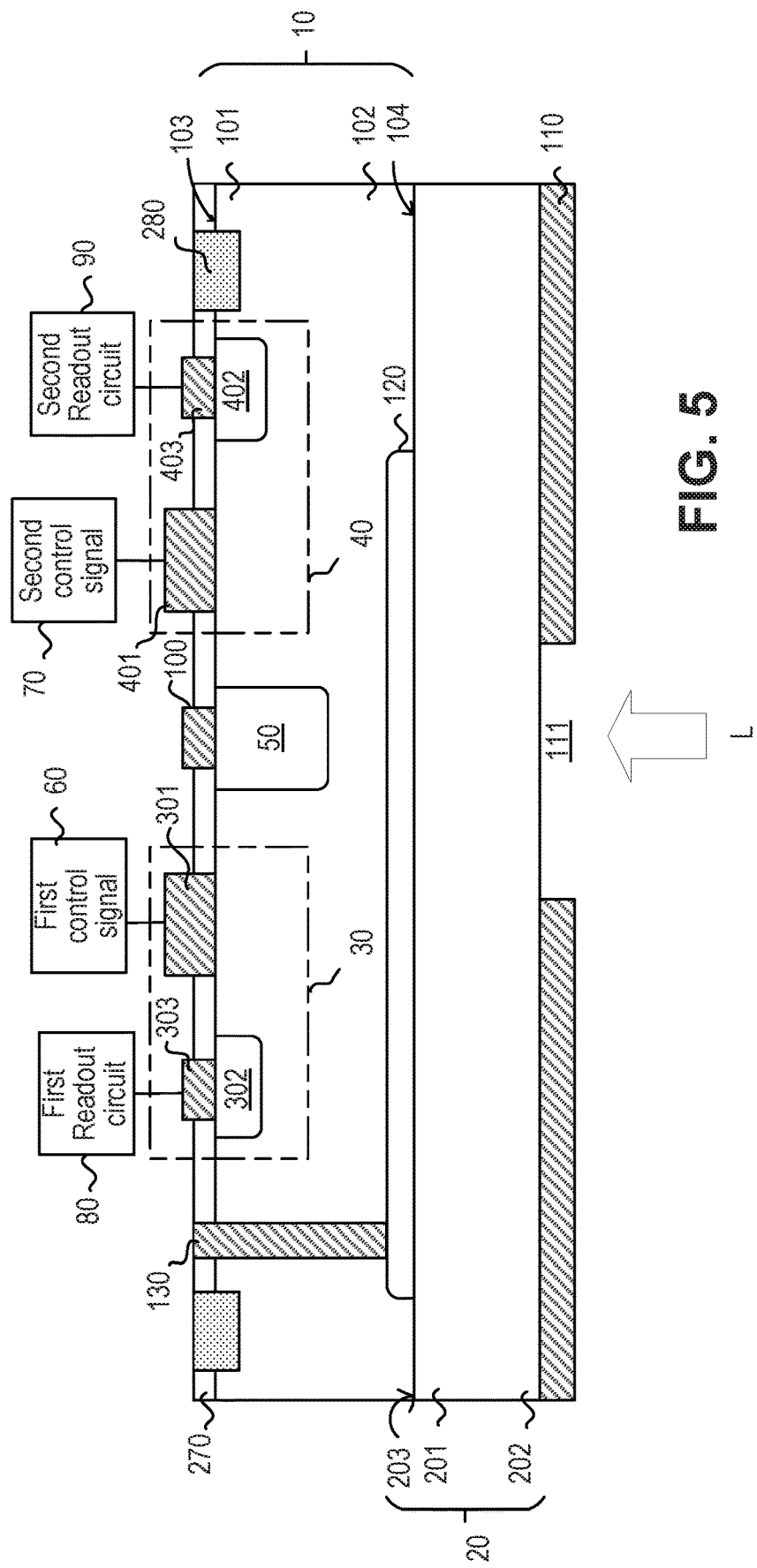
FIG. 5 illustrates a cross-sectional view of a photo-detecting apparatus, according to some embodiments.

FIG. 5 illustrates a cross-sectional view of a photo-detecting apparatus, according to some embodiments. The photo-detecting apparatus in FIG. 5 is similar to the photo-detecting apparatus in FIG. 1A, the difference is described below. In some embodiments, the photo-detecting apparatus further includes an interface layer 270 on the top surface 103 of the absorption layer 10. The interface layer 270 includes dielectric material, in some embodiments, the interface layer 270 includes, but is not limited to, silicon, oxide, nitride. In some embodiments, oxide includes, but is not limited to $GeO_x$, $Al_2O_3$, $SiO_2$. In some embodiments, the interface layer 270 includes amorphous-silicon (a-Si). In some embodiments, the interface layer 270 is between the first contact layer of the first gate terminal 301 and the absorption layer 10. In some embodiments, the interface layer 270 is between the second contact layer of the second gate terminal 401 and the absorption layer 10. In some embodiments, when the first gate terminal 301 includes a first insulating layer, the interface layer 270 is between the first insulating layer of the first gate terminal 301 and the absorption layer 10. In some embodiments, when the second gate terminal 401 includes a second insulating layer, the interface layer 270 is between the second insulating layer of the second gate terminal 401 and the absorption layer 10.

In some embodiments, the interface layer 270 includes germanium of a conductivity type different from the conductivity type of the absorption layer 10. The interface layer 270 is for reducing surface leakage current. In some embodiments, the photo-detecting apparatus further includes a processed area 280 penetrating through the interface layer 270 and the top surface 103 of the absorption layer 10. The processed area 280 is for further suppression of the surface leakage current. The processed area 280 includes a property different from a property of the interface layer 270. The property includes, material, resistance or the lattice structure. For example, the processed area 280 has a resistance higher than that of the interface layer 270. In some embodiments, the processed area 280 is formed by implanting a material different from the material of the interface layer 270 and the material of the absorption layer 10. In some embodiments, the processed area 280 is formed by ion implant ions such as Si, Ge, C, $H_2$, F into a part of the interface layer 270 and the area of the absorption layer 10 beneath the part of the interface layer 270. In some embodiments, during the process of the ion implant, accelerated ions collide with the interface layer 270 and cause damage to the lattice structure in the area of implantation. The damage may extend into the absorption layer 10 at a depth depending on the selection of ions or the implant energy. The damage to the lattice structure results in a higher resistance. The processed area 280 can be formed in any positions, for example, processed area 280 can be next to the second carrier-output region 402. In some embodiments, the photo-detecting apparatus includes multiple processed area 280.

In some embodiments, instead of the processed area 280, the photo-detecting apparatus further includes a conductive layer (not shown) on part of the interface layer 270. A voltage can be applied to the conductive layer to generate a depletion region in the absorption layer 10 right under the conductive layer. In some embodiments, the photo-detecting apparatus includes multiple conductive layers on part of the interface layer and are physically separated from each other. Voltages van be applied to the conductive layers can be biased to generate depletion regions. In some embodiments, the voltages applied to the conductive layers can be different or the same. In some of the embodiments, some of the conductive layers are floated. The conductive layer includes, but is not limited to, metal. The depletion region generated by the combination of the conductive layer and the interface layer reduces dark current between the first carrier-output region 302 and the second carrier-output region 402. Furthermore, the conductive layers reflect incident light back into the absorption layer 10, and thus the quantum efficiency of the photo-detecting apparatus is higher.

In some embodiments, the photo-detecting apparatus further includes polarized region (not shown) in the interface layer. In some embodiments, the photo-detecting apparatus further includes a conductive layer above the polarized region. The polarized region includes polarized dielectric material. The polarized dielectric material has intrinsic polarization. The polarized dielectric material includes, but is not limited to aluminum oxides ($Al_xO_y$, x:y from 1:1 to 2:3), aluminum oxynitrides ($AlO_xN_y$), hafnium oxides (HfOx, x from 1 to 2), lanthanum/tantalum oxides (($La,Ta)_xO_y$, x:y from 1:1 to 2:5), titanium oxides (TiOx, x from 1 to 2), lanthanum silicon oxide (LaSiO), lead/strontium/barium titanate ($(Pb,Sr,Ba)TiO_3$, zirconium oxides ($ZrO_x$, x from 1 to 2), zirconium silicates ($ZrSiO_4$ or $ZiS_{ix}O_y$) or silicon oxynitrides ($SiO_xN_y$). Since the photo-detecting apparatus includes the polarized region, a depletion region is formed in the absorption layer 10 right under the polarized region without applying a voltage thereto or with a small voltage applied thereto. The depletion region generated by the polarized region or the combination of the conductive layer and the interface layer reduces dark current between the first carrier-output region 302 and the second carrier-output region 402. In some embodiments, the depletion region has a depth less than 10 nm for improving the performance of the photo-detecting apparatus. The depth of the depletion region is measured from the top surface 103 of the absorption layer 10. In some embodiments, the polarized region is partially embedded in the absorption layer 10 to control the depth of the depletion region. In some embodiments, when the absorption layer 10 is embedded in the substrate 20, the polarized region is formed on the first surface 203 of the substrate 20. In some embodiments, the polarized region is partially embedded in the substrate 20.

The operating method of the photo-detecting apparatus in FIG. 5 is similar to the operating method of the photo-detecting apparatus disclosed in FIG. 1A. Similarly, in some embodiments, the common region 50 is not coupled to any external control and thus is floated. The floated common region reduces leakage current between the common region 50 and the first carrier-output region 302 or reduces the leakage current between the common region 50 and the second carrier-output region 402 during the operation of the photo-detecting apparatus.

Figure 6B:
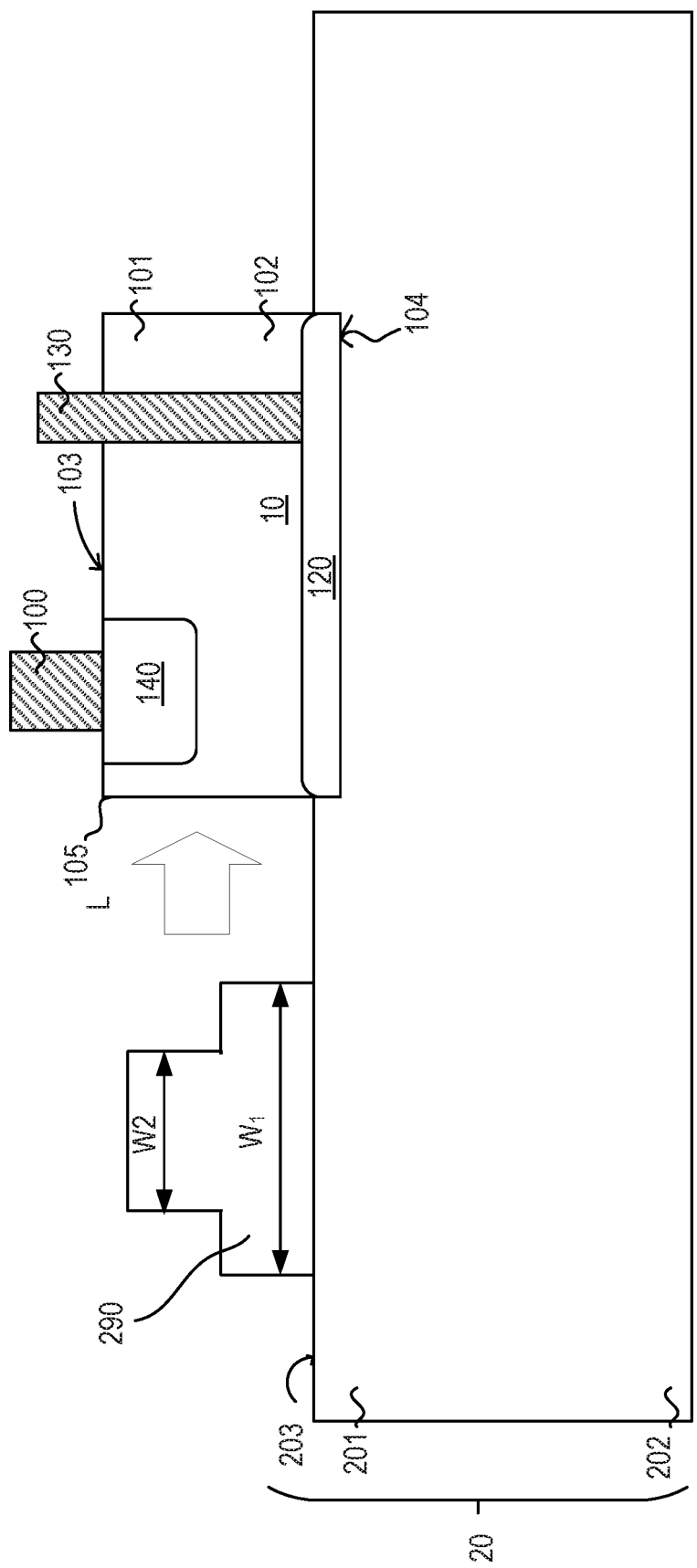
FIG. 6B illustrates a cross-sectional view of a photo-detecting apparatus shown in FIG. 6A.

FIG. 6A illustrates a top view of a photo-detecting apparatus according to some embodiments. FIG. 6B illustrates a cross-sectional view of a photo-detecting apparatus shown in FIG. 6A. In some of the embodiments, the photo-detecting apparatus further includes an optical element 290 next to the absorption layer 10 to change the propagation direction of the incident light L. In some embodiments, optical element 290 is for changing the propagation direction of the incident light L such that the incident light L enters into the absorption layer 10 from the sidewall 105 between the top surface 103 and the bottom surface 104. The optical element 290 is on the first surface 203 of the substrate 20. In some embodiments, the optical element 290 is at the same side of the absorption layer 10, the first switch 30 and the second switch 40 as shown in FIG. 6A. In some embodiments, the optical element 290 includes a waveguide structure. In some embodiment, the waveguide structure includes, but is not limited to, a buried waveguide, diffused waveguide, ridge waveguide, rib waveguide, slot waveguide or strip-loaded waveguide. In some embodiments, the waveguide structure includes a ridge waveguide including a first part and a second part on the first part. In some embodiments, from a cross-sectional view of a photo-detecting apparatus, the first part includes a first width $W_1$, and the second part includes a second width $W_2$ less than the first width $W_1$. The ridge waveguide includes a material including but is not limited to Si or $SiO_2$.

Figure 6C:
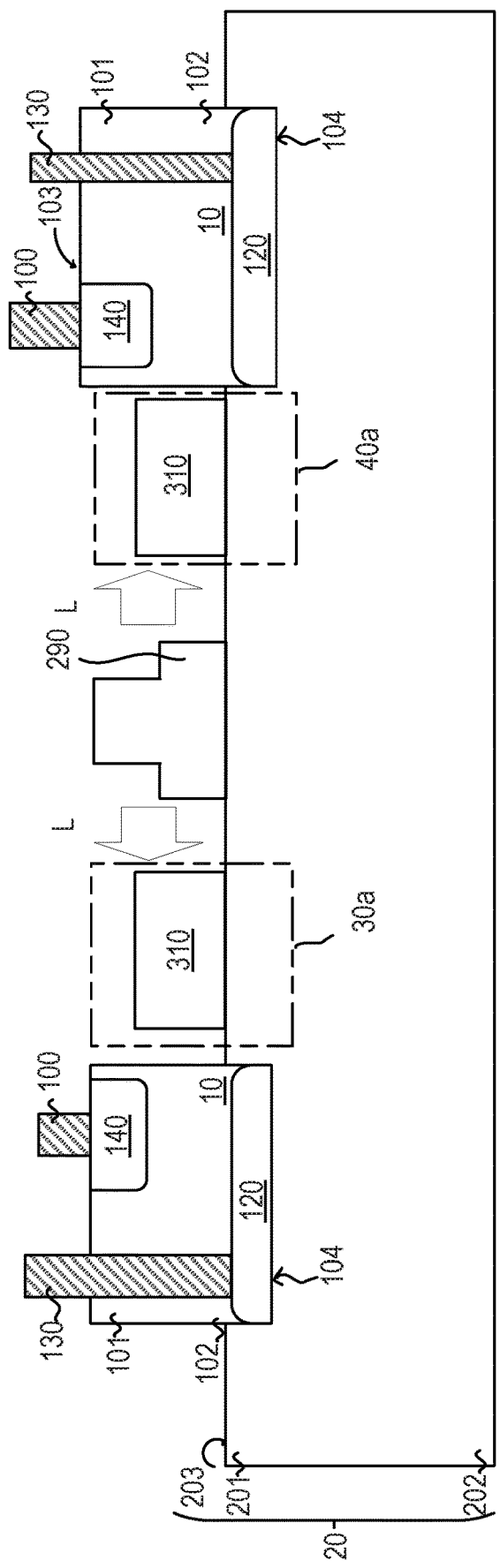
FIG. 6C illustrates a cross-sectional view of a photo-detecting apparatus, according to some embodiments.

FIG. 6C illustrates a cross-sectional view of a photo-detecting apparatus, according to some embodiments. The photo-detecting apparatus includes a substrate 20, a first absorption layer 10, a second absorption layer 10, a first switch 30a, a second switch 40a and an optical element 290. In some embodiment, the optical element 290 is between the second switch 40a and the first switch 30a. In some embodiments, the second switch 40a and the first switch 30a are between the first absorption layer 10 and the second absorption layer 10. The optical element 290 is similar to the optical element 290 as described in FIG. 37. The second switch 40a and the first switch 30a each includes an electro-absorption modulator. The electro-absorption modulator includes an active region 310 and two terminals (not shown) for applying a voltage to the active region 310 so as to changing the electric field in the active region 310. In some embodiment, the active region 310 includes any suitable material having an energy state. In some embodiments, the active region 310 includes semiconductor material. When the photo-detecting apparatus is operated, an incident light L enters into the optical element 290, Two different voltages are applied to the first switch 30a and the second switch 40a, and the first switch 30a or the second switch 40a absorbs the incident light L and thus is switched on. The incident light L is then entering into the first absorption layer 10 or the second absorption layer 10 through the first switch 30a and the second switch 40a. For example, when the first switch 30a absorbs the incident light L and is switched on, the incident light L is then entering into the first absorption layer 10 and is absorbed by the first absorption layer 10. In some embodiment, the first absorption layer 10, the second absorption layer 10, the first switch 30a, the second switch 40a and the optical element 290 are all integrated with the substrate 20.

In some embodiments, the photo-detecting apparatus with any embodiments described herein is applicable to 3D imaging. Due to a distance existing between the photo-detecting apparatus in accordance and a target object, an incident light L reflected from a surface of the target object has a phase delay with respect to the transmitted light transmitted by a transmitter. When the transmitted light is modulated by a modulation signal and the electron-hole pairs are demodulated through the first control signal 60 and the second control signal 70 by another modulation signal, the electrons or the holes stored in the first capacitor and the second capacitor will be varied according to the distance. Therefore, the photo-detecting apparatus can obtain the distance information based on the first readout voltage output by the first readout circuit 80 and the second readout voltage output by the second readout circuit.

The photo-detecting apparatuses described above is a single-pixel.

The present disclosure further discloses a photo-detecting array includes multiple photo-detecting apparatuses, wherein the photo-detecting apparatus is any one of the embodiments as mentioned above. The multiple photo-detecting apparatuses are arranged in a one-dimensional or two-dimensional array.

Figure 7A:
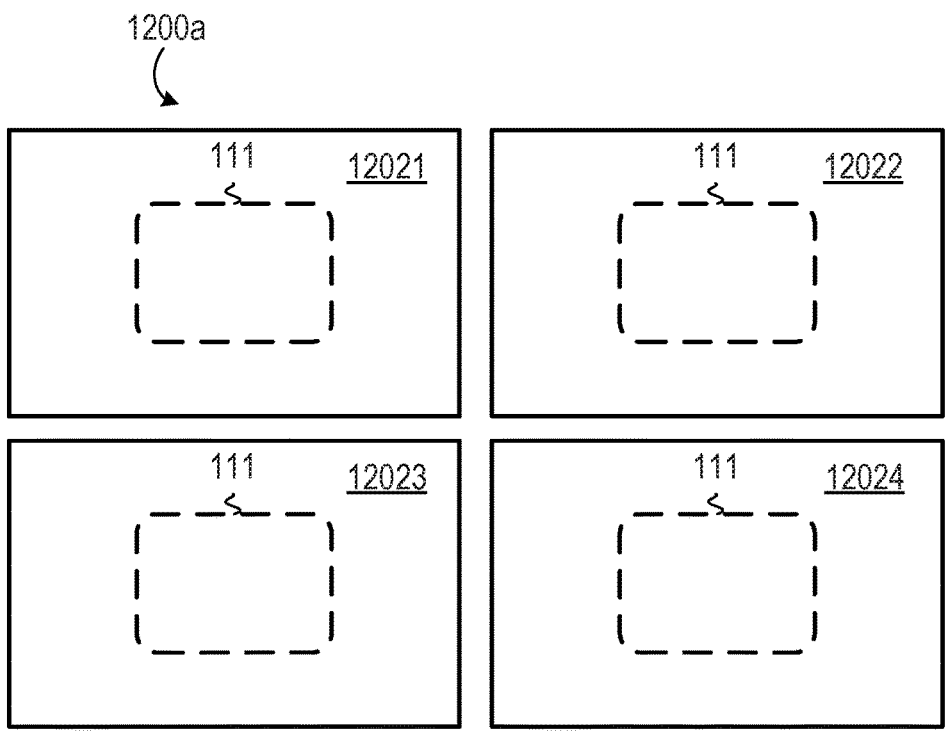
FIGS. 7A-7B illustrate planar views of array configurations of a photo-detecting apparatus, according to some embodiments.

In some embodiments, the photo-detecting array can be designed to receive the same or different optical signals, e.g., with the same or different wavelengths, with the same or multiple modulations, or being operated at different time frames. FIG. 7A illustrates a top view of a photo-detecting array, according to some embodiments. The photo-detecting array 1200a includes four photo-detecting apparatuses 12021, 12022, 12023, 12024 as an example. Each photo-detecting apparatus is in accordance with any embodiment described herein. In one embodiment, incident light L having a peak wavelength λ1 is received by the photo-detecting apparatus 12021, 12024, and another incident light having a peak wavelength λ2 is received by photo-detecting apparatuses 12022, 12023. In some embodiments, λ1 is different from λ2. In some embodiments, λ1 is substantially the same as λ2. In some embodiments, an incident light L having multiple modulation frequencies $f_{mod1}$ and $f_{mod2}$ (or more) is incident to the four photo-detecting apparatus 12021, 12022, 12023, 12024, and different groups of the photo-detecting apparatus 12021, 12022, 12023, 12024, are configure to demodulate different frequencies in the incident light. For example, the photo-detecting apparatuses 12021, 12024 are applied with modulation frequency $f_{mod1}$ to demodulate this frequency component in the incident light, and the photo-detecting apparatuses 12022, 12023 are applied with modulation frequency $f_{mod2}$ to demodulate this frequency component in the incident light. In some embodiments, similarly, an incident light having multiple modulation frequencies $f_{mod1}$ and $f_{mod2}$ (or more) is incident to the four photo-detecting apparatus 12021, 12022, 12023, 12024. However, at time $t_1$, a first portion of the photo-detecting apparatuses are driven by modulation frequency $f_{mod1}$ to demodulate this frequency component in the incident light, while at another time $t_2$, a second portion of the photo-detecting apparatuses are driven by modulation frequency $f_{mod2}$ to demodulate this frequency component in the incident light, and thus the photo-detecting array 1200a is operated under time multiplexing mode.

In some embodiments, peak wavelengths $\lambda_1$ and $\lambda_2$ are respectively modulated by $f_{mod1}$ and $f_{mod2}$, and then collected by photo-detecting array 1200a. At time $t_1$, the photo-detecting array 1200a is operated at $f_{mod1}$ to demodulate the incident light with peak wavelength $\lambda_1$; while at time $t_2$, the photo-detecting array 1200a is operated at $f_{mod2}$ to demodulate the incident light with peak wavelength in $\lambda_2$. In some embodiments, an incident light with peak wavelength $\lambda$ is modulated by $f_{mod1}$ and $f_{mod2}$, and the photo-detecting apparatuses 12021, 12024 are driven by $f_{mod1}$ while the photo-detecting apparatuses 12022, 12023 are driven by $f_{mod2}$ to demodulate the incoming modulated optical signals in a time division mode. Those of skill in the art will readily recognize that other combinations of optical wavelength, modulation scheme and time division may be implemented.

Figure 7B:
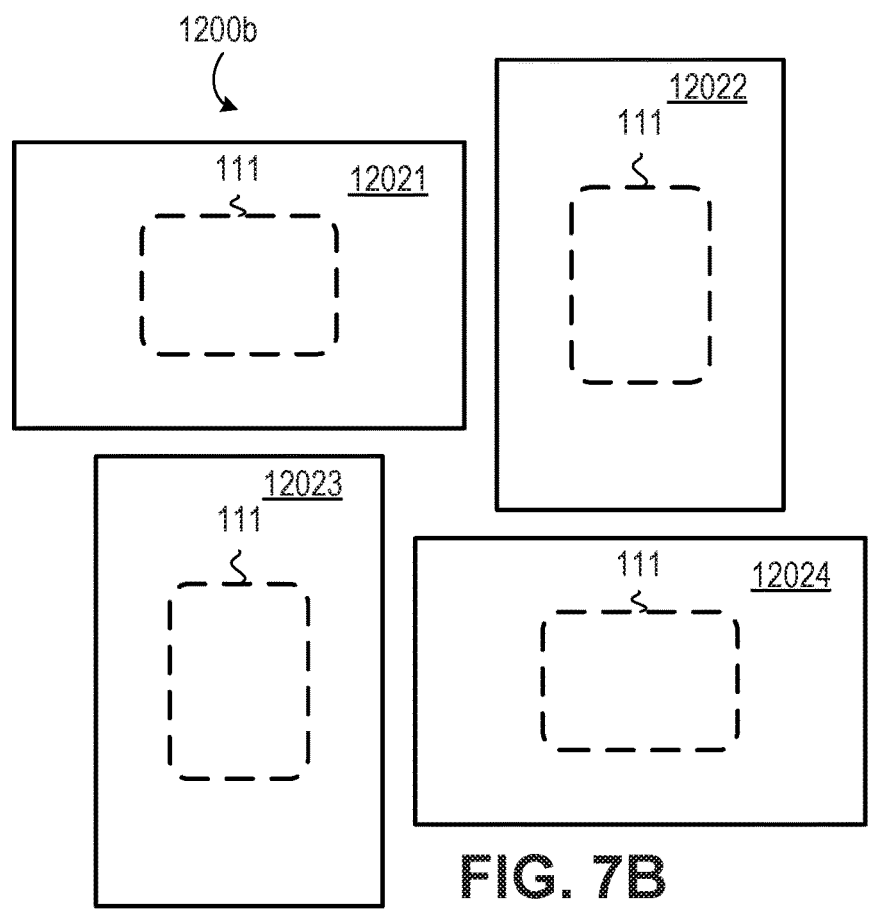

FIG. 7B illustrates a top view of a photo-detecting array, according to some embodiments. The photo-detecting array 1200b includes four photo-detecting apparatuses 12021, 12022, 12023, 12024. Each photo-detecting apparatus is in accordance with any embodiment described herein. The arrangement of the photo-detecting apparatuses in FIG. 7B is different from the arrangement of the photo-detecting apparatuses in FIG. 7A. In some embodiments, the photo-detecting apparatuses are arranged in a staggered arrangement as shown in FIG. 7B. in which two opposite sides with a width of one of the photo-detecting apparatuses are placed in a direction perpendicular to two opposite sides with a width of an adjacent photo-detecting apparatus.

Figure 8A:
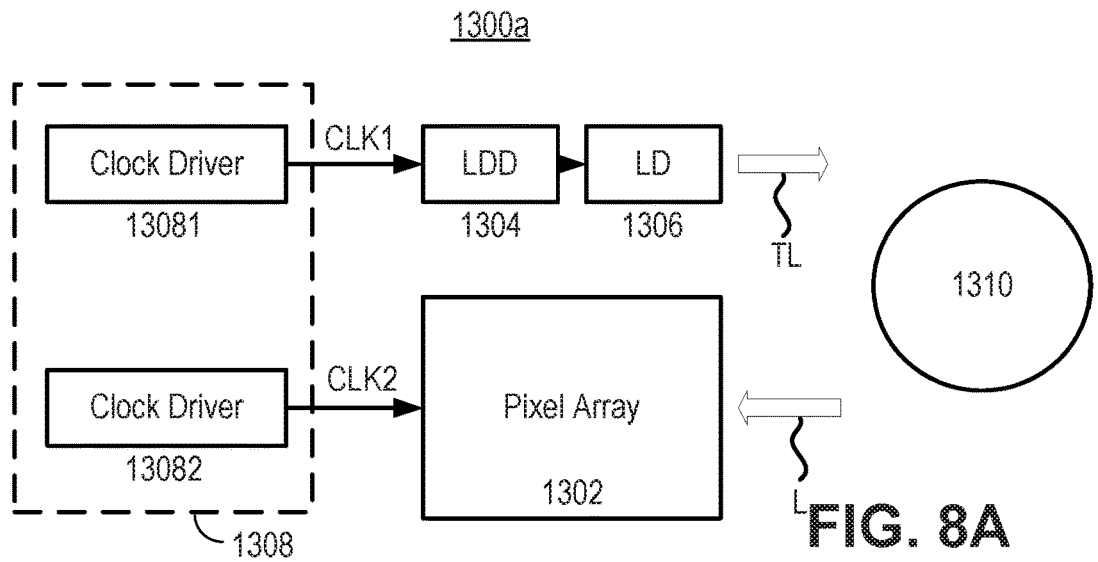
FIG. 8A-8E illustrate blocks and timing diagrams of a photo-detecting apparatus using modulation schemes with phase changes, according to some embodiments.

FIG. 8A illustrates a block diagram of a photo-detecting system 1300a using phase modulation schemes, according to some embodiments. The photo-detecting system 1300a is an indirect time-of-flight based depth image sensor capable of detecting a distance information with the targeted object 1310. The photo-detecting system 1300a includes a photo-detecting array 1302a laser diode driver 1304, a laser diode 1306, and a clock driving circuit 1308 including clock drivers 13081, 13082. The photo-detecting array 1302 includes a plurality of photo-detecting apparatuses in accordance with any embodiment disclosed herein. In general, the clock drivers 13081, generates and sends out the clock signals for 1) modulating the transmitted optical signal by the laser diode driver 1304 and 2) demodulating the received/absorbed optical signal by the photo-detecting array 1302. To obtain the depth information, all photo-detecting apparatuses in the photo-detecting array are demodulated by referencing the same clock, which changes to possible four quadrature phases, e.g., 0°, 90°, 180° and 270°, in a temporal sequence and there is no phase change at the transmitter side. However, in this embodiment, the 4-quadrature phase changes are implemented at the transmitter side, and there is no phase change at the receiving side.

Figure 8B:
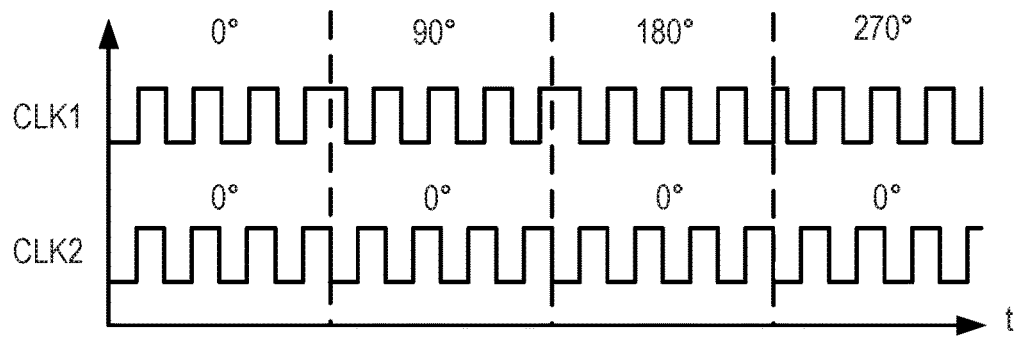
Figure 8C:
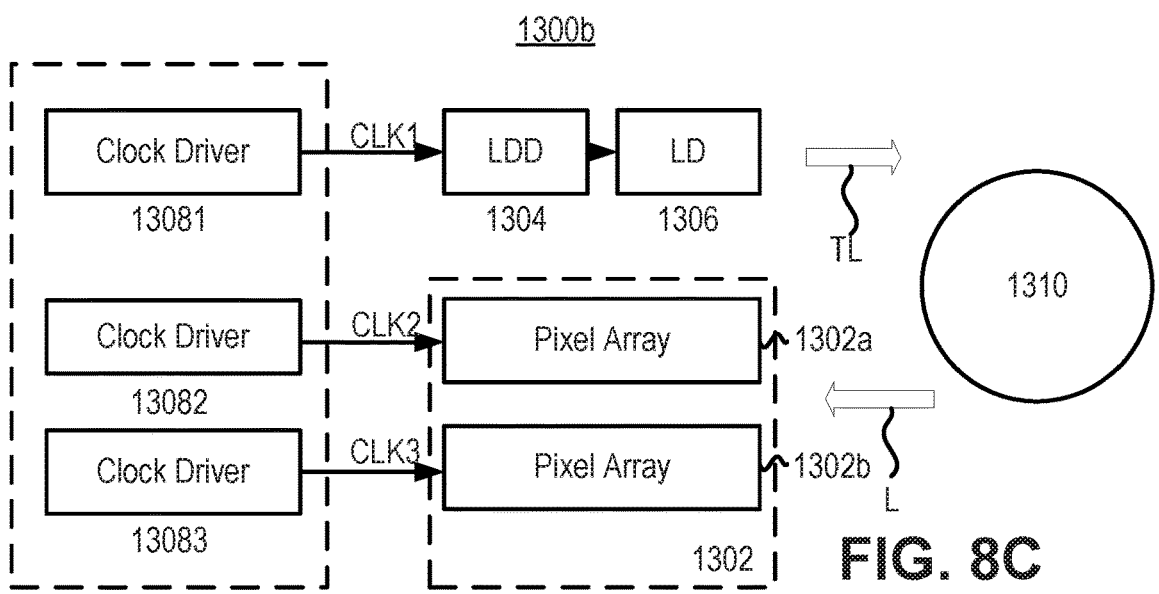

Please refer to FIG. 8B, which depicts a timing diagram of the clock signals CLK1, CLK2 generated by clock drivers 13081, 13082, respectively. The clock signal CLK1 is a modulation signal with 4-quadrature phase changes, e.g., 0°, 90°, 180° and 270°, and clock signal CLK2 is a demodulation signal without phase change. Specifically, the clock signal CLK1 drives the laser diode diver 1304 so that the laser diode 1306 can generate the modulated transmitted light TL. The clock signal CLK2 and its reversed signal CLK2' (not shown in FIG. 8B) are used as the first control signal 60 and second control signal 70 (shown in any embodiment herein), respectively, for demodulation. In other words, the first control signal and the second control signal in this embodiment are differential signals. This embodiment may avoid the possible temporal coherence inherent in an image sensor due to parasitic resistance-capacitance induced memory effects. FIG. 8C illustrates a block diagram of a photo-detecting system 1300b using phase modulation schemes, according to some embodiments.

Figure 8D:
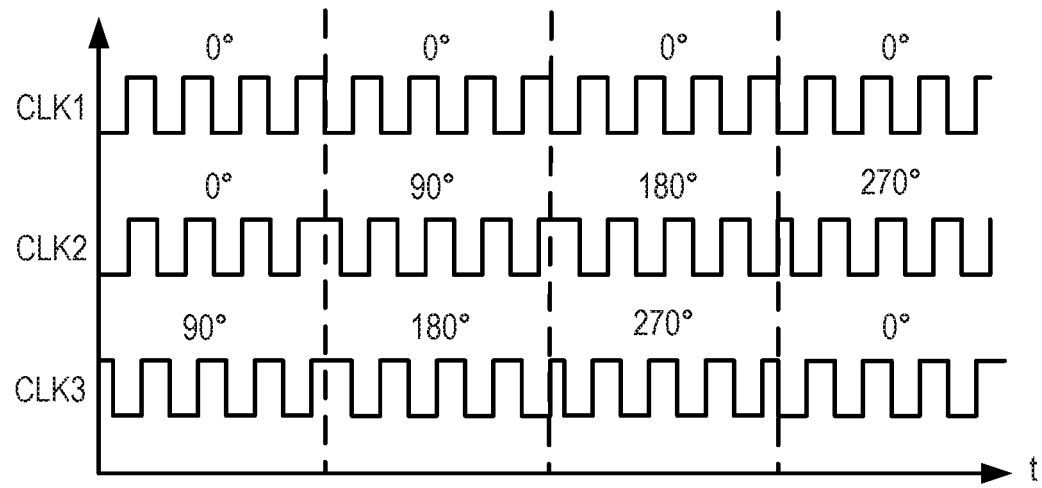

FIG. 8D illustrates a timing diagram of a photo-detecting system 1300b using phase modulation schemes, according to some embodiments. The embodiment of the photo-detecting system in FIG. 40C is similar to the photo-detecting system in FIG. 40B, and the difference is described below. The photo-detecting system 1300b uses two demodulation schemes at the receiving side. The photo-detecting array 1302 includes a first array 1302a and a second array 1302b. The first demodulation scheme applied to the first array 1302a and the second demodulation scheme applied to the second array 1302b are different in temporal sequence. For example, the first array 1302a is applied with the first demodulation scheme, in which the phase changes in temporal sequence are 0°, 90°, 180° and 270°. The second array 1302a is applied with the second demodulation scheme, in which the phase changes in temporal sequence are 90°, 180°, 270° and 0°. The net effect is the phase changes in the first array 1302a are in phase quadrature to the phase changes in the second array 1302b, while there are no phase changes at the transmitting side. This operation may reduce the max instantaneous current drawn from the power supply when the demodulation waveform is not an ideal square wave.

Figure 8E:
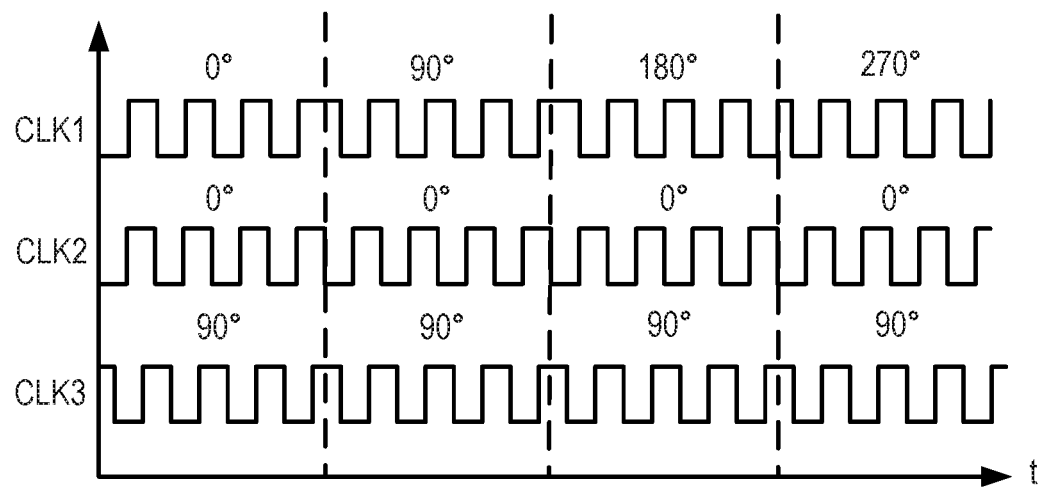

FIG. 8E illustrates a timing diagram of a photo-detecting system 1300b using phase modulation schemes, according to some embodiments. The embodiment of the timing diagram in FIG. 40E is similar to the timing diagram in FIG. 40D, and the difference is described below. In some embodiments, applies phase changes is applied to the transmitting side, but is not applied to the first array and the second array at the receiving side, except setting two different constant phases to the first array and the second array 1302a, 1302b respectively, and the two different constant phases are in phase quadrature to each other. For example, the modulation signal at the transmitting side is the clock signal CLK1, in which the phase changes in temporal sequence are 0°, 90°, 180°, and 270°. The demodulation signals at the receiving side are clock signals CLK2, CLK3. The clock signal CLK2 is used to demodulate the incident light L absorbed by the first array 1302a, which has a constant phase of 0°. The clock signal CLK3 is used to demodulate the incident light L absorbed by second array 1302b, which has a constant phase of 90°.

Figure 9:
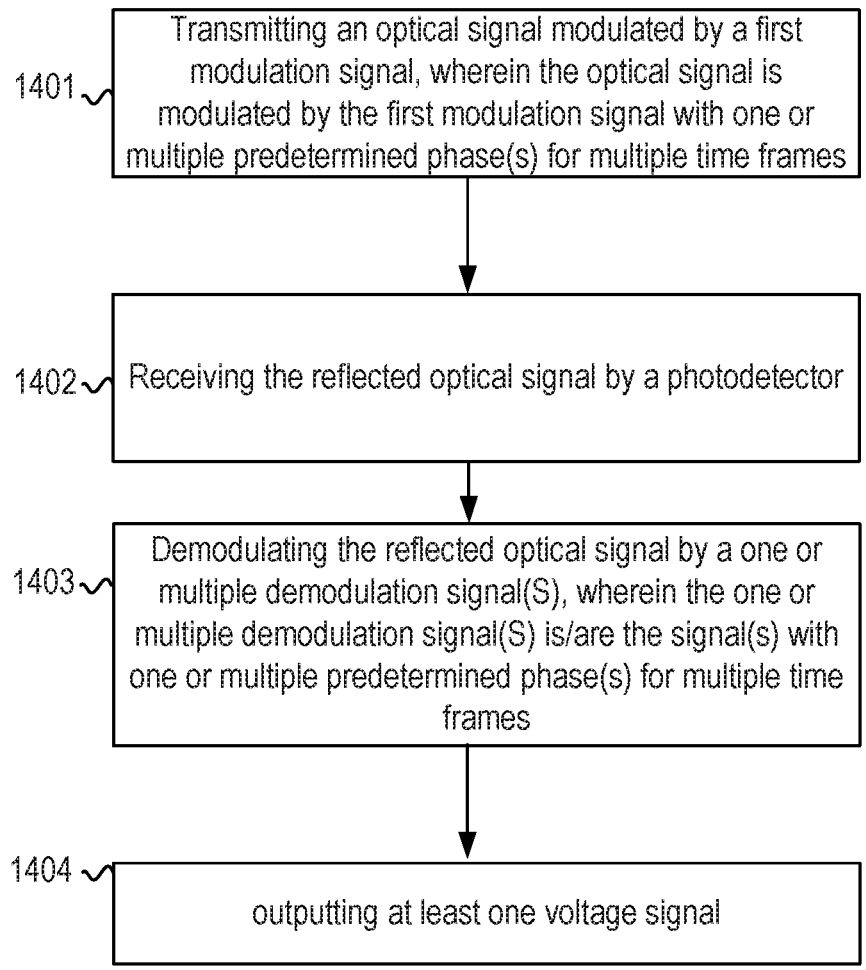
FIG. 9 illustrates a photo-detecting method using modulation schemes with phase changes, according to some embodiments.

FIG. 9 illustrates a photo-detecting method using modulation schemes with phase changes, according to some embodiments. In other embodiments, the method can include fewer or lesser steps than that shown herein, or the steps can be performed in a different order. The photo-detecting method shown in FIG. 9 includes step 1401: transmitting an optical signal modulated by a first modulation signal, wherein the optical signal is modulated by the first modulation signal with one or multiple predetermined phase(s) for multiple time frames; step 1402: receiving the reflected optical signal by a photo-detecting apparatus; step 1403: demodulating the reflected optical signal by one or multiple demodulation signal(s), wherein the one or multiple demodulation signal(s) is/are the signal(s) with one or multiple predetermined phase(s) for multiple time frames; and step 1404: outputting at least one voltage signal. In this method, the photo-detecting apparatus is in accordance with any embodiment described herein or its equivalents.

Although the embodiments illustrated in FIG. 8A through FIG. 8E use clock signals with a 50% duty cycle as the modulation and demodulation signals, in other possible embodiments, the duty cycle can be different (e.g. 30% duty cycle). In some embodiments, a sinusoidal wave is used as the modulation and demodulation signals instead of a square wave.

In some applications, the photo-detecting apparatus, the photo-detecting array, and the photo-detecting system of in accordance with any embodiment is applicable to 3D imaging. In some applications, the photo-detecting apparatus, the photo-detecting array, and the photo-detecting system of in accordance with any embodiment of the present disclosure is applicable to robotics, navigation system or virtual reality.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A photo-detecting apparatus, comprising:
an absorption region configured to absorb photons and to generate photo-carriers from the absorbed photons, the absorption region comprising a first doped region of a first conductivity type;
a second doped region of a second conductivity type different from the first conductivity type;
a substrate supporting the absorption region and comprising a first surface and a second surface, wherein the first surface is between the second surface and the absorption region, wherein a distance between the first doped region and the second surface of the substrate along a direction perpendicular to the first surface is larger than a distance between the second doped region and the second surface of the substrate along the direction perpendicular to the first surface;
a carrier guiding unit electrically coupled to the absorption region, the carrier guiding unit comprising:
a first switch comprising a first gate terminal and a first carrier-output region; and
a second switch comprising a second gate terminal and a second carrier-output region,
wherein the first doped region is arranged between the first gate terminal and the second gate terminal.

2. The photo-detecting apparatus of claim 1, wherein the first doped region and the second doped region are arranged such that at least a portion the photons absorbed by the absorption region passes the first doped region and the second doped region.

3. The photo-detecting apparatus of claim 1, wherein (1) the first carrier-output region and the second carrier-output region are formed in the absorption region or (2) the second doped region is formed in the absorption region.

4. The photo-detecting apparatus of claim 1, further comprising an interface layer formed at least partially on a first surface of the absorption region, wherein the first gate terminal comprises a first contact layer over the interface layer, and the second gate terminal comprises a second contact layer over the interface layer.

5. The photo-detecting apparatus of claim 1, wherein the first carrier-output region and the second carrier-output region are of a same conductivity type as the first conductivity type of the first doped region.

6. The photo-detecting apparatus of claim 1, further comprising a first readout circuit and a second readout circuit electrically coupled to the first carrier-output region and the second carrier-output region, respectively.

7. The photo-detecting apparatus of claim 1, further comprising a first control signal and a second control signal electrically coupled to the first gate terminal and the second gate terminal, respectively.

8. The photo-detecting apparatus of claim 1, wherein the first doped region has a depth larger than a depth of the first carrier-output region or a depth of the second carrier-output region.

9. A photo-detecting system, comprising:
  a laser diode configured to transmit an optical signal;
  a laser diode driver configured to control the laser diode;
  a photo-detecting array comprising multiple photo-detectors, wherein one of the photo-detectors comprises:
  an absorption region configured to absorb photons and to generate photo-carriers from the absorbed photons, the absorption region comprising a first doped region of a first conductivity type;
  a second doped region of a second conductivity type different from the first conductivity type;
  a substrate supporting the absorption region and comprising a first surface and a second surface, wherein the first surface is between the second surface and the absorption region, and wherein a distance between the first doped region and the second surface of the substrate along a direction perpendicular to the first surface is larger than a distance between the second doped region and the second surface of the substrate along the direction perpendicular to the first surface;
  a carrier guiding unit electrically coupled to the absorption region, the carrier guiding unit comprising:
  a first switch comprising a first gate terminal and a first carrier-output region; and
  a second switch comprising a second gate terminal and a second carrier-output region,
  wherein the first doped region is arranged between the first gate terminal and the second gate terminal.

10. The photo-detecting system of claim 9, further comprising an interface layer formed at least partially on a first surface of the absorption region, wherein the first gate terminal comprises a first contact layer over the interface layer, and the second gate terminal comprises a second contact layer over the interface layer.

11. The photo-detecting system of claim 9, wherein the first doped region and the second doped region are arranged such that at least a portion the photons absorbed by the absorption region passes the first doped region and the second doped region.

12. The photo-detecting system of claim 9, wherein (1) the first carrier-output region and the second carrier-output region are formed in the absorption region or (2) the second doped region is formed in the absorption region.

13. The photo-detecting system of claim 9, further comprising a clock driving circuit comprising two clock drivers configured to generate different clock signals to two portions of the photo-detecting array respectively.

14. The photo-detecting system of claim 9, further comprising a first readout circuit and a second readout circuit electrically coupled to the first carrier-output region and the second carrier-output region, respectively.

15. The photo-detecting system of claim 9, wherein the first carrier-output region and the second carrier-output region are of a same conductivity type as the first conductivity type of the first doped region.

16. The photo-detecting system of claim 9, wherein the first doped region has a depth larger than a depth of the first carrier-output region or larger than a depth of the second carrier-output region.

17. The photo-detecting system of claim 9, further comprising a clock driving circuit comprising a first clock driver and a second clock driver both configured to generate clock signals.

18. The photo-detecting system of claim 17, wherein the first clock driver is configured to drive laser diode driver to modulate the transmitted optical signal, and the second clock driver is configured to demodulate one or more output signals generated by the carrier guiding unit.

* * * * *